(12) United States Patent
    Moriwaka

(10) Patent No.: US 8,058,709 B2
(45) Date of Patent: Nov. 15, 2011

(54) SEMICONDUCTOR DEVICE AND MANUFACTURING METHOD THEREOF

(75) Inventor: Tomoaki Moriwaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 52 days.

(21) Appl. No.: 12/725,483

(22) Filed: Mar. 17, 2010

(65) Prior Publication Data

US 2010/0207253 A1    Aug. 19, 2010

Related U.S. Application Data

(62) Division of application No. 11/546,447, filed on Oct. 12, 2006, now Pat. No. 7,709,309.

(30) Foreign Application Priority Data

Oct. 18, 2005 (JP) .................... 2005-303761
Mar. 20, 2006 (JP) .................... 2006-076454

(51) Int. Cl.
    *H01L 29/04* (2006.01)
(52) U.S. Cl. ............... 257/628; 257/64; 257/E29.004
(58) Field of Classification Search .......... 257/64, 257/627, 628, E29.004; 438/166, 486, 487
See application file for complete search history.

(56) References Cited

U.S. PATENT DOCUMENTS

| | | | |
|---|---|---|---|
| 5,306,651 A | 4/1994 | Masumo et al. | |
| 5,313,076 A | 5/1994 | Yamazaki et al. | |
| 5,403,772 A | 4/1995 | Zhang et al. | |
| 5,543,352 A | 8/1996 | Ohtani et al. | |
| 5,574,293 A | 11/1996 | Arai et al. | |
| 5,627,084 A | 5/1997 | Yamazaki et al. | |

(Continued)

FOREIGN PATENT DOCUMENTS

EP    0 651 431 A2    5/1995

(Continued)

OTHER PUBLICATIONS

N. Sotani et al., "Crystallization of Amorphous Si Films Using Indirect Heating by High Power CW-YAG Laser-Zone Melting for Film (III)" Extended Abstracts (The 50$^{th}$ Spring Meeting, 2003), The Japan Society of Applied Physics and Related Societies No. 2, 27a-ZW-11, Mar. 27, 2003, pp. 925, and Translation.

(Continued)

*Primary Examiner* — Mary Wilczewski
(74) *Attorney, Agent, or Firm* — Nixon Peabody LLP; Jeffrey L. Costellia

(57) ABSTRACT

It is an object of the present invention to control the plane orientation of crystal grains obtained by using a laser beam, into a direction that can be substantially regarded as one direction in an irradiation region of the laser beam. After forming a cap film over a semiconductor film, the semiconductor film is crystallized by using a CW laser or a pulse laser having a repetition rate of greater than or equal to 10 MHz. The obtained semiconductor film has a plurality of crystal grains having a width of greater than or equal to 0.01 μm and a length of greater than or equal to 1 μm. In a surface of the obtained semiconductor film, a ratio of an orientation {211} is greater than or equal to 0.4 within the range of an angle fluctuation of ±10°.

20 Claims, 49 Drawing Sheets

U.S. PATENT DOCUMENTS

| | | | |
|---|---|---|---|
| 5,637,515 A | 6/1997 | Takemura | |
| 5,643,826 A | 7/1997 | Ohtani et al. | |
| 5,663,077 A | 9/1997 | Adachi et al. | |
| 5,670,793 A | 9/1997 | Miura et al. | |
| 5,681,759 A | 10/1997 | Zhang | |
| 5,753,542 A | 5/1998 | Yamazaki et al. | |
| 5,837,569 A | 11/1998 | Makita et al. | |
| 5,851,860 A | 12/1998 | Makita et al. | |
| 5,858,819 A | 1/1999 | Miyasaka | |
| 5,891,764 A | 4/1999 | Ishihara et al. | |
| 5,899,547 A | 5/1999 | Yamazaki et al. | |
| 5,899,709 A | 5/1999 | Yamazaki et al. | |
| 5,962,869 A | 10/1999 | Yamazaki et al. | |
| 5,994,172 A | 11/1999 | Ohtani et al. | |
| 6,015,720 A | 1/2000 | Minegishi et al. | |
| 6,071,764 A | 6/2000 | Zhang et al. | |
| 6,117,752 A * | 9/2000 | Suzuki | 438/487 |
| 6,168,980 B1 | 1/2001 | Yamazaki et al. | |
| 6,172,380 B1 | 1/2001 | Noguchi et al. | |
| 6,221,701 B1 | 4/2001 | Yamazaki | |
| 6,255,148 B1 | 7/2001 | Hara et al. | |
| 6,312,979 B1 * | 11/2001 | Jang et al. | 438/166 |
| 6,358,766 B1 | 3/2002 | Kasahara | |
| 6,423,586 B1 | 7/2002 | Yamazaki et al. | |
| 6,545,320 B2 | 4/2003 | Ohtani et al. | |
| 6,602,744 B1 | 8/2003 | Ino et al. | |
| 6,602,765 B2 | 8/2003 | Jiroku et al. | |
| 6,703,267 B2 | 3/2004 | Tanabe et al. | |
| 6,787,807 B2 | 9/2004 | Yamazaki et al. | |
| 6,797,550 B2 | 9/2004 | Kokubo et al. | |
| 6,861,299 B2 | 3/2005 | Horikoshi et al. | |
| 6,875,674 B2 | 4/2005 | Asami et al. | |
| 6,881,615 B2 | 4/2005 | Yamazaki et al. | |
| 6,908,797 B2 | 6/2005 | Takano | |
| 6,919,235 B1 | 7/2005 | Yamazaki et al. | |
| 6,953,714 B2 | 10/2005 | Kimura et al. | |
| 7,045,444 B2 | 5/2006 | Yamazaki et al. | |
| 7,052,944 B2 | 5/2006 | Tanabe | |
| 7,306,981 B2 | 12/2007 | Kuwabara et al. | |
| 7,323,368 B2 | 1/2008 | Takayama et al. | |
| 7,709,309 B2 * | 5/2010 | Moriwaka | 438/166 |
| 2004/0009632 A1 | 1/2004 | Tanabe et al. | |
| 2004/0038465 A1 | 2/2004 | Shimomura et al. | |
| 2004/0053452 A1 | 3/2004 | Hasegawa et al. | |
| 2004/0077134 A1 | 4/2004 | Takayama et al. | |
| 2005/0115930 A1 | 6/2005 | Tanaka et al. | |
| 2005/0139786 A1 | 6/2005 | Tanaka et al. | |
| 2005/0169330 A1 * | 8/2005 | Hongo et al. | 372/38.02 |
| 2006/0246693 A1 | 11/2006 | Tanaka et al. | |
| 2006/0270128 A1 | 11/2006 | Nakamura et al. | |
| 2007/0141815 A1 | 6/2007 | Jyumonji et al. | |
| 2007/0222038 A1 | 9/2007 | Moriwaka | |
| 2007/0269993 A1 * | 11/2007 | Chu et al. | 438/795 |
| 2008/0090344 A1 | 4/2008 | Kuwabara et al. | |
| 2008/0124850 A1 | 5/2008 | Takayama et al. | |

FOREIGN PATENT DOCUMENTS

| | | |
|---|---|---|
| JP | 05-299339 | 11/1993 |
| JP | 2003-168646 | 6/2003 |
| JP | 2004-179195 | 6/2004 |
| JP | 2004-327677 | 11/2004 |
| JP | 2005-191546 | 7/2005 |

OTHER PUBLICATIONS

International Search Report (Application No. PCT/JP2006/320362; PCT9103/9501) dated Dec. 26, 2006.

Written Opinion (Application No. PCT/JP2006/320362; PCT9103/9501) dated Dec. 26, 2006.

Y. Ohashi et al., "Crystalline Orientation of Large-Grain Poly-Si Thin Films Observed by Raman Spectroscopy", Digest of Technical Papers, AM-LCD 04, TFTp5-4, Aug. 25, 2004, pp. 269-272.

* cited by examiner

Before Secco etching

After Secco etching

FIG. 8A viewing surface A
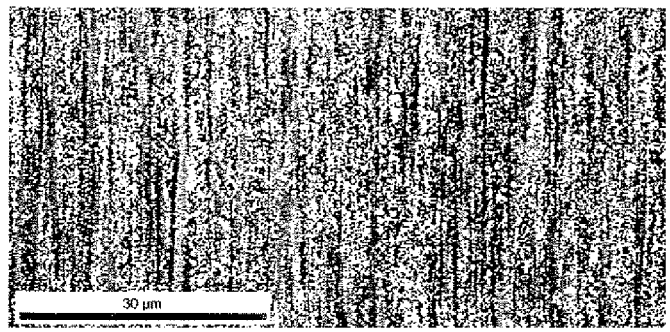
FIG. 8B viewing surface B
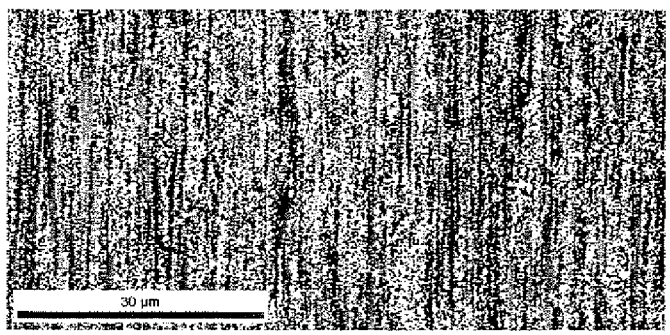
FIG. 8C viewing surface C
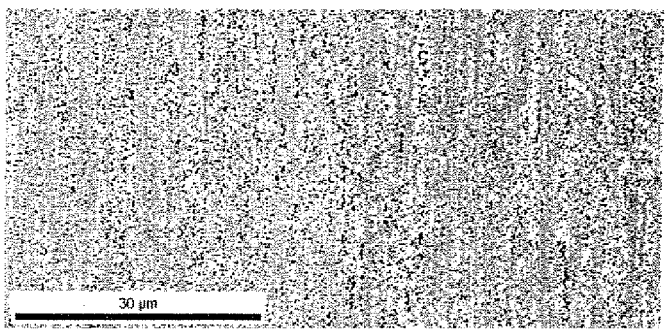
FIG. 8D
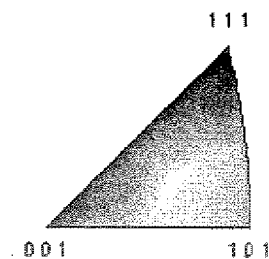

FIG. 13A 0°
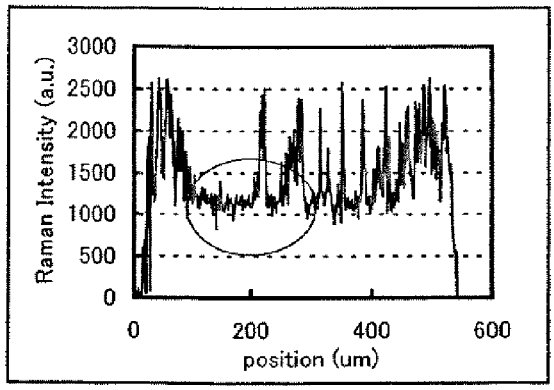
FIG. 13B 45°
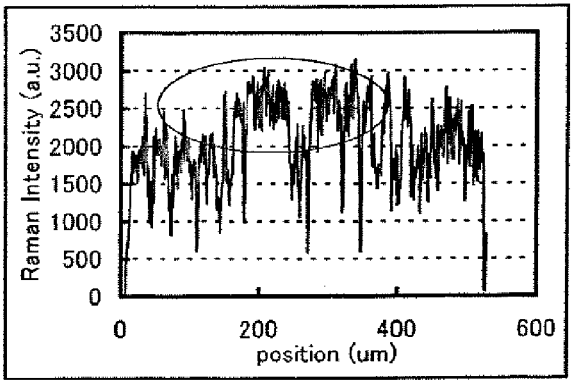
FIG. 13C 90°
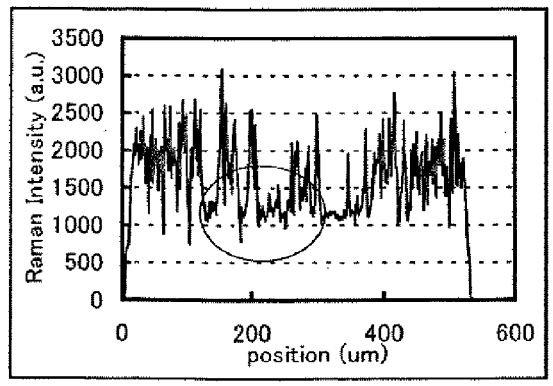
FIG. 13D 135°
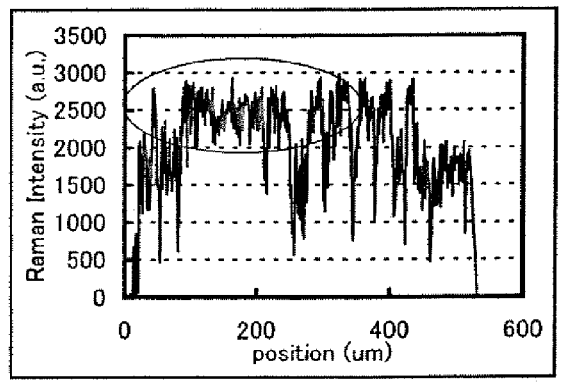
FIG. 13E
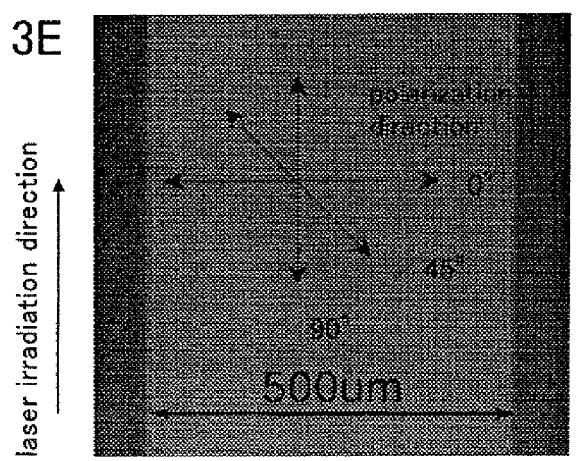

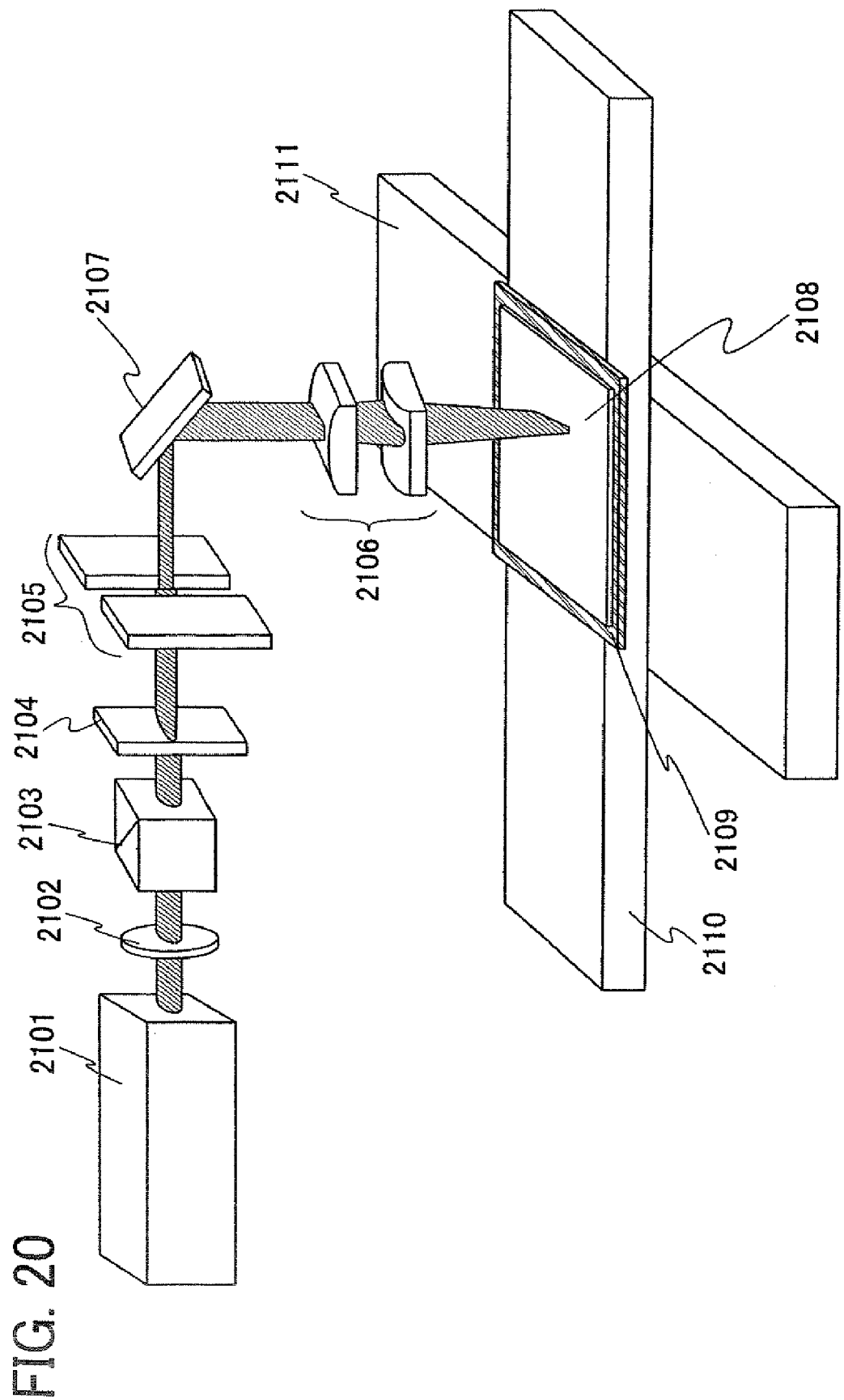

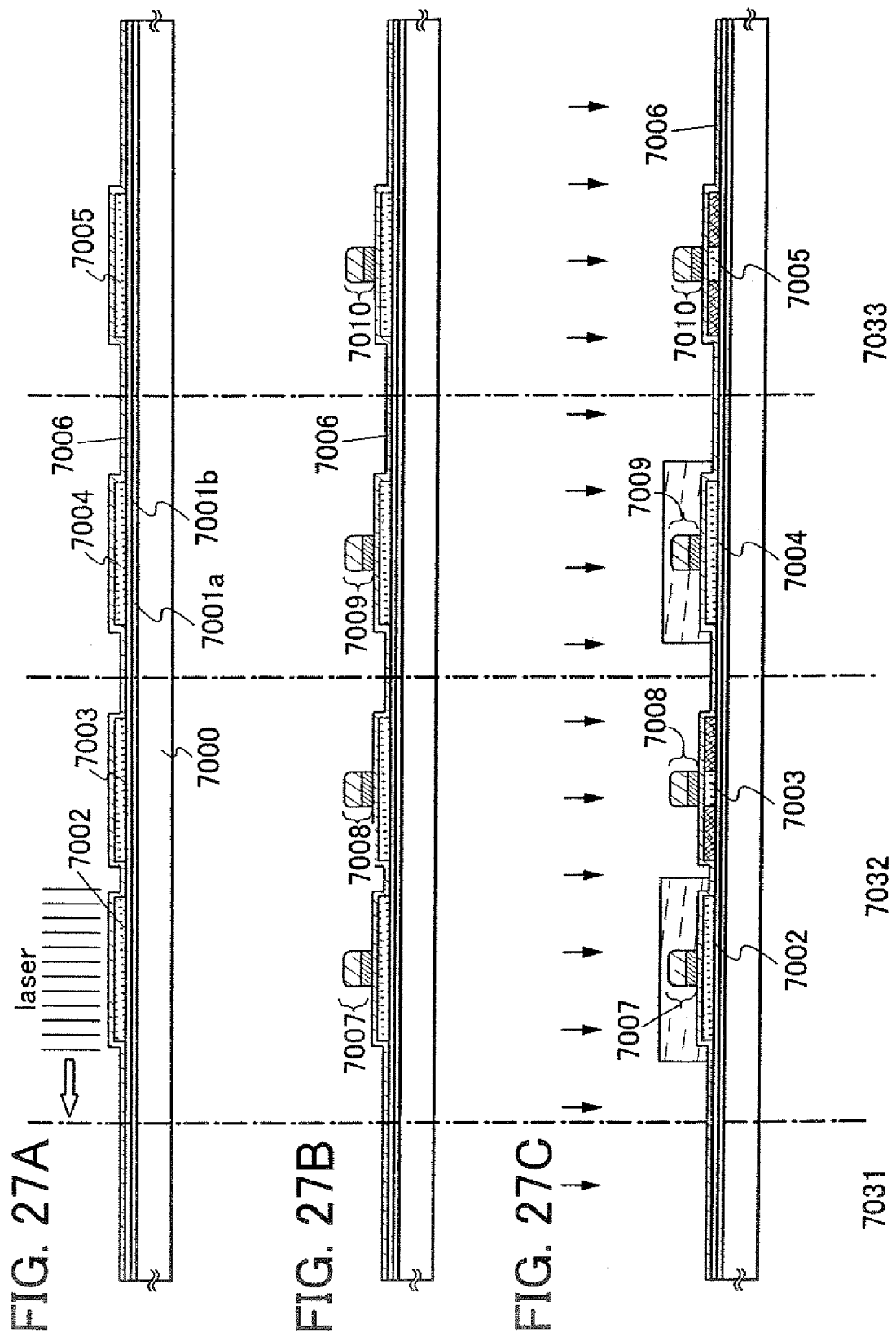

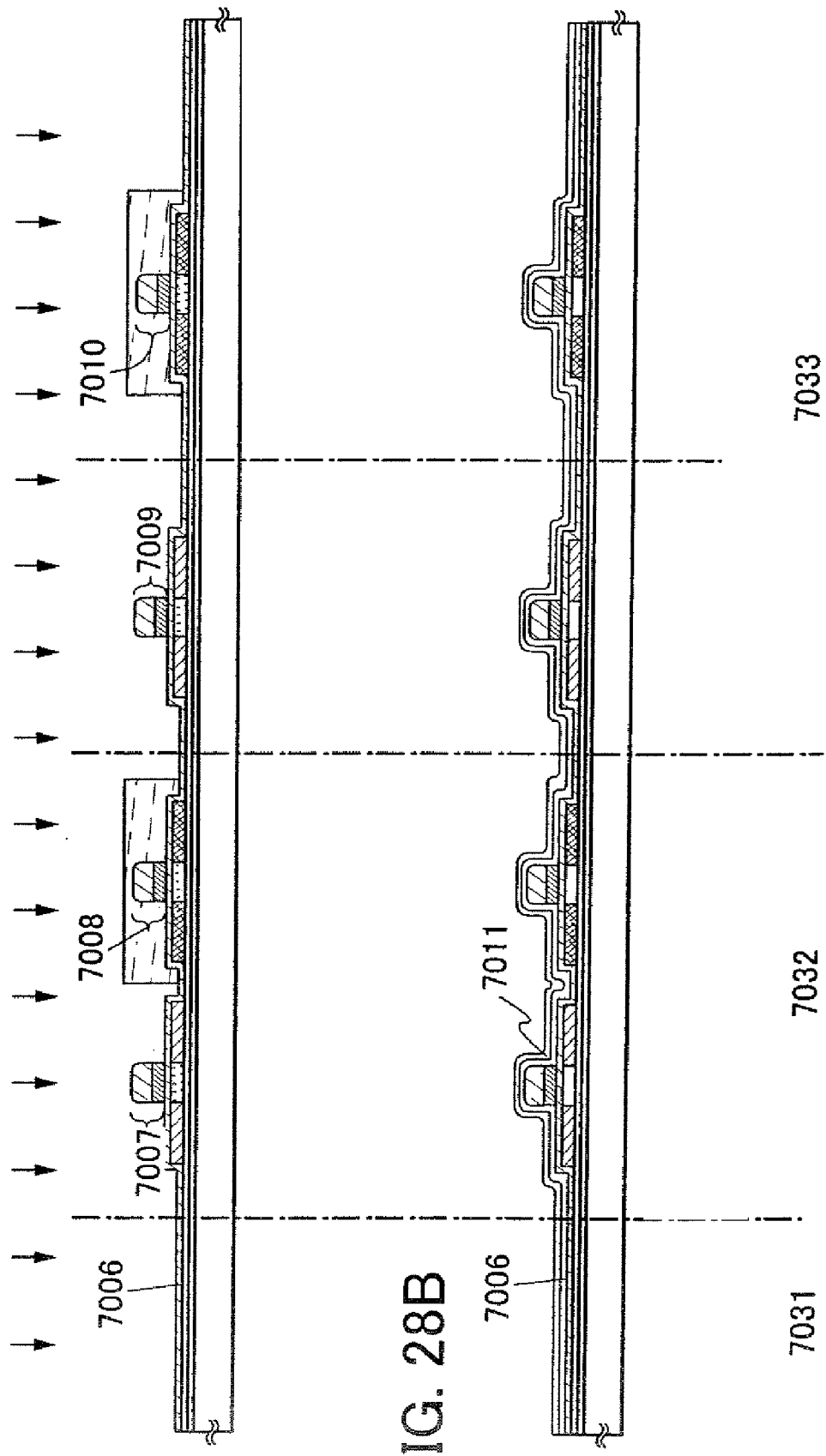

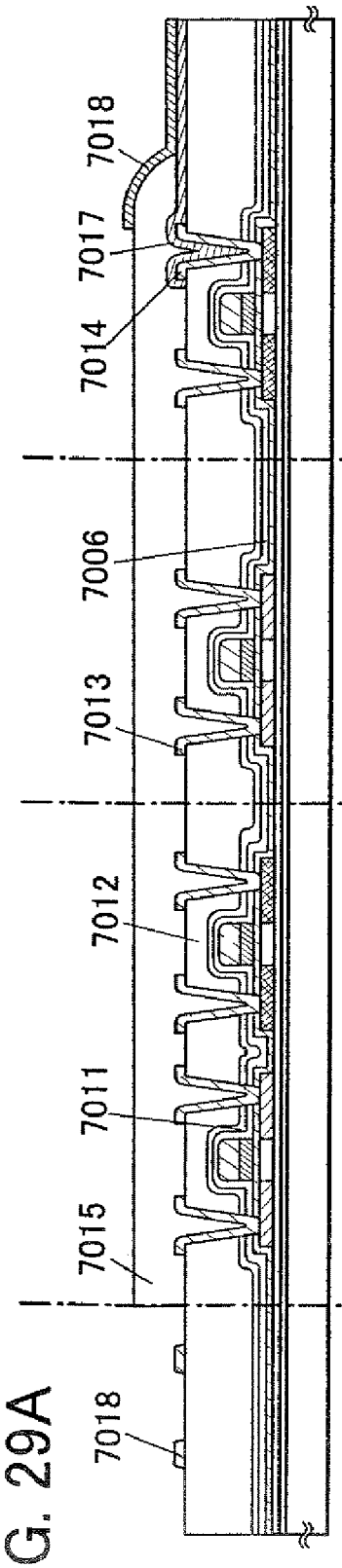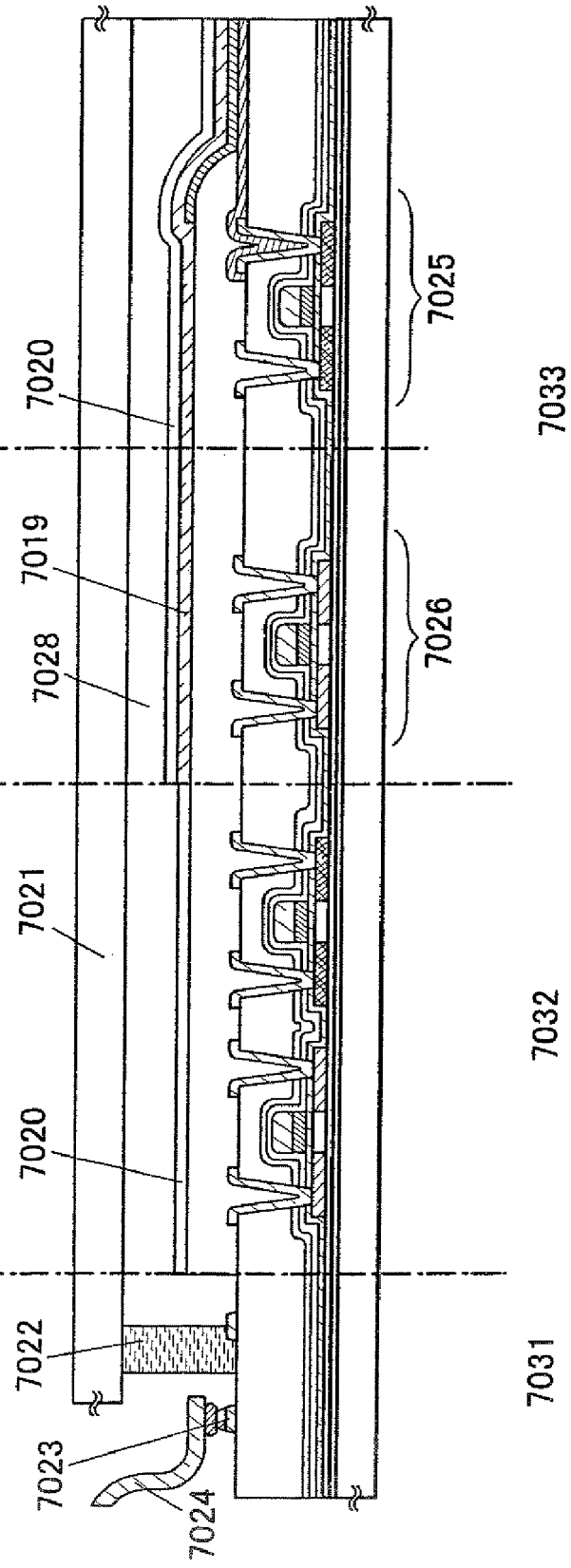

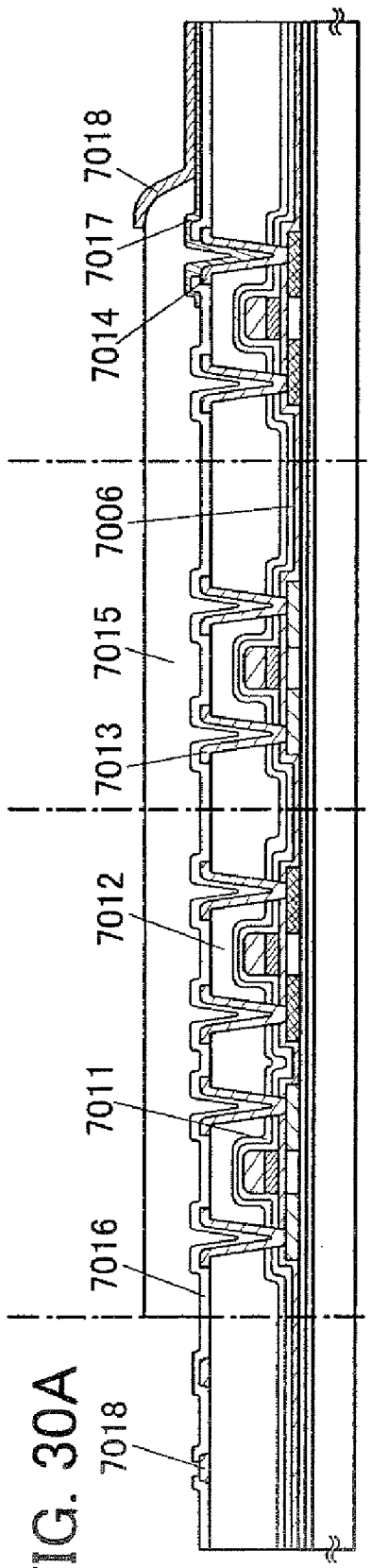
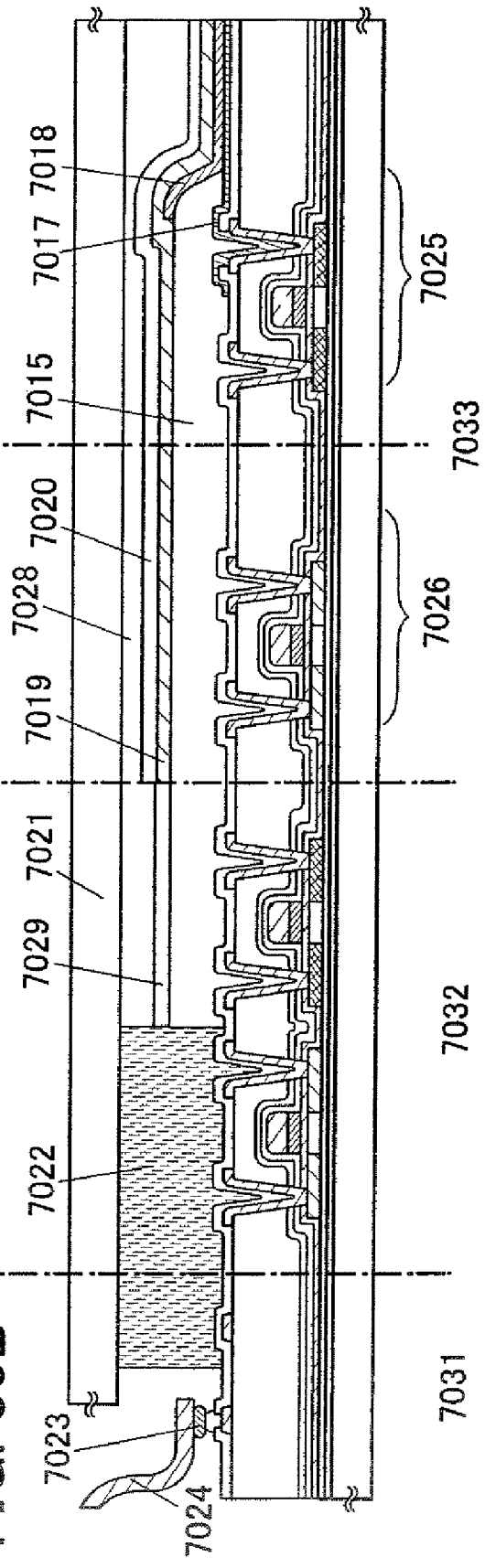

FIG. 44A  scanning speed 35cm/sec

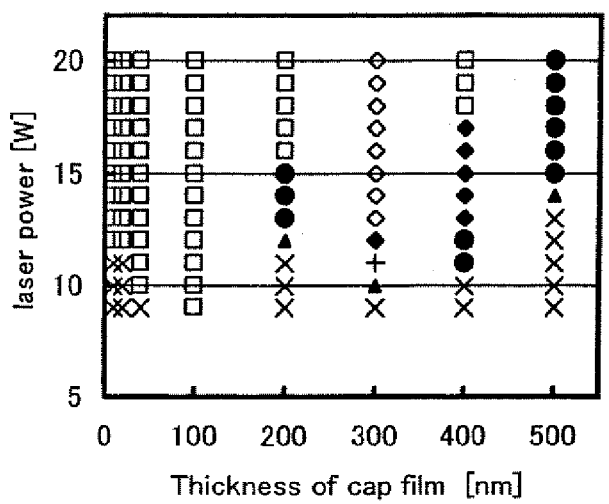

FIG. 44B  scanning speed 50cm/sec

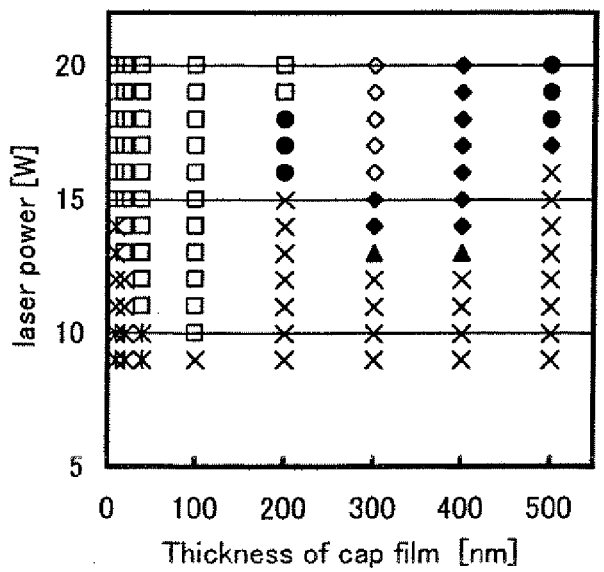

* ＊ : cannot crystallize
* × : microcrstal is formed
* ▲ : quasi-single crystalline silicon film of the present invention and microcrystal were formed
* ＋ : microcrystal, large grain crystal and quasi-single crystalline silicon film of the present invention were formed
* ● : quasi-single crystalline silicon film of the present invention was formed
* ◆ : quasi-single crystalline silicon film of the present invention and large grain crystal were formed
* ◇ : large grain crystal was formed
* ☐ : split because of excess energy viewing surface A Color Coded Map Type: Crystal Direction

| | Direction | Min | Max | Total Fraction | Partition Fraction |
|---|---|---|---|---|---|
| | <0 0 1>‖[0 0 1] | 0° | 10° | 0.002 | 0.003 |
| | <1 0 1>‖[0 0 1] | 0° | 10° | 0.004 | 0.006 |
| | <1 1 1>‖[0 0 1] | 0° | 10° | 0.086 | 0.136 |
| | <2 1 1>‖[0 0 1] | 0° | 10° | 0.421 | 0.668 |

Silicon

[001]

viewing surface B

Color Coded Map Type: Crystal Direction

| | Direction | Min | Max | Total Fraction | Partition Fraction |
|---|---|---|---|---|---|
| | <0 0 1>‖[0 1 0] | 0° | 10° | 0.003 | 0.005 |
| | <1 0 1>‖[0 1 0] | 0° | 10° | 0.051 | 0.081 |
| | <1 1 1>‖[0 1 0] | 0° | 10° | 0.412 | 0.653 |
| | <2 1 1>‖[0 1 0] | 0° | 10° | 0.071 | 0.113 |

Silicon

[010]

viewing surface C

Color Coded Map Type: Crystal Direction

| | Direction | Min | Max | Total Fraction | Partition Fraction |
|---|---|---|---|---|---|
| | <0 0 1>‖[1 0 0] | 0° | 10° | 0.000 | 0.000 |
| | <1 0 1>‖[1 0 0] | 0° | 10° | 0.523 | 0.829 |
| | <1 1 1>‖[1 0 0] | 0° | 10° | 0.002 | 0.004 |
| | <2 1 1>‖[1 0 0] | 0° | 10° | 0.074 | 0.118 |

Silicon

[1 0 0]

threshold voltage
difference (V)

- 0.09–0.1
- 0.08–0.09
- 0.07–0.08
- 0.06–0.07
- 0.05–0.06
- 0.04–0.05
- 0.03–0.04
- 0.02–0.03
- 0.01–0.02
- 0–0.01
- −0.01–0
- −0.02–−0.01
- −0.03–−0.02
- −0.04–−0.03

SEMICONDUCTOR DEVICE AND MANUFACTURING METHOD THEREOF

TECHNICAL FIELD

The present invention relates to a technique for forming a semiconductor film having a crystalline structure by irradiating a semiconductor film with a laser beam and a semiconductor device such as a thin film transistor (hereinafter, a TFT) using, and the semiconductor film having a crystalline structure that is formed by using this technique. In addition, the present invention relates to a manufacturing method of the semiconductor device.

BACKGROUND ART

In recent years, a laser crystallization technique for forming a semiconductor film having a crystalline structure (hereinafter, a crystalline semiconductor film) by irradiating an amorphous semiconductor film which is formed over a glass substrate with a laser beam has been researched well. A crystalline semiconductor film is used because of high mobility as compared with an amorphous semiconductor film. Therefore, a TFT is formed using this crystalline semiconductor film, and such a TFT has been used for an active matrix liquid crystal display device, an organic EL display device, or the like where a TFT for a pixel portion or TFTs for a pixel portion and a driver circuit is/are formed over a sheet of a glass substrate.

As a crystallization method, a thermal annealing method using an annealing furnace, a rapid thermal annealing method (RTA method), a laser annealing method (a crystallization method by laser irradiation), or the like can be given. In a case of using a solid phase growth method like a thermal annealing method, high-temperature processing at greater than or equal to 600° C. is performed; therefore, an expensive quartz substrate that can withstand the high temperature is needed, which increases a manufacturing cost. On the other hand, when a laser is used for crystallization, crystallization can be performed by making only a semiconductor film absorb heat without increasing a temperature of a substrate too much. Therefore, a substance having a low melting point such as glass or plastic can be used for a substrate. Accordingly, a glass substrate which is inexpensive and easily processed in a large-sized area can be used; thus, production efficiency has been significantly improved.

There is a crystallization method by an excimer laser, which is a pulse laser, as one of the laser crystallization methods. A wavelength of an excimer laser belongs to an ultraviolet region, and absorptance with respect to silicon is high. Therefore, silicon is selectively heated when an excimer laser is used. For example, in a case of using an excimer laser, a laser beam having a rectangular shape of approximately 10×30 mm that is emitted from a laser oscillator is shaped by an optical system into a linear beam spot of several hundreds of μm in width and greater than or equal to 300 mm in length and silicon over a substrate is irradiated with the laser beam. Here, a rectangular shape with a high aspect ratio, or an elliptical shape is referred to as a linear shape. By irradiating silicon over a substrate with a linearly processed beam spot while relatively scanning the beam spot, annealing is performed and a crystalline silicon film is obtained. High productivity can be obtained by scanning the beam spot in an orthogonal direction to a direction of a length (a major axis) of the beam spot.

As another laser crystallization method, there are crystallization methods by a continuous-wave laser (hereinafter, referred to as a CW laser) and a pulse laser having a repetition rate as high as greater than or equal to 10 MHz. These lasers are formed into linear beam spots; thus, a crystalline silicon film is obtained by irradiating a semiconductor film with this beam spot while scanning the beam spot. By using this method, as compared with a crystal that is obtained by irradiation of an excimer laser beam, a crystalline silicon film having a region of an extremely large grain size (hereinafter, referred to as a large grain crystal) can be formed (for example, see Reference 1: Japanese Published Patent Application No. 2005-191546). When this large grain crystal is used for a channel region of a TFT, few crystal grain boundaries are included in a channel direction; therefore, an electric barrier against a carrier such as an electron or a hole gets lower. Consequently, it is possible to manufacture a TFT having mobility of approximately 100 $cm^2$/Vs.

DISCLOSURE OF INVENTION

However, the large grain crystal that is obtained by crystallization using the above laser has a feature that the plane orientation of crystal grain is totally different between adjacent large grain crystals, and the plane orientation of large grain crystal grains which are formed within an irradiation region of a laser beam is random and cannot be controlled to be one direction. Thus, when a TFT is manufactured using a semiconductor film including this large grain crystal as an active layer, the plane orientation of crystal grains of the semiconductor film to be a channel differs among a plurality of TFTs. Therefore, an electrical characteristic of each TFT has variation due to the difference in the plane orientation of crystal grains. In addition, when each plane orientation is different between adjacent crystals, a trap level in a crystal grain boundary gets higher than a grain boundary in a case where the plane orientation is the same, thereby deteriorating an electrical characteristic of a TFT.

The crystallization using a CW laser or a pulse laser having a repetition rate of greater than or equal to 10 MHz is performed by irradiating a semiconductor film with a laser beam emitted from a laser oscillator, which is formed by an optical system into a linear shape of approximately 500 μm in length and 20 μm in width, while scanning over the semiconductor film at a constant speed of approximately 10 to 200 cm/sec. As shown in FIG. 2B, generally, irradiation of a laser beam is performed with a semiconductor film 03 formed over a substrate 01 and a base insulating film 02. At this time, there is a close relation between the obtained crystal and an energy density of the laser, as shown in FIG. 2A, and the obtained crystal changes a microcrystal, a small grain crystal, and a large grain crystal along with increase of an energy density:

A small grain crystal described here is the same as a crystal that is formed in the case of the excimer laser irradiation. When the semiconductor film is irradiated with an excimer laser, a surface layer of the semiconductor film is partially melted and infinite crystal nuclei are generated randomly in an interface between the semiconductor film and the base insulating film. Then, a crystal is grown in a direction that the crystal nucleus is cooled and solidified, that is, a direction from the interface between the semiconductor film and the base insulating film to the surface of the semiconductor film. Thus, a relatively small crystal is infinitely formed.

Even with the crystallization using a CW laser or a pulse laser having a repetition rate of greater than or equal to 10 MHz, a small grain crystal is partially formed like in a portion which is irradiated with the end of a laser beam. It can be understood that this is a result of a fact that the semiconductor film is partially melted without being supplied with heat needed to melt the semiconductor film completely.

Next, under a condition that the semiconductor film is completely melted, that is, in FIG. 2A, when a semiconductor film is irradiated with a laser beam having an energy of greater than or equal to $E_3$ to perform crystallization, a large grain crystal is formed. At this time, infinite crystal nuclei are generated in the semiconductor film that is completely melted, and a crystal is grown from each crystal nucleus into a scanning direction of a laser beam, along with movement of a solid-liquid interface. Since the position where this crystal nucleus is generated is random, the crystal nuclei are distributed unevenly. Then, crystal growth is completed when crystal grains collide with each other; therefore, the position, the size, and the plane orientation of crystal grains are random.

Thus, in order to confirm the position, the size, and the plane orientation of crystal grains, EBSP (Electron Back Scatter Diffraction Pattern) measurement is carried out using a silicon film where a large grain crystal is formed as a sample. EBSP refers to a method by which an EBSP detector is connected to a scanning electron microscope, a direction of a diffraction image (an EBSP image) of individual crystal, which is generated when a sample highly tilted in the scanning electron microscope is irradiated with a convergent electron beam, is analyzed, and the plane orientation of crystal grains of a sample is measured from direction data and position information of a measurement point (x, y). FIGS. 3A to 3H show the result.

In FIGS. 3A to 3H, FIG. 3A shows a plane orientation distribution in a viewing surface A; FIG. 3B, a plane orientation distribution in a viewing surface B; FIG. 3C, a plane orientation distribution in a viewing surface C, respectively, and FIG. 3D shows the plane orientations in FIGS. 3A, 3B, and 3C. In addition, FIGS. 3E, 3F, and 3G sequentially show occurrence frequencies of the plane orientations in the viewing surfaces A, B, and C, respectively, and FIG. 3H is a frequency in FIGS. 3E, 3F, and 3G.

In the EBSP measurement, a measurement region is 50×50 μm and a measurement pitch is 0.25 μm. As shown in FIG. 4, a base insulating film 411 is formed over a substrate 410, and an amorphous semiconductor film 417 is formed over this base insulating film 411. The amorphous semiconductor film 417 is irradiated with a laser beam to perform crystallization. Then, three planes, where three vectors vertical to each other (a vector a, a vector b, and a vector c) are each to be a normal vector, are regarded as a viewing surface A 413, a viewing surface B 414, and a viewing surface C 415, respectively, and the plane orientations of the viewing surfaces are measured. Note that a scanning direction 416 of a laser beam and the vector c are parallel. In accordance with pieces of information obtained from these three planes, the plane orientation in a large grain crystal 412 can be specified with high accuracy. Even in a case of viewing the plane orientation from any of the viewing surfaces, it is confirmed that there is variation in the plane orientation, the size of a crystal grain, and the direction of crystal growth.

Further, when energy higher than that under a condition for forming a large grain crystal is applied to a semiconductor film, the semiconductor film is split or ablated.

The position, the size, and the plane orientation of crystal grains become random because crystal growth as described below proceeds. When a great amount of heat is given to a semiconductor film at a time, the semiconductor film is melted completely. A great amount of crystal nuclei are generated in this semiconductor film and chaotic crystal growth occurs based on these crystal nuclei. The present inventor considers that it is important to suppress the chaotic crystal growth.

In view of the above problems, it is an object of the present invention to control the plane orientation of each crystal grain, which is obtained by the crystallization using a CW laser or a pulse laser having a repetition rate of greater than or equal to 10 MHz, to be one direction or a direction that can be substantially regarded as one direction in an irradiation region of the laser beam. In this specification, since a crystal whose crystal plane orientation between adjacent grain crystals is controlled to be one direction or a direction that can be substantially regarded as one direction can be approximately regarded as a single crystal, the crystal is referred to as a quasi-single crystal. As compared with a crystal grain boundary in a case of the different plane orientation between adjacent crystals, a crystal grain boundary existing in the quasi-single crystal has the small number of defects included in the grain boundary and a small electric barrier.

A specific method for controlling a plane orientation is as follows.

First, an insulating film (hereinafter, to be a cap film) is formed over a semiconductor film. A film thickness of this cap film is optimized so that the semiconductor film that is completely melted by laser beam irradiation is aligned in one plane orientation to grow a crystal. As the cap film, a material with which heat reaches the semiconductor film and which have enough transmittance to melt the semiconductor film is used. The cap film is preferably a solid and dense film. By forming the cap film, heat generated due to absorption of the laser beam in the semiconductor film can be efficiently utilized for crystallization, and laser crystallization can be performed with a lower energy density. It is considered that the cap film has an effect of suppressing decrease of viscosity of the melted semiconductor film, a reflection prevention effect, a thermal storage effect, or the like.

In addition, the laser beam irradiation is performed with an energy slightly higher than a lower energy density limit (hereinafter, to be referred to as $E_1$) with which the semiconductor film of an irradiation region is completely melted. According to the present invention, the lowest limit of the laser beam energy is $E_1$ because all that is needed is energy enough to completely melt the semiconductor film in the irradiation region. In addition, the uppermost limit is an energy with which a large grain crystal begins to be formed (hereinafter, to be referred to as $E_2$). In other words, when an energy of a laser beam that can implement the present invention is regarded as E, the range of E is $E_1 \leq E < E_2$. However, by suppressing the amount of heat given to the semiconductor film to the minimum necessary, a crystal nucleus can be prevented from generating more than necessary or the viscosity of the melted semiconductor film can be prevented from being decreased. Therefore, it is much preferable to adjust the range of the energy E of the laser beam with which irradiation is performed so as to satisfy $E_1 \leq E \leq \{(E_1+E_2)/2\}$ (FIG. 1A).

By controlling the energy of the laser beam in such a manner, turbulence of the semiconductor film due to heating can be decreased and stable crystal growth can be promoted. As shown in FIG. 1B, when a semiconductor film 03 having a cap film 04, which is formed over a substrate 01 and a base insulating film 02, is irradiated with a laser beam having an energy density of greater than or equal to $E_1$ capable of completely melting the semiconductor film 03, quasi-single crystallization of the semiconductor film 03 is obtained and the plane orientation of crystal grains can be controlled.

In the surface of the semiconductor film formed using the present invention, crystal grains each having a grain size smaller than that of a conventional large grain crystal are uniformly formed in the irradiation region of the laser beam. Individual crystal grain has a width of greater than or equal to 0.01 μm and a length of greater than or equal to 1 μm. Adjacent grain boundaries are parallel to each other. In this region, crystal grains are grown in a direction parallel to a scanning direction of the laser beam and the plane orientation of the crystal grains can be regarded to be aligned in one direction. In addition, within the range of an angle fluctuation of ±10°, a ratio that a crystal is oriented in a specific orientation is greater than or equal to 0.4.

In addition, in the semiconductor film formed using the present invention, a peak shifted to 516 to 518 $cm^{-1}$ is observed with measurement by Laser Raman Spectroscopy (when a polarization direction of incident laser light at the time of Raman measurement is made vertical to a scanning direction of the laser crystallization), and variation of the peak within the measurement range is less than or equal to 20% in a coefficient of variation.

According to one feature of the present invention, a semiconductor device has a semiconductor film formed of a plurality of crystal grains over a substrate, where the grain size of the crystal grains has a width of greater than or equal to 0.01 μm and a length of greater than or equal to 1 μm. When a direction vertical to the surface of the substrate is regarded as a first direction and a plane, where the first direction is regarded as a normal vector, is regarded as a first plane, in the plane orientation of the semiconductor film of the first plane, a ratio of an orientation {211} is greater than or equal to 0.4 within the range of an angle fluctuation of ±10°.

According to another feature of the present invention, a semiconductor device has a semiconductor film formed of a plurality of crystal grains over a substrate, where the grain size of the crystal grains has a width of greater than or equal to 0.01 μm and a length of greater than or equal to 1 μm. When a direction vertical to the surface of the substrate is regarded as a first direction and a plane, where the first direction is regarded as a normal vector, is regarded as a first plane, in the plane orientation of the semiconductor film of the first plane, a ratio of an orientation {211} is greater than or equal to 0.4 within the range of an angle fluctuation of ±10°. Further, when a direction parallel to the surface of the substrate and the crystal growth of the crystal grains is regarded as a second direction and a plane, where the second direction is regarded as a normal vector, is regarded as a second plane, in the plane orientation of the semiconductor film of the second plane, a ratio of an orientation {110} is greater than or equal to 0.5 within the range of an angle fluctuation of ±10°.

According to another feature of the present invention, a semiconductor device has a semiconductor film formed of a plurality of crystal grains over a substrate, where the grain size of the crystal grains has a width of greater than or equal to 0.01 μm and a length of greater than or equal to 1 μm. When a direction vertical to the surface of the substrate is regarded as a first direction and a plane, where the first direction is regarded as a normal vector, is regarded as a first plane, in the plane orientation of the semiconductor film of the first plane, a ratio of an orientation {211} is greater than or equal to 0.4 within the range of an angle fluctuation of ±10°. Further, when a direction vertical to the first direction and the crystal growth of the crystal grains is regarded as a third direction and a plane, where the third direction is regarded as a normal vector, is regarded as a third plane, in the plane orientation of the semiconductor film of the third plane, a ratio of an orientation {111} is greater than or equal to 0.4 within the range of an angle fluctuation of ±10°.

According to another feature of the present invention, a semiconductor device has a semiconductor film formed of a plurality of crystal grains over a substrate, where the grain size of the crystal grains has a width of greater than or equal to 0.01 μm and a length of greater than or equal to 1 μm. When a direction parallel to the surface of the substrate and the crystal growth of the crystal grains is regarded as a second direction and a plane, where the second direction is regarded as a normal vector, is regarded as a second plane, in the plane orientation of the semiconductor film of the second plane, a ratio of an orientation {110} is greater than or equal to 0.5 within the range of an angle fluctuation of ±10°. Further, when a direction parallel to the surface of the substrate and vertical to the second direction is regarded as a third direction and a plane, where the third direction is regarded as a normal vector, is regarded as a third plane, in the plane orientation of the semiconductor film of the third plane, a ratio of an orientation {111} is greater than or equal to 0.4 within the range of an angle fluctuation of ±10°.

Note that the range of an angle fluctuation of ±10° shows that a deviation from a certain plane orientation is within the range of −10 to +10°, which implies that the angle fluctuation of a certain plane orientation is allowed within the range of ±10°. For example, within the range of an angle fluctuation of ±10°, a crystal with the plane orientation {211} includes a crystal, which is deviated from the plane orientation {211} by −10° to a crystal, which is deviated from the plane orientation {211} by +10°.

In the above semiconductor devices, the semiconductor film is silicon. In addition, silicon germanium, silicon carbide (SiC), or the like can also be used.

In addition, in the above semiconductor devices, the semiconductor film has a thickness of greater than or equal to 20 nm and less than or equal to 100 nm, preferably greater than or equal to 20 nm and less than or equal to 80 nm.

Moreover, as an example of the semiconductor devices having the above characteristics, the following can be given: a thin film transistor, a driver circuit, a power supply circuit, an IC (Integrated Circuit), a memory, a CPU (Central Processing Unit), a memory element, a diode, a photoelectric conversion element, a resistive element, a coil, a capacitor element, an inductor, a pixel, a CCD (Charge Coupled Device), a censor, or the like.

Further, various electronic devices can be manufactured using the semiconductor devices having the above characteristics. For example, the following can be given: a thin film integrated circuit device, an image display device, a camera such as a digital video camera or a digital camera, a reflective projector, a head-mounted display, a navigation system, an audio reproducing device, a portable information terminal, a game machine, a computer, an image reproducing device provided with a recording medium or the like.

According to another feature of the present invention, a method for manufacturing a semiconductor device includes the steps of forming a base insulting film; forming a semiconductor film over the base insulating film; forming a cap film to have a thickness of greater than or equal to 200 nm over the semiconductor film; and irradiating the semiconductor film with a laser beam through the cap film to crystallize the semiconductor film.

According to another feature of the present invention, a method for manufacturing a semiconductor device includes the steps of forming a base insulting film over a substrate; forming a semiconductor film over the base insulating film; forming a cap film to have a thickness of greater than or equal to 200 nm over the semiconductor film; and irradiating the semiconductor film with a laser beam while relatively scanning the laser beam through the cap film to crystallize the semiconductor film. The gain size of crystal grains in the thus formed semiconductor film has a width of greater than or equal to 0.01 µm and a length of greater than or equal to 1 µm. When a direction vertical to the surface of the substrate is regarded as a first direction and a plane, where the first direction is regarded as a normal vector, is regarded as a first plane, in the plane orientation of the crystallized semiconductor film of the first plane, a ratio of an orientation {211} is greater than or equal to 0.4 within the range of an angle fluctuation of ±10°.

According to another feature of the present invention, a method for manufacturing a semiconductor device includes the steps of forming a base insulting film over a substrate; forming a semiconductor film over the base insulating film; forming a cap film to have a thickness of greater than or equal to 200 nm over the semiconductor film; and irradiating the semiconductor film with a laser beam while relatively scanning the laser beam through the cap film to crystallize the semiconductor film. The grain size of crystal grains in the thus formed semiconductor film has a width of greater than or equal to 0.01 µm and a length of greater than or equal to 1 µm. When a direction vertical to the surface of the substrate is regarded as a first direction and a plane, where the first direction is regarded as a normal vector, is regarded as a first plane, in the plane orientation of the crystallized semiconductor film of the first plane, a ratio of an orientation {211} is greater than or equal to 0.4 within the range of an angle fluctuation of ±10°. Further, when a direction parallel to the scanning direction of the laser beam and the surface of the substrate is regarded as a second direction and a plane, where the second direction is regarded as a normal vector, is regarded as a second plane, in the plane orientation of the crystallized semiconductor film of the second plane, a ratio of an orientation {110} is greater than or equal to 0.5 within the range of an angle fluctuation of ±10°.

According to another feature of the present invention, a method for manufacturing a semiconductor device includes the steps of forming a base insulting film over a substrate; forming a semiconductor film over the base insulating film; forming a cap film to have a thickness of greater than or equal to 200 nm over the semiconductor film; and irradiating the semiconductor film with a laser beam while relatively scanning the laser beam through the cap film to crystallize the semiconductor film. The grain size of crystal grains in the thus formed semiconductor film has a width of greater than or equal to 0.01 µm and a length of greater than or equal to 1 µm. When a direction vertical to the surface of the substrate is regarded as a first direction and a plane, where the first direction is regarded as a normal vector, is regarded as a first plane, in the plane orientation of the crystallized semiconductor film of the first plane, a ratio of an orientation {211} is greater than or equal to 0.4 within the range of an angle fluctuation of ±10°. Further, when a direction vertical to the scanning direction of the laser beam and parallel to the surface of the substrate is regarded as a third direction and a plane, where the third direction is regarded as a normal vector, is regarded as a third plane, in the plane orientation of the crystallized semiconductor film of the third plane, a ratio of an orientation {111} is greater than or equal to 0.4 within the range of an angle fluctuation of ±10°.

According to another feature of the present invention, a method for manufacturing a semiconductor device includes the steps of forming a base insulting film over a substrate; forming a semiconductor film over the base insulating film; forming a cap film to have a thickness of greater than or equal to 200 nm over the semiconductor film; and irradiating the semiconductor film with a laser beam while relatively scanning the laser beam through the cap film to crystallize the semiconductor film. The grain size of crystal grains in the thus formed semiconductor film has a width of greater than or equal to 0.01 µm and a length of greater than or equal to 1 µm. When a direction parallel to the scanning direction of the laser beam and the surface of the substrate is regarded as a second direction and a plane, where the second direction is regarded as a normal vector, is regarded as a second plane, in the plane orientation of the crystallized semiconductor film of the second plane, a ratio of an orientation {110} is greater than or equal to 0.5 within the range of an angle fluctuation of ±10°. Further, when a direction vertical to the scanning direction of the laser beam and parallel to the surface of the substrate is regarded as a third direction and a plane, where the third direction is regarded as a normal vector, is regarded as a third plane, in the plane orientation of the crystallized semiconductor film of the third plane, a ratio of an orientation {111} is greater than or equal to 0.4 within the range of an angle fluctuation of ±10°.

In addition, in the above methods for manufacturing a semiconductor device, the semiconductor film is formed using silicon. In addition, silicon germanium or SiC can also be used for the semiconductor film.

In the above methods for manufacturing a semiconductor device, the semiconductor film has a thickness of greater than or equal to 20 nm and less than or equal to 100 nm, preferably greater than or equal to 20 nm and less than or equal to 80 nm. When the semiconductor film has a thickness of greater than or equal to 80 nm, crystal growth proceeds also towards a film thickness direction; thus, the plane orientation is unlikely aligned in one direction.

In the above methods for manufacturing a semiconductor device, a continuous wave laser or a pulse laser having a repetition rate of greater than or equal to 10 MHz is used.

Moreover, in the above methods for manufacturing a semiconductor device, the cap film formed over the semiconductor film may be used as a gate insulating film.

According to the present invention, over an insulating substrate made from a material having a low melting point such as glass or plastic, it is possible to form a semiconductor film of a crystal having a large crystal grain size, in which the plane orientation between adjacent crystal grains are aligned in one direction or a direction that can be substantially regarded as one direction, that is, a quasi-single crystal that is infinitely close to a single crystal. Further, by using this quasi-single crystalline semiconductor film, it is possible to provide a semiconductor element capable of high speed operation with high current driving capacity and small variation of characteristics between elements, or a semiconductor device which is constituted by integrating a plurality of the semiconductor elements and a manufacturing method thereof.

Further, the quasi-single crystalline semiconductor film formed according to the present invention has extremely few crystal defects. By using this quasi-single crystal for an active layer of a TFT, a high-quality semiconductor device can be manufactured with high yields.

In addition, as shown in the present invention, by forming a cap film over a semiconductor film, heat generated due to absorption of a laser beam in the semiconductor film can be efficiently utilized for crystallization, and laser crystallization can be performed with a lower energy density. It is considered that this is because the cap film has a reflection prevention effect, a thermal storage effect, or the like. Therefore, when laser crystallization is performed to a semiconductor film with a cap film and a semiconductor film without a cap film by using laser oscillators having the same standard, a length of a linear beam spot can be more extended by using the semiconductor film with a cap film than using the semiconductor film without a cap film. Therefore, an area that can be crystallized per unit time can be increased, that is, throughput can be improved.

BRIEF DESCRIPTION OF DRAWINGS

In the accompanying drawings:

FIGS. 8A to 8D are views each showing an EBSP measurement result of a crystalline semiconductor film of the present invention;

FIGS. 13A to 13 E are views each showing a measurement result of a crystalline semiconductor film of the present invention by Raman spectroscopy;

FIG. 20 is a view explaining an example of a manufacturing method of a semiconductor device using the present invention;

FIGS. 27A to 27C are views each explaining an example of a manufacturing method of a semiconductor device using the present invention;

FIGS. 28A and 28B are views each explaining an example of a manufacturing method of a semiconductor device using the present invention;

FIGS. 29A and 29B are views each explaining an example of a manufacturing method of a semiconductor device using the present invention;

FIGS. 30A and 30B are views each explaining an example of a manufacturing method of a semiconductor device using the present invention;

FIGS. 44A and 44B are graphs each putting FIG. 42 and FIG. 43 together;

BEST MODE FOR CARRYING OUT THE INVENTION

Embodiment modes of the present invention will be explained hereinafter with reference to the accompanying drawings. However, it is to be easily understood that various changes and modifications will be apparent to those skilled in the art. Therefore, unless such changes and modifications depart from the purport and the scope of the present invention, they should be construed as being included therein.

Figure 5A:
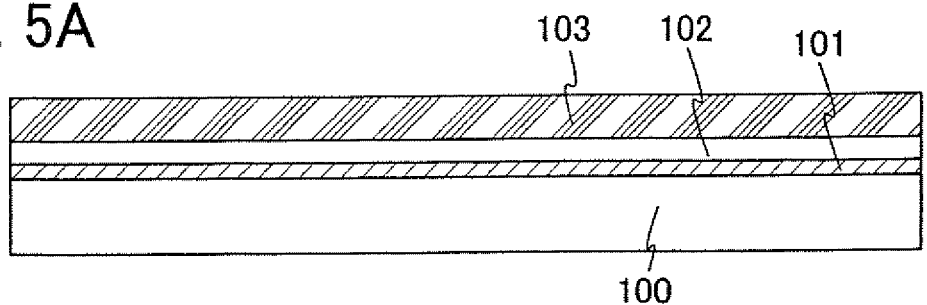
FIGS. 5A to 5D are views each explaining an embodiment mode of the present invention.

First, as shown in FIG. 5A, a silicon oxide film containing nitrogen having a thickness of 50 to 150 nm is formed as a base insulating film 101 on one surface of a glass substrate having a thickness of 0.7 mm, for example, as a substrate 100 having an insulating surface. Further, an amorphous silicon film is formed by a plasma CVD method, as a semiconductor film 102, over the base insulating film 101 to have a thickness of greater than or equal to 20 nm and less than or equal to 100 nm, preferably, greater than or equal to 20 nm and less than or equal to 80 nm. This semiconductor film 102 will be subsequently crystallized by a laser.

As the substrate 100, a substrate where glass such as alumino borosilicate glass or barium borosilicate glass having low absorptance with respect to visible light ray is used as a material, a quartz substrate, or the like is used. Besides, it is also possible to use a substrate where plastic typified by PET (polyethylene terephthalate), PES (polyether sulfone resin), or PEN (polyethylene naphthalate), or a synthesis resin typified by acrylic is used as a raw material.

Further, in order to increase resistance to a laser beam of the semiconductor film 102, the semiconductor film 102 is subjected to thermal annealing at 500° C. for an hour. Next, a silicon oxide film containing nitrogen having a thickness of 500 nm is formed over the semiconductor film 102 as a cap film 103. Note that, when the cap film 103 is too thin, it is difficult to obtain a quasi-single crystal from the semiconductor film 102; therefore, it is preferable to form the cap film 103 to have a thickness of greater than or equal to 200 nm. In this embodiment mode, the silicon oxide film containing nitrogen is formed using a plasma CVD method using monosilane ($SiH_4$) and nitrous oxide ($N_2O$) each as a reactive gas. Then, the semiconductor film 102 is crystallized by being irradiated with a laser beam through the cap film 103.

Here, the silicon oxide film containing nitrogen is selected for the cap film 103; however, besides, a silicon oxide film can also be used. As the cap film 103, a film close to the semiconductor film 102 where there is enough transmittance with respect to a wavelength of the laser beam, and a thermal value such as a thermal expansion coefficient and a value such as ductility are close may be used. Further, the cap film 103 is preferably a solid and dense film similarly to a gate insulating film. A solid and dense film can be formed by reducing a deposition rate, for example. In this embodiment mode, the cap film 103 is formed with a deposition rate of 40 nm/min. The deposition rate can be appropriately selected from the range of greater than or equal to 1 nm/min and less than or equal to 400 nm/min, preferably greater than or equal to 1 nm/min and less than or equal to 100 nm/min.

In this embodiment mode, an example of forming only one layer of the silicon oxide film containing nitrogen for the cap film 103 is shown; however, a cap film composed of a plurality of films each having a different kind of material may also be used. For example, an insulating film where a silicon oxide film containing nitrogen and a silicon nitride film containing oxygen are laminated, an insulating film where a silicon oxide film and a silicon nitride film containing oxygen are laminated, or the like can be used as the cap film. In addition, the cap film 103 may have a structure having a plurality of layers where light absorptance in the semiconductor film 102 is increased by utilizing interference effect of light due to a thin film. Through the above, a subject having a surface subsequently irradiated with a laser beam, that is, a surface to be irradiated 208 (see FIG. 6) is completed.

In this embodiment mode, an example of using the amorphous silicon film as the semiconductor film 102 is shown; however, a polycrystalline silicon film may also be used. For example, after forming an amorphous silicon film, a polycrystalline silicon film can be formed by adding a minute amount of an element such as nickel, palladium, germanium, iron, tin, lead, cobalt, silver, platinum, copper, or gold to the amorphous silicon film, and then performing heat treatment at 550° C. for 4 hours. Further, a compound of silicon with germanium or carbon may also be used as the semiconductor film. Moreover, a peeling layer may be provided between the base insulating film 101 and the substrate 100 to peel a semiconductor element from the substrate 100 after the process.

Figure 6:
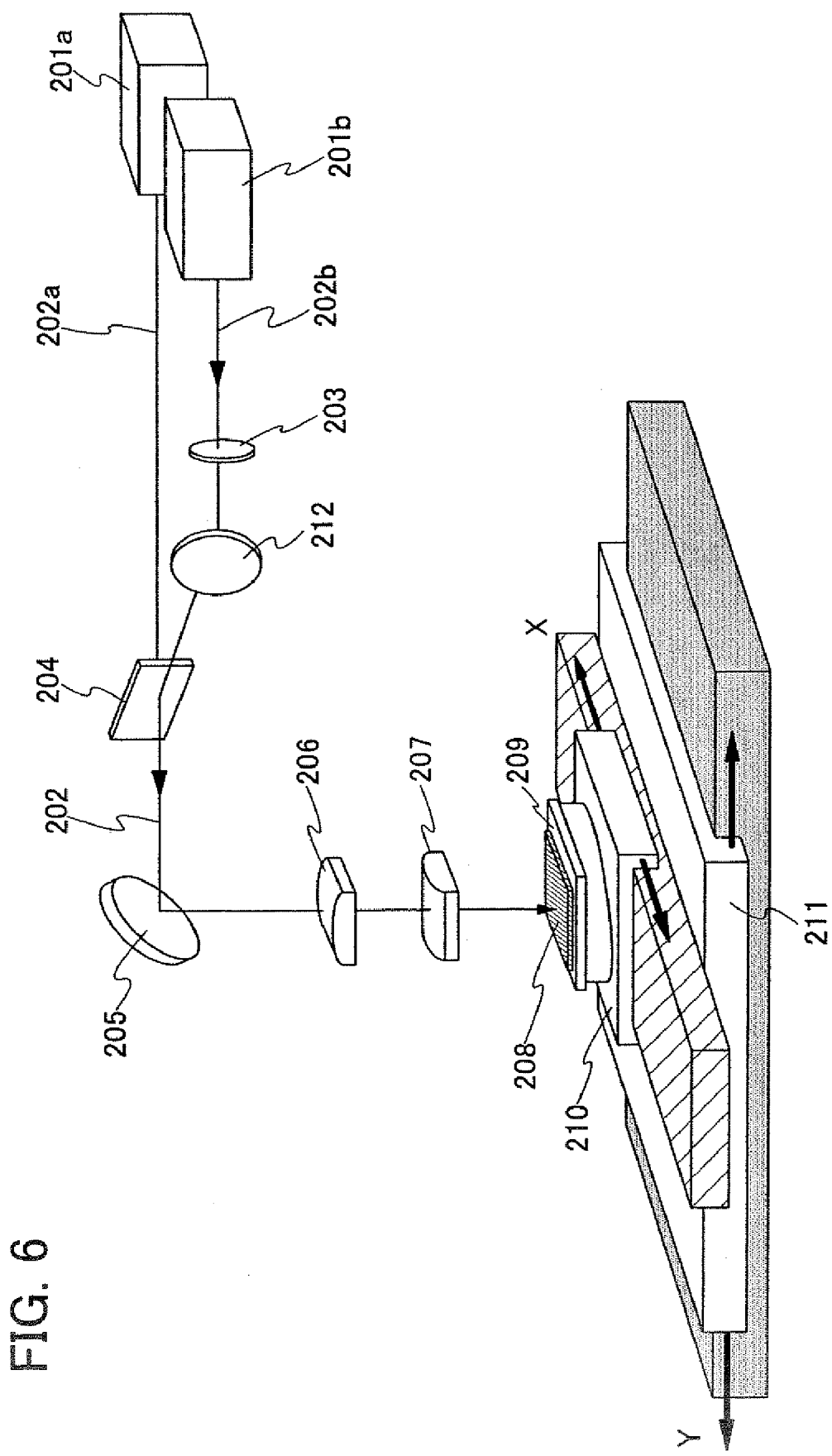
FIG. 6 is a view showing an example of a laser irradiation apparatus used for manufacturing a crystalline semiconductor film of the present invention.

Next, a laser oscillator and an optical system for forming a beam spot, which are used for the crystallization, will be explained As shown in FIG. 6, as laser oscillators 201a and 201b, a CW laser with LD excitation ($YVO_4$, a second harmonic (a wavelength of 532 nm)), maximum total output of which is 20 W, is prepared. It is not necessary to particularly limit the wavelength of the laser to a second harmonic; however, the second harmonic is superior to a further higher order harmonic in terms of energy efficiency.

When a semiconductor film is irradiated with the CW laser, energy is continuously provided to the semiconductor film; therefore, when the semiconductor film is once brought to a melted state, the melted state can be continued. Further, a solid-liquid interface of the semiconductor film is moved by scanning the CW laser beam; therefore, a crystal grain which is long in one direction along this movement direction can be formed. In addition, a solid laser is used because, as compared with a gas laser or the like, output has high stability and stable process is expected. Note that, without limitation to the CW laser, it is possible to use a pulse laser having a repetition rate of greater than or equal to 10 MHz. When a pulse laser having a high repetition rate is used, the semiconductor film can be always kept melting, as long as a pulse interval of the laser is shorter than a time between melt and solidification of the semiconductor film. Thus, a semiconductor film composed of the crystal grain which is long in one direction by the movement of the solid-liquid interface can be formed. Note that the two laser oscillators are prepared in the case of FIG. 6; however, one laser oscillator may be prepared as long as the output is enough. Moreover, when a pulse laser having a high repetition rate is used, one laser oscillator may also be prepared.

In this embodiment mode, a YVO$_4$ laser is used for the laser oscillators 201a and 201b; however, other CW laser and pulse laser having a repletion rate of greater than or equal to 10 MHz can also be used. For example, as a gas laser, there is an Ar laser, a Kr laser, a CO$_2$ laser, or the like. As a solid-state laser, there is a YAG laser, a YLF laser, a YAlO$_3$ laser, a GdVO$_4$ laser, a KGW laser, a KYW laser, an alexandrite laser, a Ti:sapphire laser, a Y$_2$O$_3$ laser, a YVO$_4$ laser, or the like. Moreover, there is a ceramic laser such as a YAG laser, a Y$_2$O$_3$ laser, a GdVO$_4$ laser, or YVO$_4$ laser. As a metal vapor laser, there is a helium cadmium laser or the like.

In addition, in the laser oscillator 201a and the laser oscillator 201b, energy uniformity of a linear beam spot that is obtained in the surface to be irradiated 20S can be increased, when the laser beam is emitted with oscillation of TEM$_{00}$ (a single lateral mode), which is preferable.

The brief description of the laser irradiation is as follows. Laser beams 202a and 202b are each emitted with the same energy from the laser oscillators 201a and 201b. A polarization direction is changed by the laser beam 202b emitted from the laser oscillator 201b through a wavelength plate 203. The polarization direction of the laser beam 202b is changed because the two laser beams each having a polarization direction different to each other are synthesized by a polarizer 204. After the laser beam 202b is passed through the wavelength plate 203, the laser beam 202b is reflected by a mirror 212 and made to enter the polarizer 204. Then, the laser beam 202a and the laser beam 202b are synthesized by the polarizer 204. The wavelength plate 203 and the polarizer 204 are adjusted so that light that has transmitted the wavelength plate 203 and the polarizer 204 has appropriate energy. Note that, in this embodiment mode, the polarizer 204 is used for synthesizing the laser beams; however, other optical element such as a polarization beam splitter may also be used.

A laser beam 202 that is synthesized by the polarizer 204 is reflected by a mirror 205, and a cross section of the laser beam is formed into a linear shape in the surface to be irradiated 208 by a cylindrical lens 206 having a focal length of 150 mm, and a cylindrical lens 207 having a focal length of 20 mm, for example. The mirror 205 may be provided depending on a situation of an optical system of a laser irradiation apparatus. The cylindrical lens 206 operates in a length direction of the beam spot that is formed in the surface to be irradiated 208, whereas the cylindrical lens 207 operates in a width direction thereof. Accordingly, in the surface to be irradiated 208, a linear beam spot having a length of approximately 500 μm and a width of approximately 20 μm, for example, is formed. Note that, in this embodiment mode, the cylindrical lenses are used to form the beam spot into a linear shape; however, the present invention is not limited thereto, and other optical element such as a spherical lens may also be used. Moreover, the focal lengths of the cylindrical lenses are not limited to the above values and can be arbitrarily set.

Further, in this embodiment mode, the laser beam is formed using the cylindrical lenses 206 and 207; however, an optical system for extending the laser beam to a linear shape and an optical system for converging thin in the surface to be irradiated may be additionally provided. For example, in order to obtain the linear cross section of the laser beam, a cylindrical lens array, a diffractive optical element, an optical waveguide, or the like can be used. In addition, with the use of a rectangular-shape laser crystal, the linear cross section of the laser beam can also be obtained at an emission stage. The ceramic laser can form a shape of laser crystal relatively freely; therefore, the ceramic laser is appropriate for manufacturing such a laser. Note that the cross-sectional shape of the laser beam which is formed in a linear shape is preferably as narrow as possible, which increases an energy density of the laser beam in the semiconductor film; therefore, a process time can be shortened.

Then, an irradiation method of the laser beam will be explained. In order to operate the surface to be irradiated 208, where the semiconductor film is formed, with a relatively high speed, the surface to be irradiated 208 is fixed to suction stage 209. The suction stage 209 can operates in X and Y directions on a plane parallel to the surface to be irradiated 208 by an X-axis uniaxial robot 210 and a Y-axis uniaxial robot 211. The uniaxial robots are disposed so that the length direction of the linear beam spot corresponds to the Y axis. Next, the surface to be irradiated 208 is made to operate along the width direction of the beam spot, that is, the X axis, and the surface to be irradiated 208 is irradiated with the laser beam. Here, a scanning speed of the X-axis uniaxial robot 210 is 35 cm/sec, and the laser beam having an energy of 7.5 W is emitted from each of the two laser oscillators 201a and 201b. The laser output after synthesizing the laser beams is to be 15 W.

A region completely melted is formed in the amorphous semiconductor film by being irradiated with the laser beam. A crystal is grown in one plane orientation during a solidifying process; thus, a quasi-single crystal can be obtained. Note that energy distribution of the laser beams emitted from the laser oscillators in a TEM$_{00}$ mode is generally in a Gaussian distribution. When this laser beam is used for a crystallization process of the semiconductor film, a quasi-single crystalline region is formed only in the center vicinity of the laser beam, where the intensity is high. Note that a width of the region where a quasi-single crystal is formed can be changed by the optical system used for the laser beam irradiation. For example, intensity of the laser beam can be homogenized by using a lens array such as a cylindrical lens array or a fly eye lens; a diffractive optical element; an optical waveguide; or the like. By irradiating the semiconductor film with the laser beam, intensity of which is homogenized, almost all of the regions irradiated with the laser beam can be used to form a quasi-single crystal. A scanning speed of the X-axis uniaxial robot 210 is appropriate when it is to be approximately several 10 to several 100 cm/sec, and the speed may be appropriately decided by a worker in accordance with the output of the laser oscillators.

Note that, in this embodiment mode, a mode of moving the amorphous semiconductor film, which is the surface to be irradiated 208, by using the X-axis uniaxial robot 210 and the Y-axis uniaxial robot 211 is used. Without limitation thereto, the laser beam can be scanned by using a method for moving an irradiation system in which the surface to be irradiated 208 is fixed while an irradiation position of the laser beam is moved; a method for moving a surface to be irradiated in which the irradiation position of the laser beam is fixed while the surface to be irradiated 208 is moved; or a method in which these two methods are combined.

Note that, as described above, the energy distribution of the beam spot, which is formed by the above optical system, is in a Gaussian distribution in a major axis; therefore, a small grain crystal is formed in a place having a low energy density at the both ends. Thus, part of the laser beam may be cut by providing a slit or the like in front of the surface to be irradiated 208 so that the surface to be irradiated 208 is irradiated only with energy enough to form a quasi-single crystal. Alternatively, a metal film or the like that reflects the laser beam may be formed over the silicon oxide film containing nitrogen, which is the cap film 103, and a pattern may be fox so that the laser beam reaches only a place of the semiconductor film where a quasi-single crystal is desired to be obtained. Moreover, in order to efficiently use the laser beam emitted from the laser oscillator 201a and the laser oscillator 201b, the energy of the beam spot may be uniformly distributed in a length direction by using a beam homogenizer such as a lens array or a diffractive optical element.

Further, the Y-axis uniaxial robot 211 is moved by a width the quasi-single crystal that is formed, and the X-axis uniaxial robot 210 is rescanned with a scanning speed at 35 cm/sec. By repeating a series of such operations, the entire surface of the semiconductor film can be efficiently crystallized.

Figure 5B:
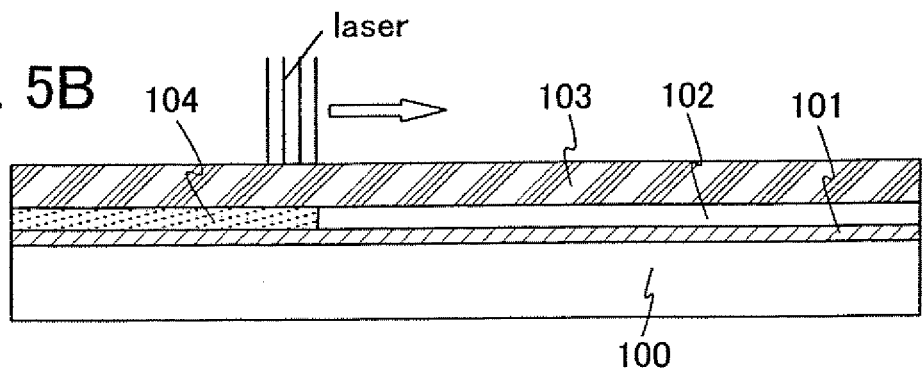
Figure 5C:
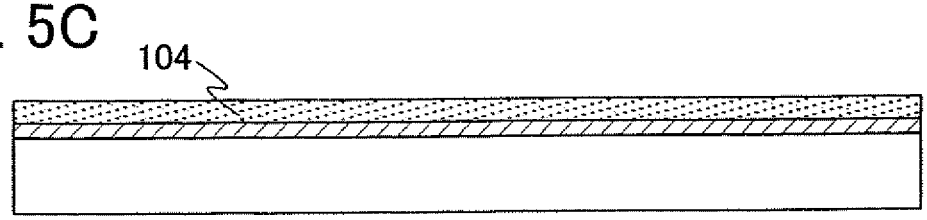
Figure 5D:
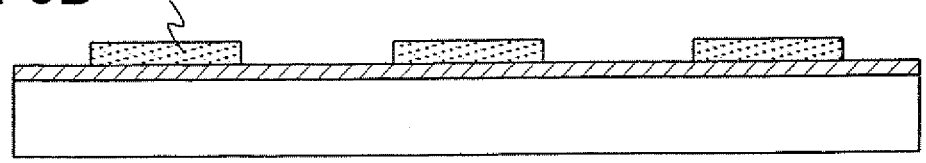

Thereafter, as shown in FIG. 5C, the cap film 103 is removed by performing etching. Further, a resist is coated over the quasi-single crystalline semiconductor film 104, exposed, and developed, thereby forming a resist into a desired shape. Furthermore, etching is performed using the resist formed here as a mask, and the quasi-single crystalline semiconductor film 104, which is exposed by developing, is removed. Through this process, an island-shaped semiconductor film 105 is formed (FIG. 5D).

The quasi-single crystalline semiconductor film formed using the present invention is composed of a plurality of crystal grains, and the grain size of these crystal grains has a width of greater than or equal to 0.01 μm and a length of greater than or equal to 1 μm.

In addition, in the quasi-single crystalline semiconductor film formed using the present invention, a direction vertical to the surface of the substrate, a direction parallel to the scanning direction of the laser beam and the surface of the substrate, and a direction vertical to the scanning direction of the laser beam and parallel to the surface of the substrate are regarded as a first direction, a second direction, and a third direction, respectively. Further, planes, where the above first direction, second direction, and third direction are each regarded as a normal vector, are regarded as a first plane, a second plane, and a third plane, respectively. At this time, in the plane orientation of the semiconductor film of the first plane, a ratio of an orientation {211} is greater than or equal to 0.4 within the range of an angle fluctuation of ±10°. In addition, in the plane orientation of the semiconductor film of the second plane, a ratio of an orientation {110} is greater than or equal to 0.5 within the range of an angle fluctuation of ±10°. Moreover, in the plane orientation of the semiconductor film of the third plane, a ratio of an orientation {111} is greater than or equal to 0.4 within the range of an angle fluctuation of ±10°.

As discussed above, in the quasi-single crystalline semiconductor film formed using the present invention, the plane orientation of a crystal grain is aligned in one direction or in a direction that can be substantially regarded as one direction. In other words, the quasi-single crystalline semiconductor film has a property close to that of a single crystal. By using such a semiconductor film, performance of a semiconductor device can be considerably improved.

For example, when a TFT is formed, it is possible to obtain the same electric field effect mobility as that of a semiconductor device using a single crystal semiconductor. In addition, it is possible to reduce variation of an on current value (a drain current value that flows when a TFT is turned on), an off current value (a drain current value that flows when a TFT is in an off state), a threshold voltage, an S value, and electric field effect mobility. Since there is such an effect, an electrical characteristic of a TFT is improved, and an operational characteristic and reliability of a semiconductor device using a TFT is improved. Thus, a semiconductor device capable of high speed operation with high current driving capacity and small variation of characteristics between pluralities of elements can be manufactured.

Embodiment 1

This embodiment will explain a measurement result of the plane orientation of a quasi-single crystalline silicon film of the present invention, which is used as a sample, by an EBSP method. In addition, the plane orientations of a single crystalline silicon film and a silicon film where a large grain crystal is formed were measured by an EBSP method in the same manner, and they were compared.

When an electron beam is made to enter a sample having a crystal structure, inelastic scatterings also occur at the back, and a linear pattern, which is peculiar to crystal orientation by Bragg diffraction, can also be observed in the sample. Here, this linear pattern has generally been referred to as a Kikuchi line. An EBSP method obtains crystal orientation of a sample by analyzing a Kikuchi line reflected in a detector.

A sample having a polycrystalline structure has crystal orientations where each crystal grain is different. Thus, every time the irradiation position of the sample is moved, the sample is irradiated with the electron beam and the crystal orientation in each irradiation position is analyzed. In such a manner, the crystal orientation or orientation information of a sample having a flat surface can be obtained. As a measurement region is broader, the tendency of the crystal orientation of the entire sample can be obtained more; and as there is more measurement point, the more information on the crystal orientation in the measurement region can be obtained in detail.

However, the plane orientation within the crystal cannot be decided only with the plane orientation on one surface of the crystal. This is because, even when a plane orientation is aligned in one orientation only in one viewing surface, it cannot be said that the plane orientation is aligned within the crystal if the plane orientation is not aligned in other viewing surfaces.

In order to decide the plane orientation within a crystal, the plane orientations at least from two surfaces are needed, and the precision is increased as much information is obtained from more planes. Therefore, when plane orientation distributions of all three planes are almost uniform within the measurement region, a crystal thereof can be regarded as, approximately, a single crystal, that is, a quasi-single crystal.

Figure 10:
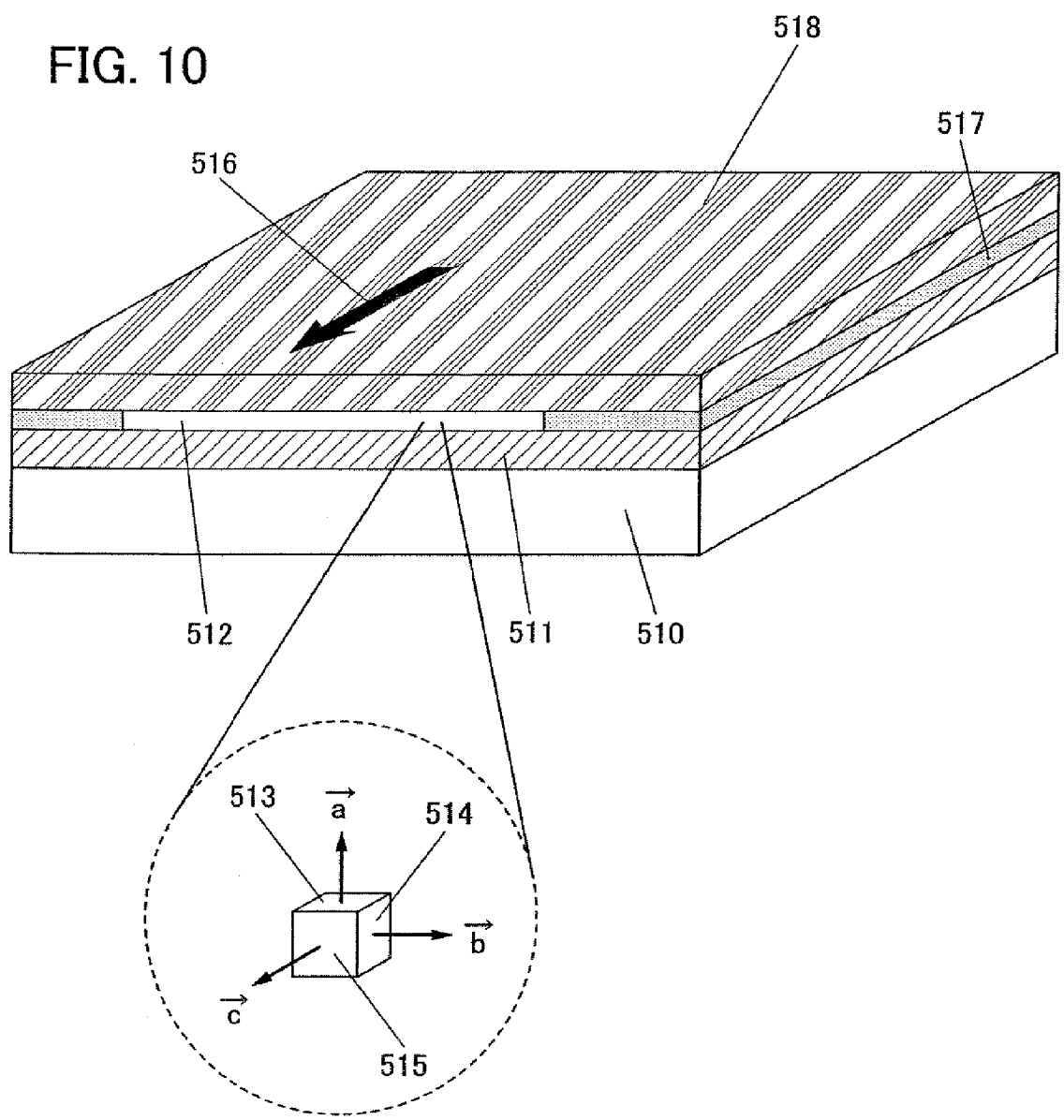
FIG. 10 is a view explaining a measurement direction of FIGS. 8A to 8D and FIGS. 9A to 9F.

Actually, as shown in FIG. 10, a base insulating film 511 was formed over a substrate 510, and an amorphous semiconductor film 517 was formed over this base insulating film 511. Further, a cap film 518 was formed over the amorphous semiconductor film 517. The amorphous semiconductor film 517 was irradiated with a laser beam through the cap film 518 to perform crystallization. Then, the plane orientation within a crystal can be specified with high precision by putting together pieces of information on three planes (a viewing surface A 513, a viewing surface B 514, and a viewing surface C 515) where three vectors vertical to each other (a vector a, a vector b, and a vector c) are each to be a normal vector. In this embodiment, in a quasi-single crystalline silicon film and a silicon film where a large grain crystal is formed, the vectors a to c are set as described below. The vector c is parallel to a scanning direction 516 of the laser beam and the surface of the substrate 510, the vector a is vertical to the surface of the substrate 510 and the vector c, and the vector b is vertical to each of the vector a and vector c.

First, FIGS. 8A to 8D and FIGS. 9A to 9F each show a result of analyzing the plane orientation in the above three planes (a crystal axis orientation in a direction vertical to a viewing surface) of a quasi-singe crystalline silicon film 512.

The quasi-single crystalline silicon film that is used for the measurement was formed in the same manner as the sample used in the embodiment mode. The base insulating film having a thickness of 150 nm was formed on one surface of a glass substrate having a thickness of 0.7 mm. An amorphous silicon film having a thickness of 66 nm was formed over this base insulating film by a plasma CVD method, and further a silicon oxide film was formed to have a thickness of 500 nm as the cap film. More specifically, a manufacturing method of the sample will be described.

As the substrate, a glass substrate having a thickness of 0.7 mm manufactured by Corning, Inc. was used. As the base insulating film, a film having a thickness of 150 nm, in which a silicon nitride film containing oxygen and a silicon oxide film containing nitrogen are stacked, was formed by a plasma CVD apparatus of a parallel plate type. A deposition condition is as follows.

<Silicon Nitride Film Containing Oxygen>
 Thickness: 50 nm
 Type of gas (flow rate): $SiH_4$ (10 sccm), $NH_3$ (100 sccm), $N_2O$ (20 sccm), $H_2$ (400 sccm)
 Substrate temperature: 300° C.
 Pressure: 40 Pa
 RF frequency: 27 MHz
 RF power: 50 W
 Distance between electrodes: 30 mm
<Silicon Oxide Film Containing Nitrogen>
 Thickness: 100 nm
 Type of gas (flow rate): $SiH_4$ (4 sccm), $N_2O$ (800 sccm)
 Substrate temperature: 400° C.
 Pressure: 40 Pa
 RF frequency: 27 MHz
 RF power: 50 W
 Distance between electrodes: 15 mm The amorphous silicon film was formed over the base insulating film by a plasma CVD apparatus of a parallel plate type. A deposition condition of the amorphous silicon film is as follows.

<Amorphous Silicon Film>
 Thickness: 66 nm
 Type of gas: $SiH_4$ (25 sccm), $H_2$ (150 sccm)
 Substrate temperature: 250° C.
 Pressure: 66.7 Pa
 RF frequency: 27 MHz
 RF power: 50 W
 Distance between electrodes: 25 mm After forming the amorphous silicon film, heating was performed at 500° C. for an hour in an electric furnace. This thermal treatment is treatment for extracting hydrogen from the amorphous silicon film. Hydrogen is extracted to prevent a hydrogen gas from spouting from the amorphous silicon film when the amorphous silicon film is irradiated with a laser beam, which can be omitted when a little hydrogen is contained in the amorphous silicon film.

A silicon oxide film having a thickness of 500 nm was formed as a cap film over the amorphous silicon film. A deposition condition is as follows.

<Silicon Oxide Film>
 Thickness: 500 nm
 Type of gas: $SiH_4$ (4 sccm), $N_2O$ (800 scan)
 Substrate temperature: 400° C.
 Pressure: 40 Pa
 RF frequency: 60 MHz
 RF power: 150 W
 Distance between electrodes: 28 mm Table 1 shows compositions of the base insulating film and the cap film. The compositions of the film shown in Table 1 are in a state before heat treatment or laser irradiation. The composition ratios were measured using Rutherford Backscattering Spectrometry (RBS) and Hydrogen Forward Scattering (HFS). A measurement sensitivity is approximately ±2%.

TABLE 1

| Material | | Composition ratio (%) | | | |
|---|---|---|---|---|---|
| | | Si | N | O | H |
| Silicon oxide film | Cap film | 32.1 | 0.0 | 66.0 | 1.9 |
| Silicon oxide film containing nitrogen | 2nd layer of the base insulating film | 32.6 | 0.2 | 65.8 | 1.4 |
| Silicon nitride film containing oxygen | 1st layer of the base insulating film | 32.2 | 45.5 | 5.2 | 17.2 |

Next, the amorphous silicon film was irradiated with the laser beam through the cap film. In this embodiment, two laser beams each having an energy of 7.5 W were emitted, and synthesized using an optical system. Thereafter, the laser beam was formed into a linear shape having a width of 500 μm and the irradiation was performed. The energy of the laser beam after being synthesized is 15 W, and a scanning speed of the laser beam is 35 cm/sec.

The electron beam entered the sample with an incidence angle of 60° with respect to this sample surface (that is, the surface of the quasi-single crystalline silicon film), and a crystal orientation was measured from the obtained EBSP image. The measurement region is 100×50 μm. In this region, the measurement was carried out on lattice points each having 0.25 μm in length and width. Since the sample surface is a measuring surface by an EBSP method, a silicon film is necessary to be a top layer. Therefore, the measurement was carried out after etching the silicon oxide film containing nitrogen which is the cap film.

FIG. 8A shows a plane orientation distribution in the plane A where the vector a serves as a normal vector, as well, FIG. 8B shows a plane orientation distribution in the plane B where the vector b serves as a normal vector, and FIG. 8C shows a plane orientation distribution in the plane C where the vector c serves as a normal vector. FIGS. 8A to 8C are each an orientation map image which shows that which plane orientation is indicated by each measurement point. According to this image, it is found that orientation is strongly obtained in an orientation {211} in the viewing surface A, an orientation {111} in the viewing surface B, and an orientation {110} in the viewing surface C. In addition, since the plane orientation within individual crystal grain is uniform, pieces of information on a shape, a size, or the like of individual crystal grain can be roughly obtained.

Here, according to FIGS. 8A to 8C, it is found that the quasi-single crystalline silicon film of the present invention is composed of a domain extended long in a column shape.

In addition, according to FIGS. 8A to 8C, it is found that orientation is strongly obtained in the orientation {211}, the orientation {111}, and the orientation {110} in the viewing surfaces A, B, and C, respectively. When it is found that orientation is strongly obtained in a specific index, an orientation degree can be grasped by obtaining a rate of how much crystal grains are gathered in vicinity of the index.

Figure 9A:
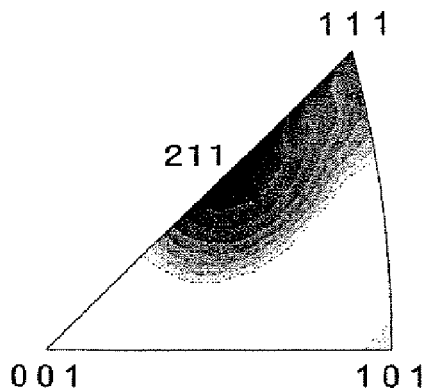
FIGS. 9A to 9F are views each showing an EBSP measurement result of a crystalline semiconductor film of the present invention.

FIG. 9A is an inverse pole figure showing a frequency distribution of plane orientation appearance, which shows that how the plane orientation {211} in the viewing surface A is distributed within the measurement range. In the same manner, FIG. 9C show that how the plane orientation {111} in the viewing surface B is distributed and FIG. 9E shows that how the plane orientation {110} in the viewing surface C is distributed within the measurement region.

Figure 9B:
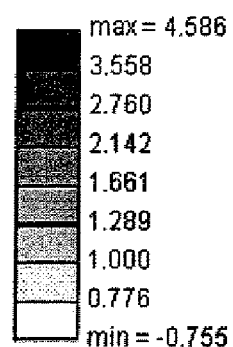
Figure 9C:
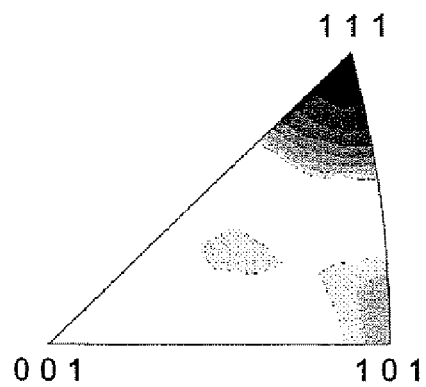
Figure 9D:
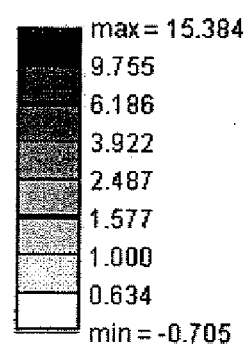
Figure 9E:
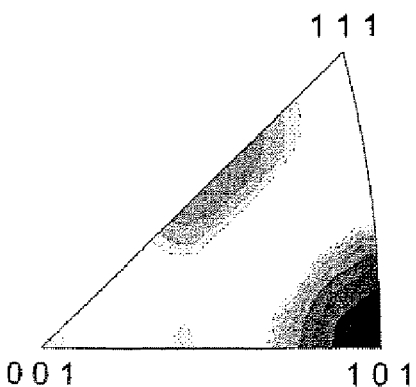
Figure 9F:
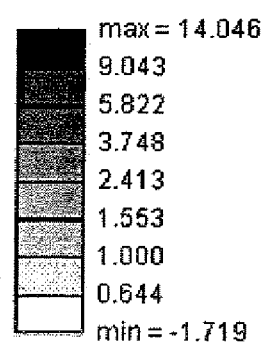

FIG. 9B shows a frequency of the inverse pole figure in FIG. 9A. M this case, it is shown that the orientation {211} appears with a frequency of approximately 4.5 times as often as a state in which all orientations of the viewing surface A appear with identical probability. In the same manner, FIG. 9D shows a frequency of the inverse pole figure in FIG. 9C. In this case, it is shown that the orientation {111} appears with a frequency of approximately 15.4 times as often as a state in which all orientations of the viewing surface B appear with identical probability. Moreover, FIG. 9F shows a frequency of the inverse pole figure in FIG. 9E. In this case, it is shown that the orientation {110} appears with a frequency of approximately 14.1 times as often as a state in which all orientations of the viewing surface C appear with identical probability.

Further, in the inverse pole figure in FIG. 9A, the range of an angle fluctuation of the orientation {211} is decided to be within ±10°, and a rate of the number of the measurement point that the angle fluctuation of the orientation {211} with respect to all measurement points exist within ±10° is obtained; therefore, an orientation ratio can be obtained.

Figure 45A:
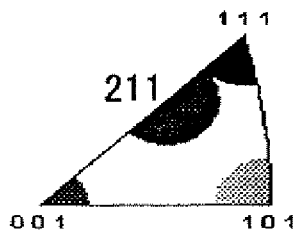
FIGS. 45A and 45B are views each showing a result by the EBSP method in FIGS. 3A to 3H and FIG. 4.
Figure 45B:
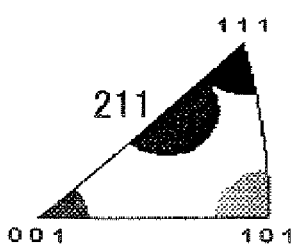
Figure 46:
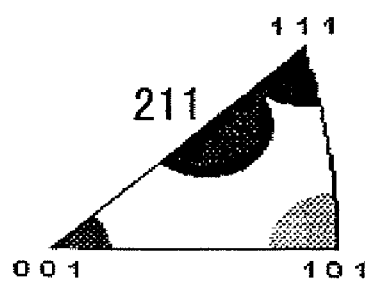
FIG. 46 is a view showing a result by the EBSP method in FIGS. 3A to 3H and FIG. 4.

The result is shown in FIGS. 45A and 45B, and FIG. 46. FIGS. 45A and 45B, and FIG. 46 are results of obtaining orientation ratios in a viewing surface A, a viewing surface B, and a viewing surface C, respectively. In FIGS. 45A and 45B, and FIG. 46, the obtained value of the ratio at the points having a specific orientation of all measurement points is a Partition Fraction value. The obtained value of the orientation ratio at the measurement points having high orienting reliability among the points having a specific orientation with respect to all measurement points is a Total Fraction value. Moreover, Table 2 is a summarizing Total Fraction of FIGS. 45A and 45B, and FIG. 46. As a result, in the viewing surface A of the quasi-single crystalline silicon film of the present invention, the orientation {211} occupies 42.1% within the range of an angle fluctuation of ±10°. In the same manner, in the viewing surface B, the orientation {111} occupies 41.2% within the range of an angle fluctuation of ±10°. Further, in the viewing surface C, as well, the orientation {110} occupies 52.3% within the range of an angle fluctuation of ±10°.

TABLE 2

| | Total Fraction (%) | | | |
|---|---|---|---|---|
| (%) | {100} | {110} | {111} | {211} |
| Viewing surface A | 0.2 | 0.4 | 8.6 | 42.1 |
| Viewing surface B | 0.3 | 5.1 | 41.2 | 7.1 |
| Viewing surface C | 0 | 52.3 | 0.2 | 7.4 |

As described through the above, the plane orientation of crystal grains is aligned in one direction with a high rate in all of the three viewing surfaces. In other words, it is found that a quasi-single crystal, where it can be regarded that the plane orientation of crystal grains is aligned in one direction, is formed in a crystallized region. In such a manner, it was confirmed that a quasi-single crystal, of which specific plane orientation occupies an extremely high ratio, is formed over a glass substrate in a region having one side of several ten µm. Here, an equivalent orientation group such as (100), (010), and (001) of the plane orientation of crystal grains is referred to as {100} together, and the same can be said for other orientations of {110}, {111}, and {211}.

Figure 40A:
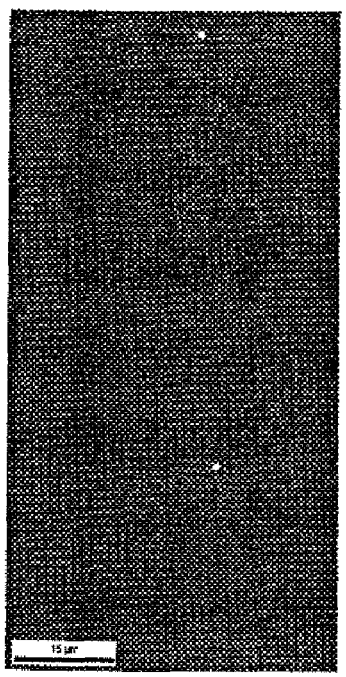
FIGS. 40A to 40D are views each showing a measurement result of a single crystalline silicon film by an EBSP method.
Figure 40B:
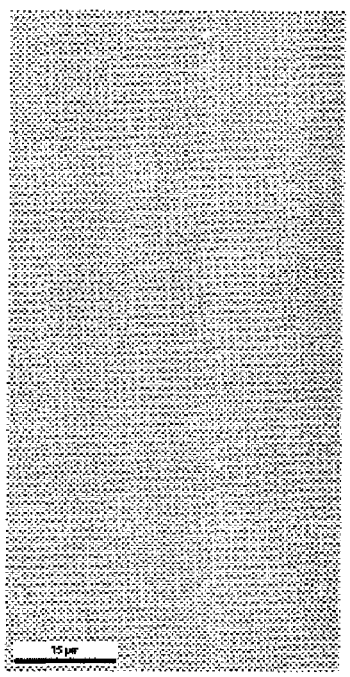
Figure 40C:
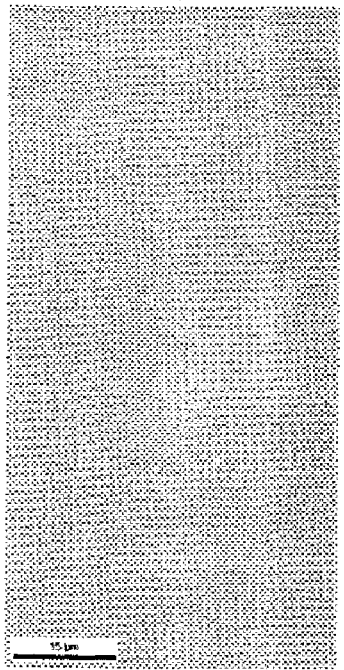
Figure 40D:
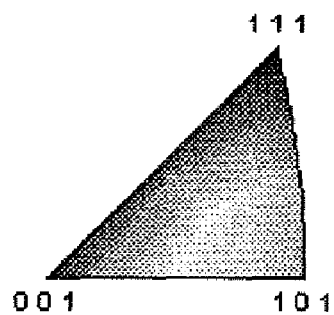

The EBSP measurement result of a single crystalline silicon film (SIMOX: Separation by Implanted OXygen) is shown for comparison (FIGS. 40A to 40D). The measurement region is 100×50 µm. Within this region, the measurement was carried out on lattice points each having 1 µm in length and width. In FIGS. 40A to 40C, FIGS. 40A to 40C shows the plane orientation distributions in viewing surfaces A, B, and C, respectively, and FIG. 40D shows the plane orientations in FIGS. 40A to 40C. According to this measurement, it is found that the three viewing surfaces each have a completely uniform plane orientation. The plane orientation is {001} in the viewing surface A and {110} in both the viewing surface B and the viewing surface C. Then, it was found that a crystal grain is not formed in each viewing surface.

Further, a silicon film, where a large grain crystal is formed, was measured in the same manner for comparison. A manufacturing method of a sample is as follows. A silicon oxide film containing nitrogen having a thickness of 150 nm was formed as a base insulating film on one surface of a glass substrate having a thickness of 0.7 mm, and an amorphous silicon film having a thickness of 66 nm was formed over this base insulating film by a plasma CVD method. After forming the amorphous silicon film, a subject irradiated with a laser beam having an energy of 4 W with a scanning speed at 35 cm/sec was used as the sample. In other words, a manufacturing procedure of the sample is different from that of the quasi-single crystalline silicon film of the present invention in that a cap film is not formed in forming a large grain crystal.

The measurement region of this sample by an EBSP method is 50×50 µm. Within this region, the measurement was carried out on lattice points each having 0.25 µm in length and width. As a result of the measurement, as shown in FIGS. 3A to 3H, it is found that there is variation in the plane orientation and a crystal growth direction in the viewing surfaces A, B, and C. In addition, it is found that the crystal grain size thereof is larger than that of the quasi-single crystalline silicon film.

Through the above experiment result, it is found that the quasi-single crystalline silicon film of the present invention is different in a tendency of the grain size and the plane orientation from the single crystalline silicon film and the silicon film, where a large grain crystal is formed.

Embodiment 2

This embodiment will explain a result of measuring characteristics of a semiconductor film of the present invention.

Figure 7A:
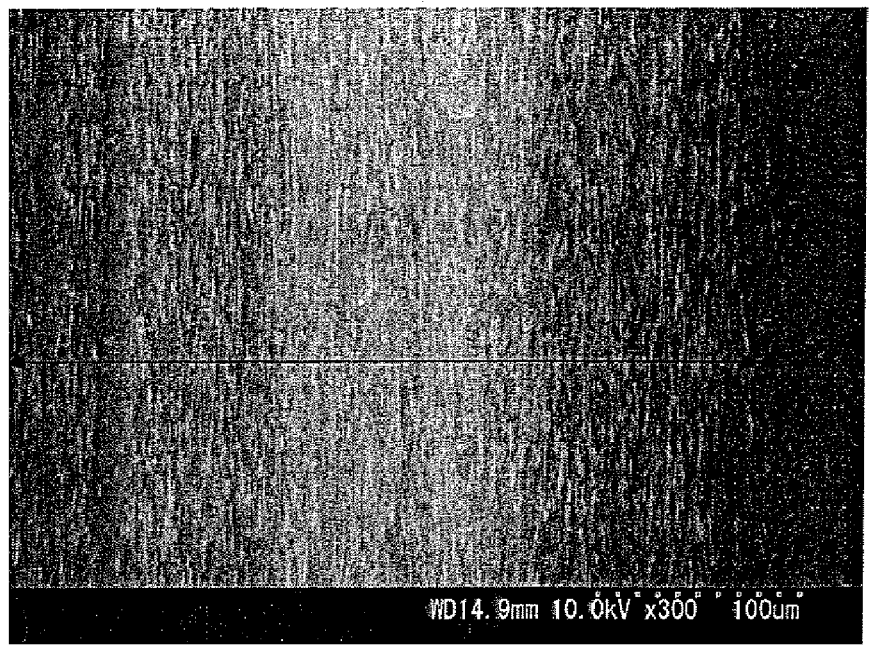
FIGS. 7A and 7B are each a microphotograph of a crystalline semiconductor film of the present invention.
Figure 7B:
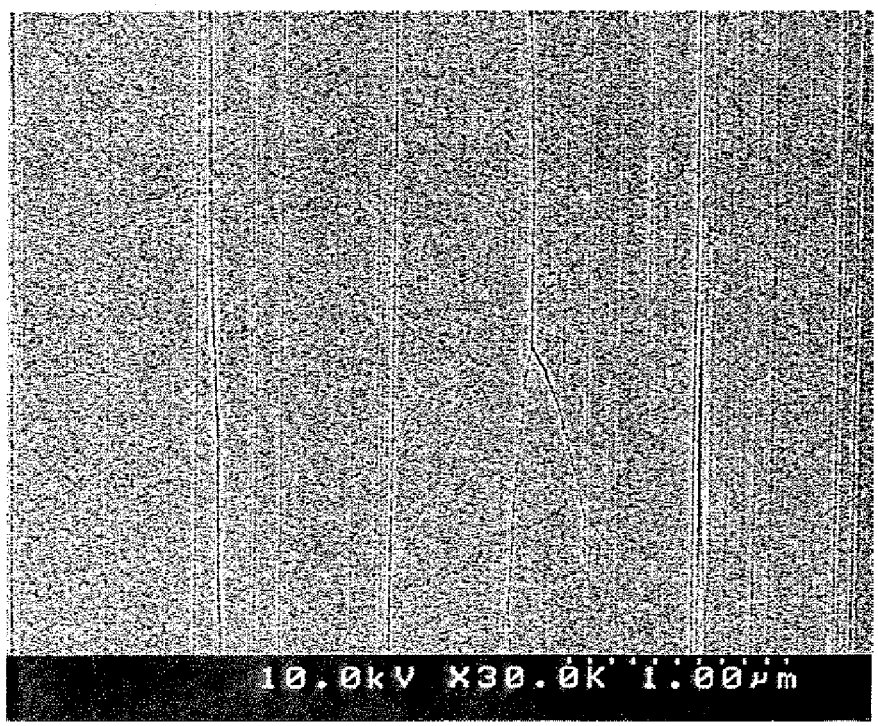

FIGS. 7A and 7B each show an optical microscope photograph of a quasi-single crystalline silicon film that is manufactured using the present invention. A sample was manufactured through the following procedure. A silicon oxide film containing nitrogen having a thickness of 150 nm was formed as a base insulating film over a glass substrate having a thickness of 0.7 mm, an amorphous silicon film was formed to have a thickness of 66 nm, and further a silicon oxide film containing nitrogen having a thickness of 500 nm was formed as a cap film. Next, two laser oscillators were prepared and each laser beam was emitted with an energy of 7.5 W. After synthesizing the energy of this two laser beams by using an optical system, the amorphous silicon film was irradiated with the laser beam through the cap film. The laser beam energy after synthesizing the laser beams and the scanning speed are 15 W and 35 cm/sec, respectively. Thereafter, the cap film was removed and etching (Secco etching) was performed.

Note that Secco etching is etching performed to make apparent a crystal grain boundary of a crystalline semiconductor film surface. An etching solution used for this etching treatment is made by adding potassium dichromate as an additive to a hydrofluoric acid solution, where a ratio of HF and $H_2O$ is 2 to 1. Actually, this solution was diluted with water and the etching treatment was performed at a room temperature.

FIG. 7A is a microscope photograph before performing Secco etching to the quasi-single crystalline silicon film of the present invention. It is found that the growth direction of a crystal is aligned within the range shown by an arrow.

FIG. 7B is an enlarged photograph of the quasi-single crystalline silicon film after Secco etching. Note that Secco etching was performed to remove amorphous silicon that remains on a grain boundary. According to FIGS. 7A and 7B, it was found that a grain boundary, of which width gets greater than or equal to 0.01 μm and length gets greater than or equal to 1 μm, is formed and adjacent grain boundaries are parallel to each other.

Figure 17:
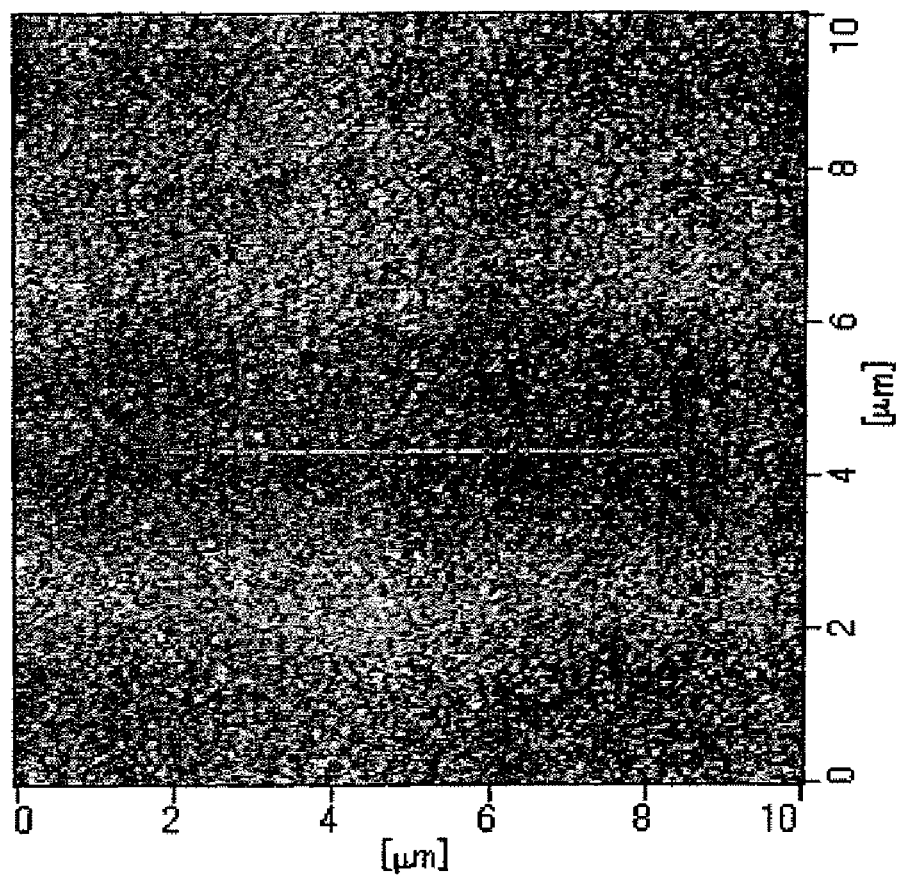
FIG. 17 is a view showing an analysis result of a crystalline semiconductor film of the present invention by an atomic force microscopy.
Figure 18:
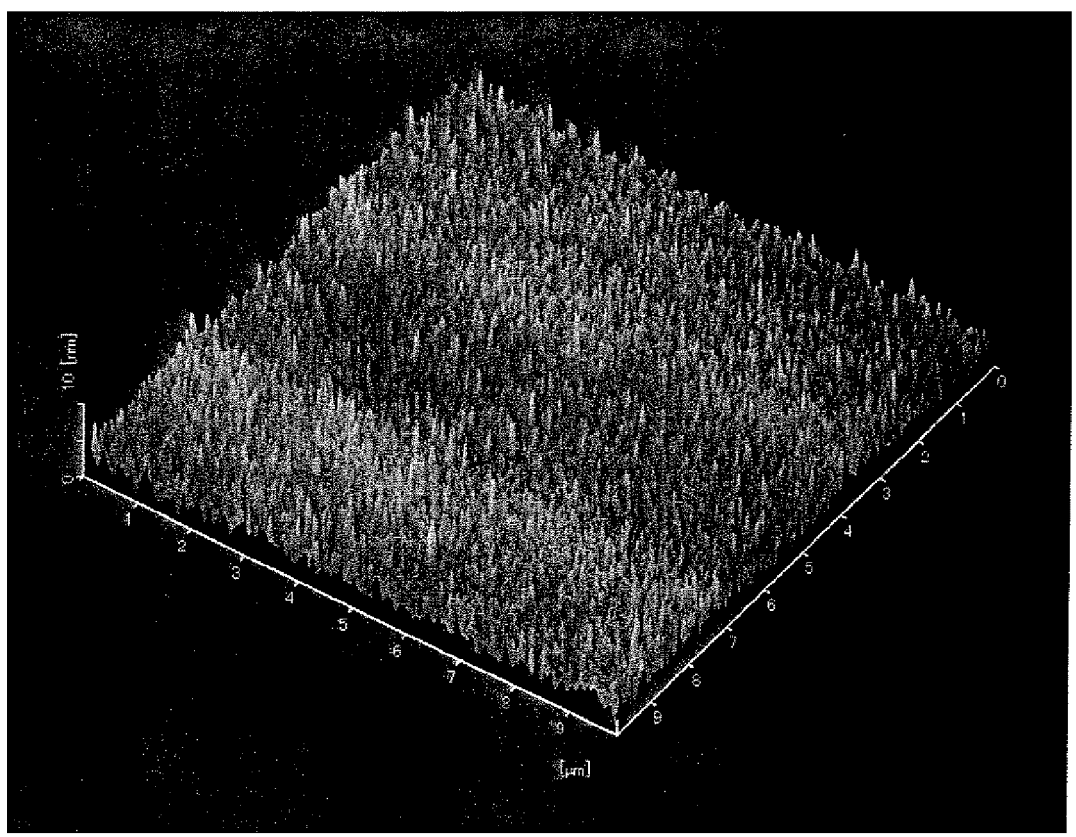
FIG. 18 is a view showing an analysis result of a crystalline semiconductor film of the present invention by an atomic force microscopy.

Further, in order to measure the surface shape of the quasi-single crystalline silicon of the present invention, the measurement was carried out using an Atomic Force Microscopy (AFM). A force generated between a solid sample surface and a probe is observed by AFM as a detection physical quantity. A result of analyzing surface roughness of the entire viewing surface was shown in Table 3. In addition, an AFM measurement image (an oblique perspective view) was shown in FIG. 17. Then, a three-dimensional display of the measurement image in FIG. 17 is shown in FIG. 18.

TABLE 3

| | |
|---|---|
| Average plane roughness (Ra) | 8.577E−01 nm |
| Peak to Valley (P-V) | 1.241E+01 nm |
| Root mean square average plane roughness (Rz) | 9.361E+00 nm (10 Points) |
| Area (S) | 1.001E+08 nm$^2$ |
| Area ration (S ratio) | 1.00069 |

A sample used for this measurement is manufactured through the following procedure. First, a silicon oxide film containing nitrogen having a thickness of 150 nm was formed as a base insulating film over a glass substrate having a thickness of 0.7 mm, and an amorphous silicon film was formed to have a thickness of 66 nm. Next, a silicon oxide film containing nitrogen having a thickness of 400 nm was formed as a cap film. Then, two laser oscillators were prepared and each laser beam was emitted with an energy of 9.5 W. After synthesizing the energy of this two laser beams by using an optical system, the amorphous silicon film was irradiated with the laser beam through the cap film. The laser beam with which the semiconductor film is irradiated has an energy of 19 W and the scanning speed at 50 cm/sec.

As a result of this measurement, the average plane roughness (Ra) was 8.577×10$^{-1}$ nm. Note that, in a case of directly irradiating a semiconductor film with a CW laser beam, an average plane roughness is 1 to 2.5 nm. According to this result, it was found that, by the present invention, there is an effect that the average plane roughness gets approximately 0.3 to 0.9 times as low as the case of directly using a CW laser. Thus, when a TFT is manufactured using a semiconductor film formed of a quasi-single crystal having an extremely flat surface as an active layer, a leak current between a gate electrode and the active layer can be suppressed low and a gate insulating film can be formed thin.

Embodiment 3

A semiconductor film of the present invention was evaluated by Raman spectroscopy. Raman spectroscopy is one of effective methods to evaluate crystallinity of a substance, and is used in order to quantify the crystallinity of a semiconductor film which is formed by laser irradiation. Generally, a piece of information on crystallinity, a crystal grain size, or stress is obtained from a peak position or a full width at half maximum of a Raman line, and a piece of information on a plane orientation is obtained from intensity or the number of a Raman line. In addition, when the plane orientation of the manufactured film or crystal grains is unclear, a plane orientation or a crystal axis direction can be specified by carrying out polarization Raman measurement from a different orientation.

Figure 11A:
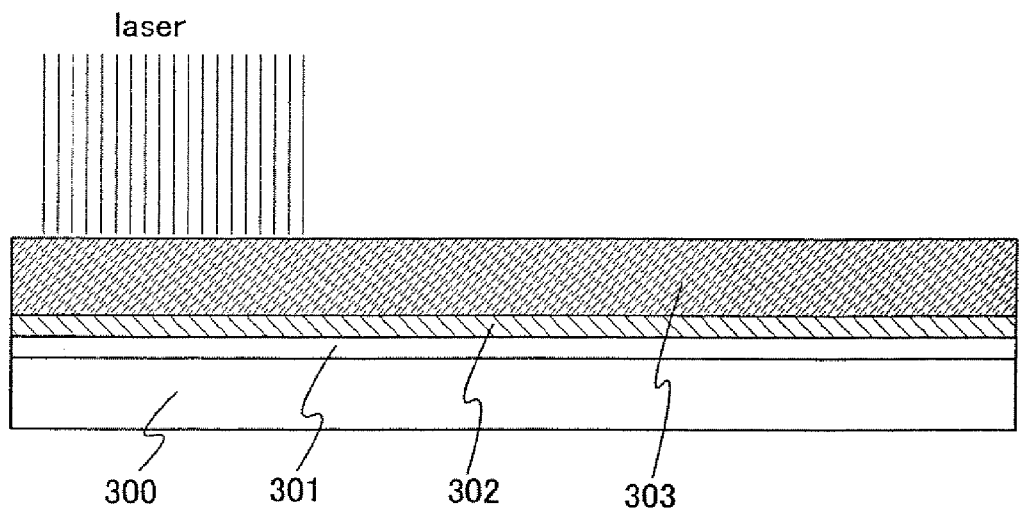
FIGS. 11A and 11B are views each explaining a measurement method by Raman spectroscopy of a crystalline semiconductor film of the present invention.

First, as shown in FIG. 11A, a glass substrate having a thickness of 0.7 mm is prepared as a substrate 300. A silicon oxide film containing nitrogen having a thickness of 150 nm was formed as a base insulating film 301 over this substrate 300. Further, an amorphous silicon film was formed to have a thickness of 66 nm as a semiconductor film 302, and a silicon oxide film containing nitrogen having a thickness of 400 or 500 nm was formed as an insulating film.

Figure 11B:
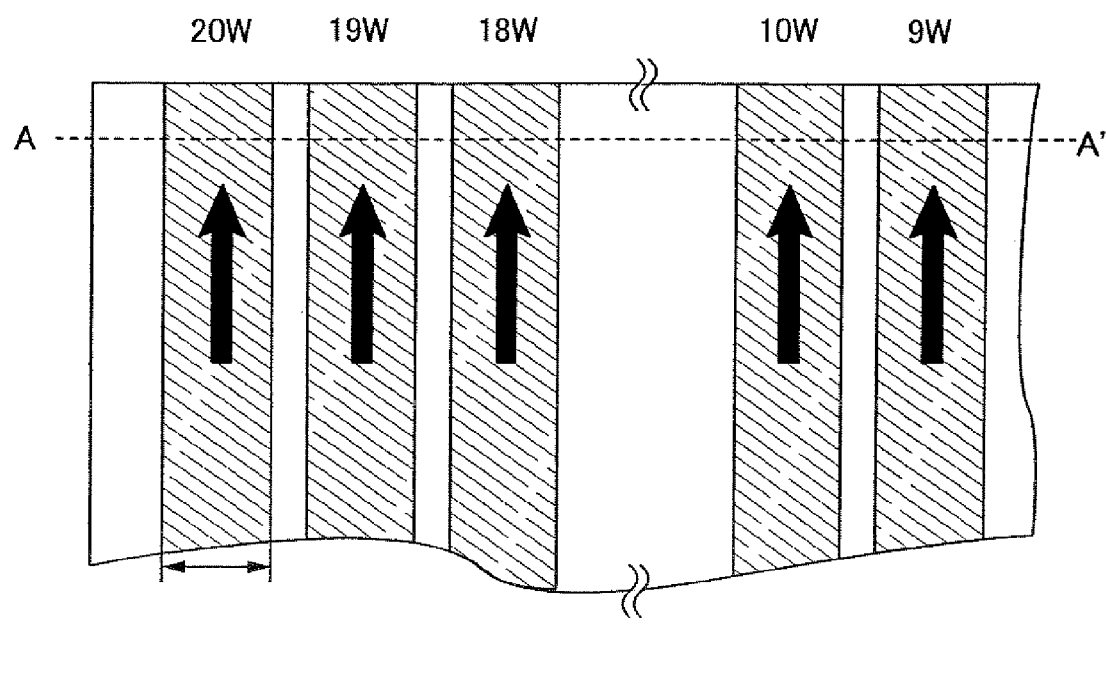

Next, as shown in FIG. 11B, energy was changed step by step to each irradiate the semiconductor film 302 covered with the insulating film 303 with a laser beam having an irradiation width of 500 μm. Note that, in this embodiment, two laser oscillators equivalent in output were prepared, each of which emits a laser beam having an energy of 10.0, 9.5, 9.0, 8.5, 8.0, 7.5, 7.0, 6.5, 6.0, 5.5, 5.0, and 4.5 W. After synthesizing these two laser beams with an optical system, the semiconductor film 302 was irradiated with the synthesized laser beam through the insulating film 303. In other words, the energy of the synthesized laser beam is twice as much as the energy before the synthesis, each of which is 20, 19, 18, 17, 16, 15, 14, 13, 12, 11, 10, and 9 W. The energy after the synthesis is described in FIG. 11B. An intensity distribution in a cross section of the synthesized laser beam is in a Gaussian distribution. This synthesized laser beam was scanned at a speed of 35, 50, 75, and 100 cm/sec to irradiate the insulating film 303 from above thereof. A width of a laser irradiation region is 500 μm.

The measurement by Raman spectroscopy was carried out by thus using the semiconductor film irradiated with the laser beam as a sample. FIGS. 14A to 14D each show the measurement result of the insulating film 303 having a thickness of 400 nm, which was used as a sample. FIGS. 15A to 15D each show the measurement result of the insulating film 303 having a thickness of 500 nm, which was used as a sample. A polarization direction of laser light that enters at the time of the measurement is a direction vertical to a scanning direction of the laser beam, irradiation of which is performed at the laser crystallization. A vertical axis indicates a standard Si wafer ratio, whereas a horizontal axis indicates a position irradiated with a laser beam (a position where Raman measurement was carried out). Here, a standard Si wafer ratio refers to a rate of Raman intensity of a single crystalline silicon film, which is 1, measured as a reference. Note that, as shown in a doted line A-A' of FIG. 11B, mapping measurement was carried out so as to cross over a laser beam irradiation region of each laser energy and a measurement pitch was to be 2 μm.

Figures 15A, 15B, 15C, 15D:
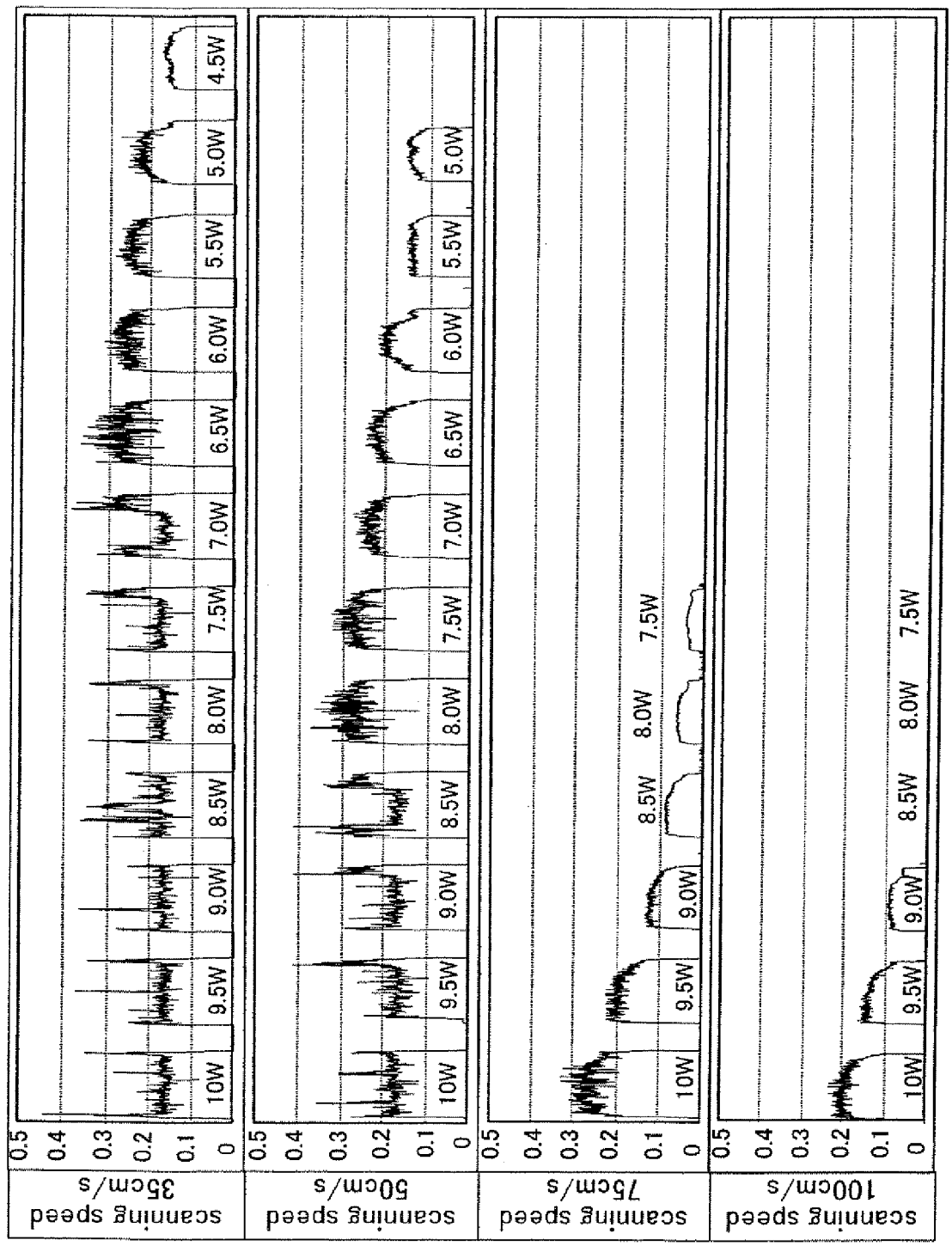
FIGS. 15A to 15D are views each showing a measurement result of a crystalline semiconductor film of the present invention by Raman spectroscopy.

FIGS. 15A to 15D each show a result that a thickness of the insulating film 303, that is, a cap film is 500 nm. FIG. 15A is a result of irradiation with a scanning speed at 35 cm/sec. Here, attention is paid to a result that energies emitted from the two laser oscillators are each 7.5 W (15 W after the synthesis). This is a result of a sample that is manufactured under the same manufacturing condition as that of the semiconductor film which is used for the EBSP measurement of Embodiment 1 and the optical microscope photographing of Embodiment 2. According to Embodiments 1 and 2, it is found that, in the semiconductor film that is manufactured under this manufacturing condition, that is, the quasi-single crystalline semiconductor film of the present invention, a crystal grain extended in a column shape is uniformly formed in the laser beam irradiation region, and the plane orientation of the crystal grain can be regarded as one direction. When this quasi-single crystalline semiconductor film is measured by Raman spectroscopy, it is found that there is a characteristic that Raman intensity is low, as compared with a single crystalline silicon film, and variation of the intensity is small, as shown in data of 7.5 W (15 W after the synthesis) in FIG. 15A.

Figures 14A, 14B, 14C, 14D:
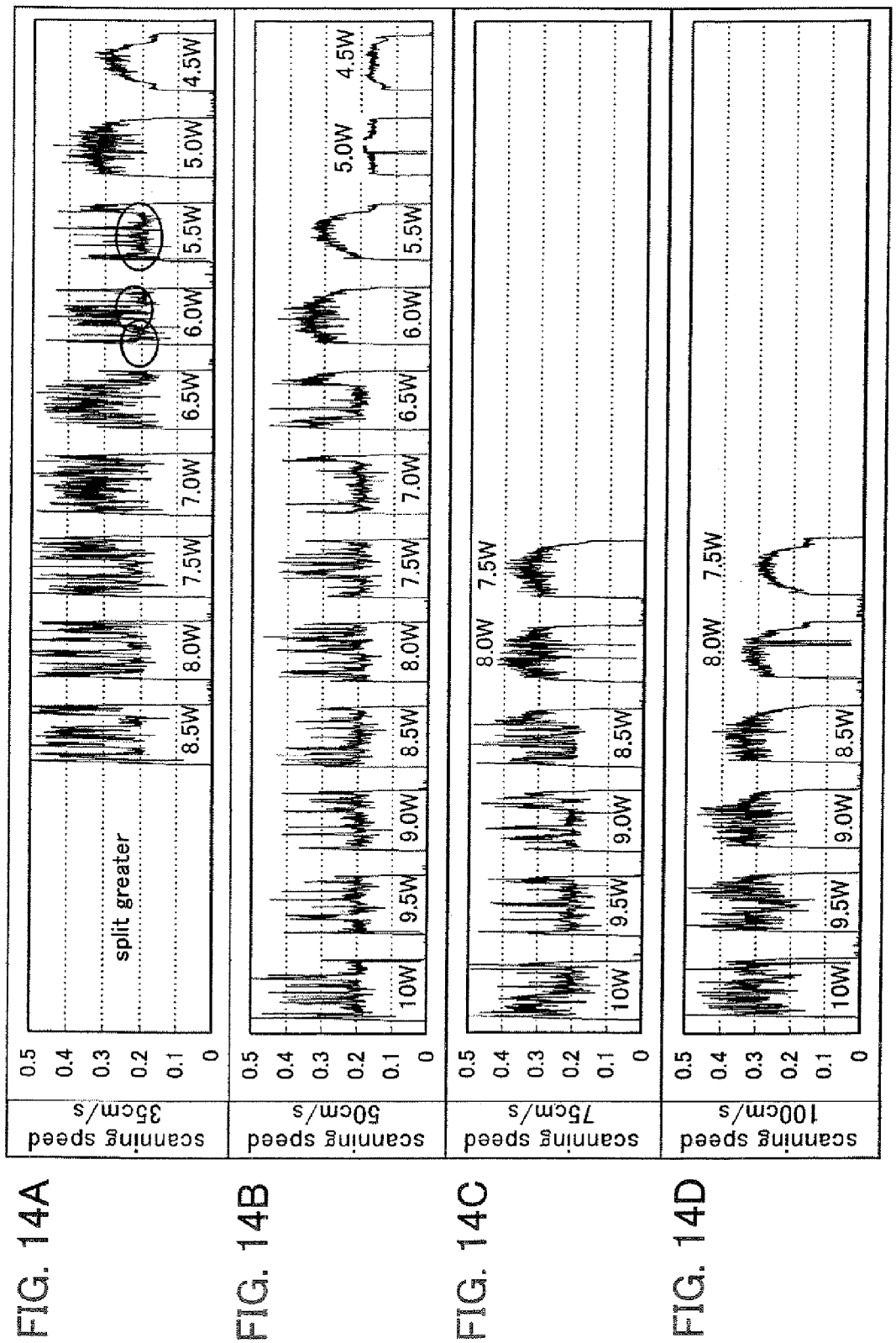
FIGS. 14A to 14D are views each showing a measurement result of a crystalline semiconductor film of the present invention by Raman spectroscopy.

In addition, FIGS. 14A to 14D each show a result that a thickness of the cap film is 400 nm. FIG. 14A is a result of irradiation with a scanning speed at 35 cm/sec. It is found that a tendency is different between a case where energies emitted from the two laser oscillators are each 7.0 W (14 W after the synthesis) and a case where energies emitted from the two laser oscillators are each less than or equal to 6.5 W (13 W after the synthesis). When an energy of each laser beam is less than or equal to 6.5 W (13 W after the synthesis), it is found that Raman intensity is low, as compared with a single crystalline silicon film, and variation of the intensity is partially small, and a quasi-single crystal is formed in the same manner as the case of FIG. 15A. In particular, it is found that a quasi-single crystal is formed in a case of laser beam irradiation where an energy of each laser beam is 5.5 W (11 W after the synthesis) and 6.0 W (12 W after the synthesis). Portions surrounded with circles are particularly prominent. It is found that the quasi-single crystalline semiconductor film of the present invention is formed in this portion. On the other hand, in a case where an energy of each laser beam is greater than or equal to 7.0 W (14 W after the synthesis), the tendency is changed. In this case, a part having low Raman intensity and small variation of the intensity thereof, and a part having high Raman intensity and large variation of the intensity thereof are observed in part of the semiconductor film. It is inferred that a quasi-single crystal and a large grain crystal are mixed to form this region.

Figure 12A:
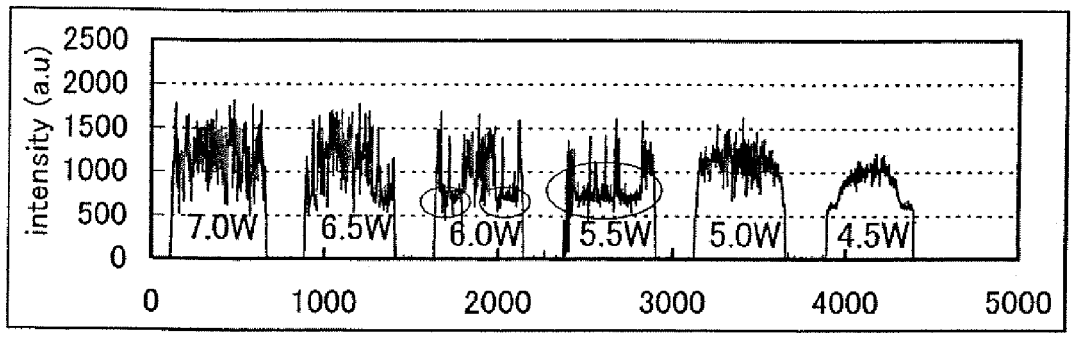
FIGS. 12A to 12 C are views each showing a measurement result of a crystalline semiconductor film of the present invention by Raman spectroscopy.
Figure 12B:
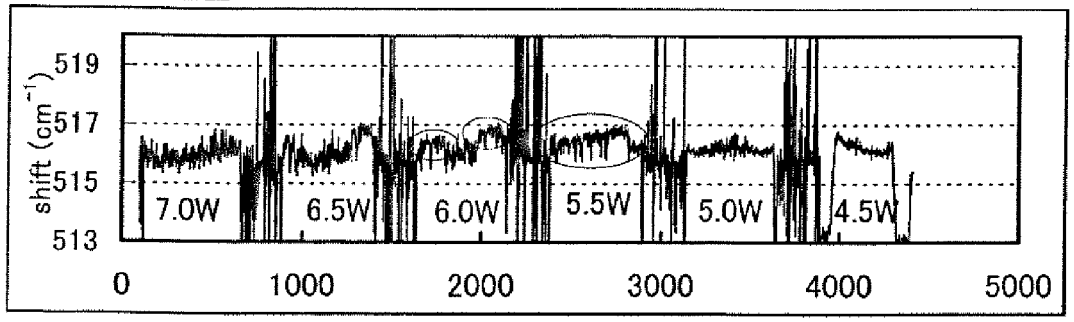
Figure 12C:
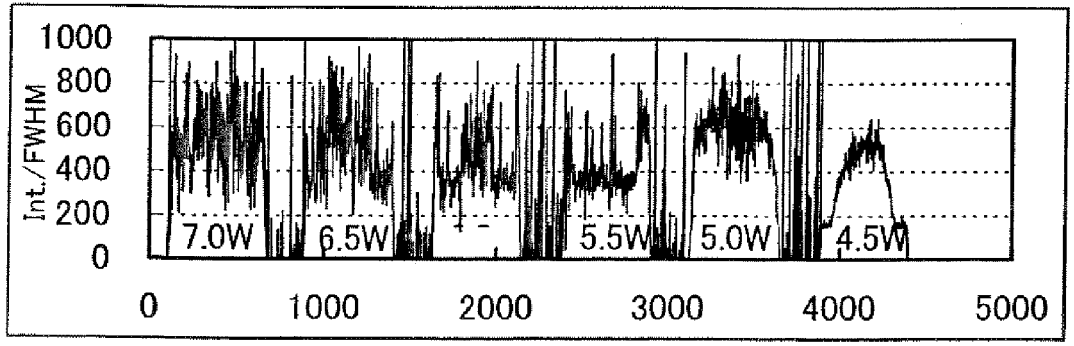

FIG. 12A is an enlarged view of the result in FIG. 14A. Note that Raman intensity is a measurement value. FIG. 12B shows a Raman shift, and FIG. 12C shows a result that intensity of Raman scattered light is divided by a full width at half maximum (FWHM). In either figure, energies emitted from the two laser oscillators are each measured by 0.5 W within the range of 4.5 to 7.0 W, that is, the energy of the laser beam, with which the semiconductor film is irradiated after the synthesis, is measured by 1 W within the range of 9 W to 14 W.

Here, in FIG. 12A, attention is paid to portions surrounded with circles at 11 and 12 W, where Raman intensity is low and variation of the intensity is small. According to the result of FIG. 12A, it is found that a quasi-single crystal is formed when laser beam irradiation is performed at 11 and 12 W. The Raman intensity of the portion, where the quasi-single crystal is formed, has coefficient variation of less than or equal to 20%, which is extremely small variation as compared with a large grain crystal having coefficient variation of greater than or equal to 30%. Note that, here, coefficient variation (CV) refers to a percentage with respect to an average value $A_{VE}$ of a standard deviation $\sigma$ ($CV=(\sigma/A_{ve})\times100$), which shows the degree of variation in a Raman peak. According to FIG. 12B, the Raman peak of the quasi-single crystal is greater than or equal to 516 $cm^{-1}$ and less than or equal to 517 $cm^{-1}$, which is a value smaller than the Raman shift value of a single crystalline silicon film of 521 $cm^{-1}$. Moreover, according to FIG. 12C, it is found that a value of a ratio of the Raman intensity with respect to a full width at half maximum (Int./FWHM) is also small in the quasi-single crystal, and a tendency of variation is small.

Next, as for FIGS. 14A to 14D and FIGS. 15A to 15D, a relation between a scanning speed of the laser beam, with which the semiconductor film is irradiated, and the crystallization of the semiconductor film was considered. A region having low Raman intensity and small variation in Raman intensity in the region where a crystal grain extended in a column shape is uniformly formed in the laser beam irradiation region can be said as a region where the quasi-single crystal was formed. In the case of FIGS. 14A to 14D, the quasi-single crystal was formed. When a scanning speed is 35, 50, and 75 cm/sec, an energy of each laser beam is in the range of greater than or equal to 5.5 W and less than or equal to 8.5 W (greater than or equal to 11 W and less than or equal to 17 W after the synthesis), greater than or equal to 6.5 W and less than or equal to 10 W (greater than or equal to 13 W and less than or equal to 20 W after the synthesis), and greater than or equal to 9 W and less than or equal to 10 W (greater than or equal to 18 W and less than or equal to 20 W after the synthesis), respectively. Moreover, a quasi-single crystal was not formed when a scanning speed was greater than or equal to 100 cm/sec. In other words, it is found that, the lower a scanning speed is, the more quasi-single crystals are formed with low energy. As shown in FIGS. 15A to 15D, this tendency is the same even when a thickness of a cap film is changed.

Further, attention is paid to each scanning speed. For example, FIG. 14A is given. It is found that, the lower energy of a laser beam is emitted, the smaller variation Raman intensity has. Small variation of Raman intensity indicates that plane orientation is aligned. Therefore, in order to form a quasi-single crystalline semiconductor film, the plane orientation of which is aligned, it is preferable to adjust laser energy so as to provide minimum energy capable of melting a semiconductor film.

Then, as for FIGS. 14A to 14D and FIGS. 15A to 15D, a relation between a thickness of the cap film and the crystallization of the semiconductor film was considered. For example, in FIGS. 14A to 14D and FIGS. 15A to 15D, a scanning speed is the same and only a thickness of the cap film is different to each other. Here, in the case where a thickness of the cap film is 400 nm in FIG. 14A, a quasi-single crystal is formed with greater than or equal to 5.5 W and less than or equal to 8.8 W (greater than or equal to 11 W and less than or equal to 17 W after the synthesis). On the other hand, in the case where a thickness of the cap film is 500 nm in FIG. 15A, a quasi-single crystal is formed with greater than or equal to 7 W and less than or equal to 10 W (greater than or equal to 14 W and less than or equal to 20 W after the synthesis). According to this experiment result, it is concluded that, in the case of the same scanning speed, a quasi-single crystal is formed with lower energy by using the cap film having a thickness of 400 nm than by using the cap film having a thickness of 500 nm. Note that the same conclusion can also be obtained for other scanning speeds.

Through the above results, the energy of the laser beam, a film thickness and a scanning speed of the cap film are factors that each have an effect on forming a quasi-single crystal. Thus, it is preferable to appropriately adjust the energy of the laser beam, a film thickness of the cap film, and a scanning speed of the laser beam, if necessary.

Embodiment 4

A quasi-single crystalline silicon film of the present invention, a single crystalline silicon film, and a silicon film where a large grain crystal is formed are measured by Raman spectroscopy, and dissimilarity was each examined.

The quasi-single crystalline silicon film of the present invention was manufactured through the following procedure. First, a silicon oxide film containing nitrogen having a thickness of 150 nm was formed as a base insulating film on one surface of a glass substrate having a thickness of 0.7 mm. Further, an amorphous silicon film having a thickness of 66 nm was formed over this base insulating film by a plasma CVD method. After forming a silicon oxide film containing nitrogen to have a thickness of 500 nm as a cap film to the sample thus formed, laser irradiation was performed. The energy of the laser beam, with which the sample was irradiated, is 20 W, and a scanning speed of the laser beam is 35 cm/sec. Raman spectrum of the sample thus manufactured was measured. In measuring, a polarization direction of the laser light to be entered is in a vertical direction (to be 0°) to a scanning direction of the laser crystallization.

As for the single crystalline silicon film, an SIMOX substrate was used. In addition, the silicon film where a large grain crystal is formed is manufactured through the following procedure. A silicon oxide film containing nitrogen having a thickness of 150 nm was formed as a base insulating film on one surface of a glass substrate having a thickness of 0.7 mm, and further an amorphous silicon film having a thickness of 66 nm was formed by a plasma CVD method. Thereafter, without forming a cap film, the sample was irradiated with a laser beam having energy of 20 W with a scanning speed at 50 cm/sec. As for this sample, Raman spectrum was measured in the same manner.

Figure 41:
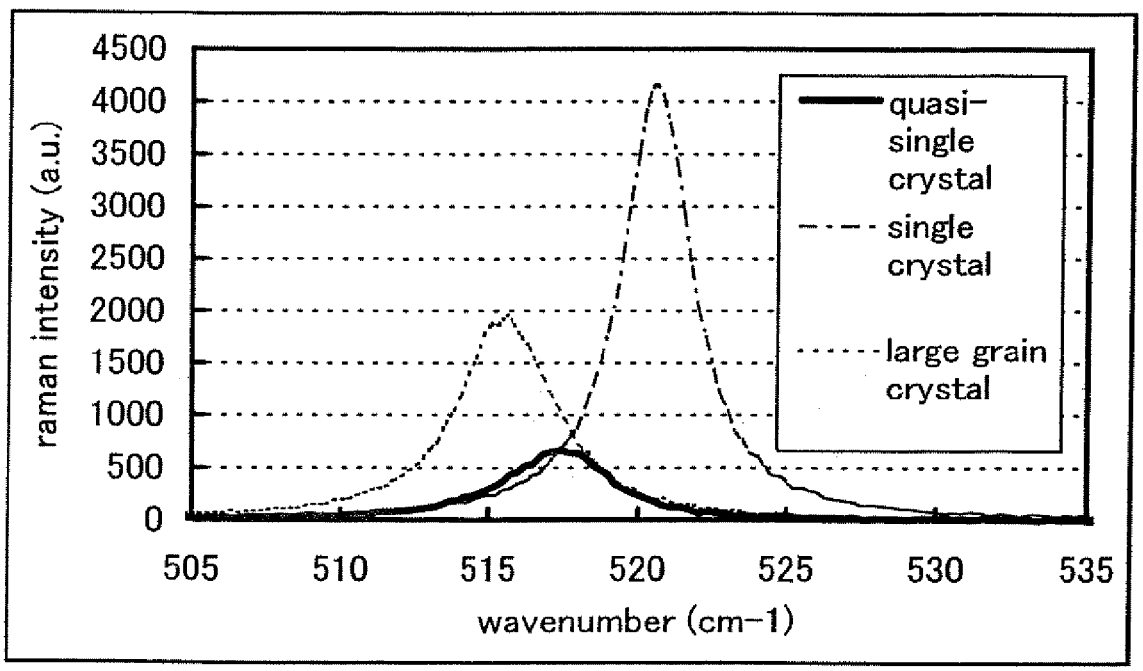
FIG. 41 is a graph showing a measurement result of a quasi-single crystalline silicon film, a single-crystalline silicon film, and a silicon film, where a large grain crystal is formed, by Raman spectroscopy.

A result thereof is as shown in FIG. 41. A horizontal axis indicates a wavenumber ($cm^{-1}$), whereas a vertical axis indicates intensity of scattered light (hereinafter, referred to as Raman intensity). According to this graph, it is found that the quasi-single crystalline silicon film of the present invention has peak of Raman intensity at 517 to 518 $cm^{-1}$, the single crystalline silicon film has peak of Raman intensity at 520 to 521 $cm^{-1}$, and the silicon film where a large grain crystal is formed has peak of Raman intensity at 515 to 516 $cm^{-1}$. As the position of the Raman intensity peak gets closer to a value of the single crystalline silicon film, a characteristic thereof gets closer to the single crystalline silicon film. Thus, it can be said that a characteristic of the quasi-single crystalline silicon film of the present invention is closer to the single crystalline silicon film, as compared with the silicon film where a large grain crystal is formed.

In addition, when the three films are compared with each other in the value of the Raman intensity, the intensity of the quasi-single crystalline silicon film of the present invention is lower than that of the single crystalline silicon film or the silicon film where a large grain crystal is formed. Accordingly, it was found that the quasi-single crystalline silicon film of the present invention is different from the single crystalline silicon film or the silicon film where a large grain crystal is formed also in terms of Raman intensity.

Embodiment 5

A semiconductor film of the present invention was measured by Raman spectroscopy, and a polarization property of the spectrum was examined.

A sample was manufactured through the following procedure. A silicon nitride oxide film having a thickness of 50 nm was formed as a base insulating film over a glass substrate having a thickness of 0.7 mm, and further a silicon oxide film containing nitrogen having a thickness of 100 nm was formed. An amorphous silicon film having a thickness of 66 nm was formed as a semiconductor film over the base insulting film by a plasma CVD method. Further, a silicon oxide film containing nitrogen having a thickness of 300 nm was formed as a cap film. After forming the cap film, two solid-laser oscillators in continuous oscillation each having output of 6 W were prepared, and laser beams were emitted from these laser oscillators and synthesized using an optical system. The energy of the laser beam after the synthesis is 12 W. The semiconductor film was irradiated with a laser beam which was formed into a linear beam having a width of 500 μm after synthesizing the laser beam. Note that a scanning speed at the time of irradiating the semiconductor film with the laser beam is 50 cm/sec.

Polarized laser light was made to enter the thus formed quasi-single crystalline silicon film, which is a first sample, and angular dependency of the Raman peak was measured. As for the polarization direction, a direction vertical to an irradiation direction of the laser beam is regarded as 0° as shown in FIG. 13E, and polarized lights of 0, 45, 90, and 135° were each made to enter the quasi-single crystalline silicon film.

FIGS. 13A to 13D each show Raman intensity having a polarization direction of 0, 45, 90, or 135°.

According to FIGS. 13A to 13D, there is a region where Raman intensity is low and variation of the Raman intensity is small in a region of 100 to 420 μm where the center vicinity of the laser beam is irradiated (a portion surrounded with a circle). The tendency of the Raman intensity in this portion is in accordance with characteristics of the quasi-single crystal that is explained in Embodiment 3. Thus, it is inferred that a quasi-single crystal is formed in this portion.

According to FIGS. 13A to 13D, it is found that the tendency in the case where the polarization direction is 0 and 90° is different from that in the case where the polarization direction is 45 and 135°. In the case of 0 and 90°, the value of the Raman intensity is almost the same and, also in the case of 45 and 135°, the value of the Raman intensity is almost the same. However, in the case of 0 and 90°, the value of the Raman intensity is lower than that in the case of 45 and 135°. Thus, it is found that the Raman intensity of the quasi-single crystal of the present invention has a periodic structure of 90°. In addition, it is found that the strength of the Raman intensity in a region where a quasi-single crystal is formed is largely changed depending on a polarization direction; however, the Raman intensity has small variation. Such a periodic structure can be observed in a single crystalline film; however, a random large grain crystal is not observed between crystals where plane orientations are neighbored. Thus, it can be considered that having the periodic structure refers to a quasi-single crystal, the orientation of which is aligned uniformly, is in a crystal state infinitely close to a single crystal. Moreover, although not shown, a similar periodic structure of 90° can be observed also in the Raman shift of a quasi-single crystal.

Embodiment 6

In this embodiment, a semiconductor film was irradiated with a laser beam through a cap film under various conditions to perform crystallization of the semiconductor film, and an optimum condition for forming a semiconductor film of the present invention was sought.

In this embodiment, a silicon oxide film containing nitrogen having a thickness of 150 nm was formed as a base insulating film on one surface of a glass substrate having a thickness of 0.7 mm. Further, an amorphous silicon film having a thickness of 66 nm was formed over this base insulating film by a plasma CVD method. After forming a silicon oxide film containing nitrogen as a cap film to the sample thus formed, CW laser irradiation was performed. As a specific irradiation method, two CW laser oscillators were prepared, and each laser beam was simultaneously emitted with the same output and synthesized using an optical system. Thereafter, the semiconductor film was irradiated through the cap film. The condition that is changed in this embodiment is as follows: (1) a thickness of the cap film; (2) the energy of the laser beam, with which the semiconductor film is irradiated; (3) a scanning speed of the laser beam. The thickness of the cap film has 2 types of 400 and 500 nm. In addition, the energy emitted from the laser oscillators has 12 types each by 0.5 W within the range of 4.5 to 10 W (by 1 W within the range of 9 to 20 W after the synthesis). Moreover, a scanning speed of the laser beam has 2 types of 35 and 50 cm/sec. After performing laser beam irradiation with these conditions changed, the surface state was observed with an optical microscope. Note that, as in other embodiments, in this embodiment, the laser beams emitted from the two laser oscillators are synthesized using an optical system and formed into a linear shape of 500 μm to irradiate the semiconductor film.

In this embodiment, the observation using an optical microscope was performed by a dark field reflection microscope method. By this method, light shed on a sample is made not to directly enter an objective lens of an optical microscope, and at that time, reflective light, scattered light, or the like from the sample is observed. With this observation method, the background of view is seen black and, with a depression and projection, the background is seen bright. By using this observation method, not only a transparent sample can be observed but also particles of approximately 8 nm, which is smaller than a resolution limit of an optical microscope, or a depression and projection can be recognized. Therefore, the observation method is extremely effective for examining a fine scratch or defect on the semiconductor surface, which has been a standard observation method in an industrial field. In this embodiment, a depression and projection on the surface was observed with a magnification of 100 times.

Figure 42:
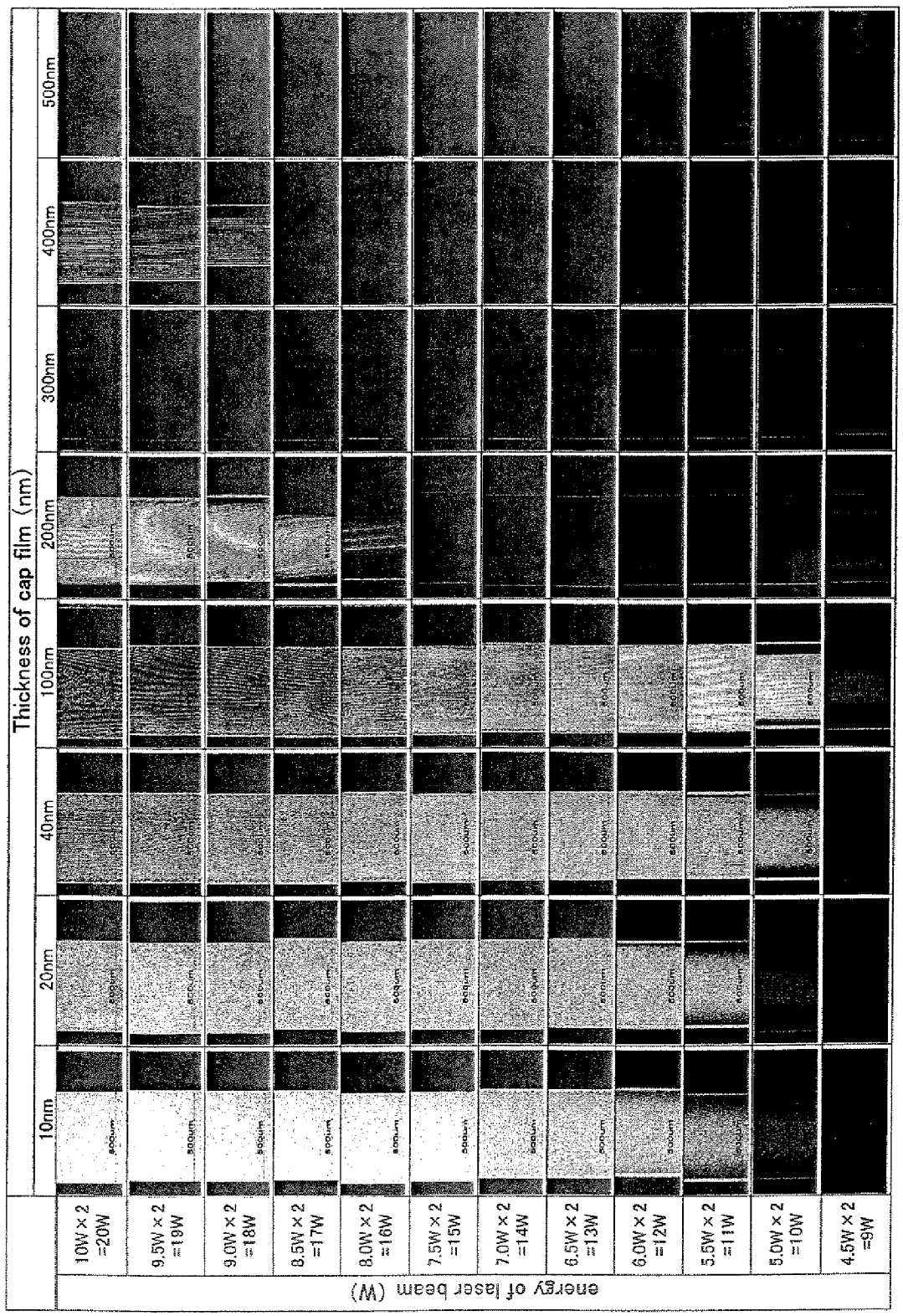
FIG. 42 is an image of a semiconductor film, which is crystallized by changing a film thickness of a cap film and laser energy with a scanning speed of the laser beam fixed, obtained by an optical microscope.

FIG. 42 shows images of an optical microscope in a case of fixing a scanning speed of a laser beam to 35 cm/sec which is aligned so that a correlation between a thickness of the cap film and the energy of the laser beam becomes apparent. In the same manner, FIG. 43 shows images of an optical microscope in a case of fixing a scanning speed of a laser beam to 50 cm/sec which is aligned so that a correlation between a thickness of the cap film and the energy of the laser beam becomes apparent.

The state of the depression and projection on the surface of the semiconductor film is different depending on a crystallization condition or a crystallization state. Since a depression and projection is formed in a region of the semiconductor film where a microcrystal is formed or a film is peeled, reflective light or scattered light is observed from a sample. On the contrary, there is few depression and projection in a portion of the semiconductor film surface where a quasi-single crystal, a large grain crystal grain, or a microcrystal is formed; therefore, view becomes black.

Figure 43:
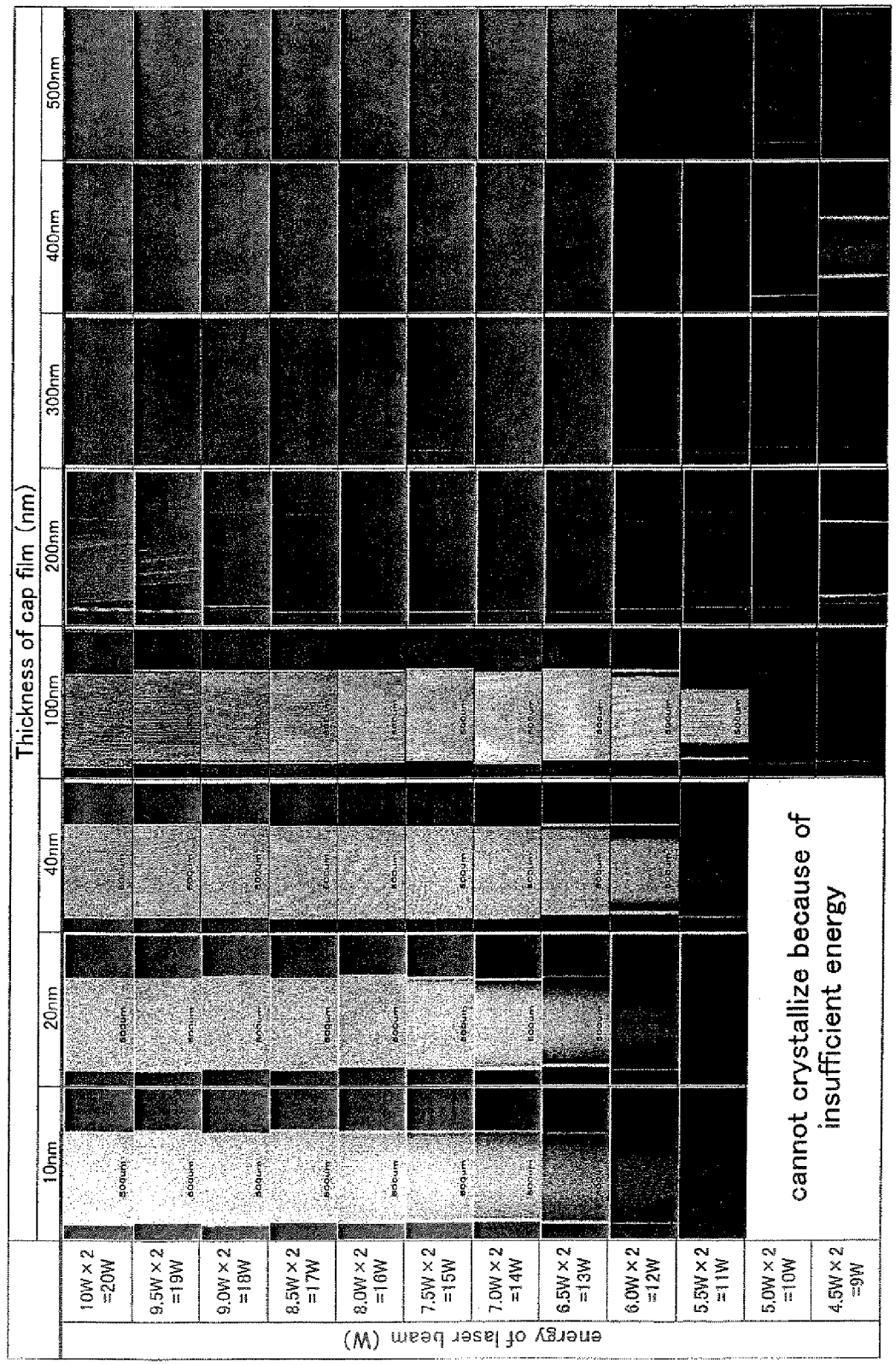
FIG. 43 is an image of a semiconductor film, which is crystallized by changing a film thickness of a cap film and laser energy with a scanning speed of the laser beam fixed, viewed by an optical microscope.

FIGS. 44A and 44B are graphs each put together the image of the optical microscope shown in FIG. 42 and FIG. 43 by confirming what is formed in each image. A plotted mark is common in both FIGS. 44A and 44B. An asterisk mark denotes a region where crystallization cannot be performed; a cross mark, a region where a microcrystal is formed; a rectangular colored with black, a region where a microcrystal and a quasi-single crystal of the present invention are mixed. A plus mark denotes a region where a microcrystal, a large grain crystal, and the quasi-single crystal of the present invention are mixed. A circle colored with black denotes a region where the quasi-single crystal of the present invention is formed. A rhombus colored with black denotes a region where a large grain crystal and the quasi-single crystal of the present invention are mixed; and an outline rhombus, a region where a large grain crystal is formed. Moreover, an outline rectangular denotes a region where a film is split (a semiconductor film is peeled or evaporated) because too much energy is provided to the semiconductor film.

FIG. 44A shows a result in the case of fixing a scanning speed of the laser beam to 35 cm/sec. According to this result, it is found that a quasi-single crystalline silicon film of the present invention is formed with a cap film having a thickness of greater than or equal to 200 nm and less than or equal to 500 nm. Specifically, when the thickness of the cap film is 200 nm, the quasi-single crystalline silicon film of the present invention was formed with a power of each laser beam within the range of greater than or equal to 6.0 W and less than or equal to 7.5 W (greater than or equal to 12 W and less than or equal to 15 W after the synthesis). In the same manner, when the film thickness of the cap film is 300, 400, or 500 nm, the quasi-single crystalline silicon film of the present invention was formed with a power of each laser beam within the range of greater than or equal to 5.0 W and less than or equal to 6.0 W (greater than or equal to 10 W and less than or equal to 12 W after the synthesis), greater than or equal to 5.5 W and less than or equal to 8.5 W (greater than or equal to 11 W and less than or equal to 17 W after the synthesis), or greater than or equal to 7.0 W and less than or equal to 10 W (greater than or equal to 14 W and less than or equal to 20 W after the synthesis), respectively.

When the thickness of the cap film ranges from 200 to 300 nm, the minimum value of the energy, with which the quasi-single crystalline silicon film is formed, is decreased even when the cap film is thickened. When the thickness of the cap film gets greater than or equal to 300 nm, there is a tendency that the minimum value of the energy, with which the quasi-single crystalline silicon film is formed, is increased as the cap film is thickened.

In addition, FIG. 44B shows a result in the case of fixing a scanning speed of the laser beam to 50 cm/sec. According to this result, it is found that the quasi-single crystalline silicon film of the present invention is formed with a cap film having a thickness of greater than or equal to 200 nm and less than or equal to 500 nm. Specifically, when the thickness of the cap film is 200 nm, the quasi-single crystalline silicon film of the present invention was formed with a power of each laser beam within the range of greater than or equal to 8.0 W and less than or equal to 9.0 W (greater than or equal to 16 W and less than or equal to 18 W after the synthesis). In the same manner, when the film thickness of the cap film is 300, 400, or 500 nm, the quasi-single crystalline silicon film of the present invention was formed with a power of each laser beam within the range of greater than or equal to 6.5 W and less than or equal to 7.5 W, (greater than or equal to 13 W and less than or equal to 15 W after the synthesis), greater than or equal to 6.5 W and less than or equal to 10 W (greater than or equal to 13 W and less than or equal to 20 W after the synthesis), or greater than or equal to 8.5 W and less than or equal to 10 W (greater than or equal to 17 W and less than or equal to 20 W after the synthesis), respectively.

As with FIG. 44A, when the thickness of the cap film ranges from 200 to 300 nm, the minimum value of the energy, with which the quasi-single crystalline silicon film is formed, is decreased even when the cap film is thickened. When the thickness of the cap film gets greater than or equal to 300 nm, there is a tendency that the minimum value of the energy, with which the quasi-single crystalline silicon film is formed, is increased as the cap film is thickened.

Moreover, in FIGS. 44A and 44B, a region where the quasi-single crystalline silicon film is formed is compared. It is found that, as a scanning speed of the laser beam is increased, the minimum value of the energy, with which the quasi-single crystalline silicon film is formed, is increased, but a distribution tendency of the region where the quasi-single crystalline silicon film is formed is held without any change regardless of a scanning speed of the laser beam.

Note that it is considered that the condition of FIGS. 13A to 13 E for forming a quasi-single crystalline semiconductor film does not conform to the result of FIG. 44B because the laser, with which the semiconductor film is irradiated, is different.

Embodiment 7

This embodiment will describe a manufacturing method of a TFT as an example of a semiconductor device of the present invention, where a quasi-single crystal is used as an active layer. Further, a semiconductor device using this TFT will be explained. Note that this embodiment is an example of etching after performing laser crystallization to a cap film formed over a semiconductor film.

Figure 19A:
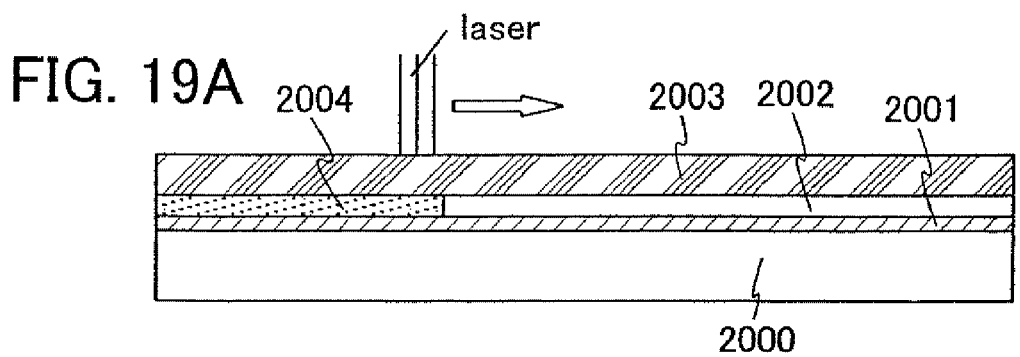
FIGS. 19A to 19E are views each explaining an example of a manufacturing method of a semiconductor device using the present invention.

As shown in FIG. 19A, a base insulating film 2001 is formed over a substrate 2000 having an insulating surface. In this embodiment, the substrate 2000 is a glass substrate. As the substrate used here, a glass substrate made of barium borosilicate glass, alumino borosilicate glass, or the like; a quartz substrate; a ceramic substrate; a stainless steel substrate; or the like can be used. Although a substrate made of a synthetic resin typified by acrylic or plastic which is represented by PET, PES, or PEN tends to have lower heat resistance than another substrate in general, the substrate can be used as long as the substrate can resist the process of this process.

The base insulating film 2001 is provided in order to prevent the diffusion of alkaline earth metal or alkali metal such as Na from the substrate 2000 into the semiconductor, Alkaline earth metal and alkali metal cause adverse effects on the characteristics of a semiconductor element when such metal is in the semiconductor film. For this reason, the base insulating film 2001 is formed by using an insulating film which can prevent the diffusion of alkaline earth metal and alkali metal into the semiconductor, such as a silicon oxide film, a silicon nitride film, or a silicon nitride film containing oxygen. The base insulating film 2001 is formed either in a single-layer or stacked-layer structure. In this embodiment, a silicon nitride film containing oxygen is formed to have a thickness of 10 to 400 nm by a plasma CVD (Chemical Vapor Deposition) method.

Note that it is effective to provide the base insulating film 2001 in order to prevent the diffusion of the impurity when the substrate 2000 contains even a little amount of alkaline earth metal or alkali metal, such as a glass substrate or a plastic substrate. However, when a substrate in which the diffusion of the impurity does not lead to a significant problem, for example a quartz substrate, is used, the base insulating film 2001 is not necessarily provided.

Next, an amorphous semiconductor film 2002 is formed over the base insulating film 2001. The amorphous semiconductor film 2002 is formed to have a thickness of 25 to 200 nm (preferably, a thickness of 30 to 80 nm) by a known method (a sputtering method, an LPCVD method, a plasma CVD method, or the like). In this embodiment, the amorphous semiconductor film 2002 is formed to have a thickness of 66 nm. The amorphous semiconductor film which is used here can be formed with silicon, silicon germanium, SiC, or the like. In this embodiment, silicon is used. In a case of using silicon germanium, the concentration of germanium is preferably approximately 0.01 to 4.5 atomic % In addition, an example of using an amorphous silicon film for a semiconductor film is shown in this embodiment and other embodiments; however, a polycrystalline silicon film may also be used. For example, after forming an amorphous silicon film, a polycrystalline silicon film can be formed by adding a minute amount of an element such as nickel, palladium, germanium, iron, tin, lead, cobalt, silver, platinum, copper, or gold to the amorphous silicon film, and then performing heat treatment at 550° C. for 4 hours. Further, a compound of silicon and carbon may also be used as the semiconductor film.

It is considered that the above element added to the amorphous silicon film serves as a catalyst element that promotes crystal growth. The following specific method for adding the catalyst element to the amorphous silicon film can be used: (1) a method for performing silicidation to the surface of the amorphous silicon film by heating after forming a thin film of the catalyst element of approximately several nm on the surface of the amorphous silicon film by a sputtering method or an evaporation method; (2) a method for performing silicidation to the surface of the amorphous silicon film by having the catalyst element in contact with the surface of the amorphous silicon film, and reacting the catalyst element and the amorphous silicon film by heating, after coating the amorphous silicon film with a solution containing the catalyst element alone or in a compound; or the like.

In a case of using the method of (2), as a solvent containing the catalyst element alone or in a compound, a polar solvent such as water, alcohol, acid, or ammonia can be used. When a polar solvent is used, the catalyst element is added as a compound. For example, in a case of nickel, a compound such as nickel bromide which is a compound of nickel with acid or a base, or nickel acetate is dissolved in the solvent to coat the amorphous silicon film. In addition, in a case of using a non-polar solvent such as benzene, toluene, xylene, carbon tetrachloride, chloroform, or ether, a compound such as nickel acetylacetonate which is a compound of nickel and an organic material is dissolved in the solvent to coat the amorphous silicon film. Further, emulsion where nickel is uniformly dispersed alone or in a compound in a dispersant, or a paste may also be used.

Thereafter, by performing heat treatment, crystal is grown from a region that is subjected to silicidation to a region that is not subjected to silicidation. For example, in a case of adding the catalyst element on the entire surface of the amorphous silicon film, crystal growth proceeds from the surface of the amorphous silicon film to the substrate. In addition, in a case of adding the catalyst element to only part of the amorphous silicon film, crystal growth proceeds from a region where the catalyst element is added to a region where the catalyst element is not added in a direction parallel to the substrate. Note that the former case is referred to as vertical growth, whereas the latter case is referred to as lateral growth.

Subsequently, a silicon oxide film having a thickness of 500 nm is formed over the amorphous semiconductor film 2002 as a cap film 2003. The material of the cap film 2003 is not limited to a silicon oxide film, and a material, of which value of a thermal expansion coefficient or extensibility is close to that of the amorphous semiconductor film 2002, is preferably used. In addition, the cap film 2003 may be formed in a single layer or a plurality of layers.

Next, as shown in FIG. 19A, the amorphous semiconductor film 2002 is irradiated with a laser beam using a laser irradiation apparatus to obtain a quasi-single crystal, thereby forming a quasi-single crystalline semiconductor film 2004. The energy and the scanning speed of the laser beam, with which the amorphous semiconductor film is irradiated, are to be 17 W and 35 cm/sec, respectively.

FIG. 20 shows the laser irradiation apparatus that is used in this embodiment. A Nd:YAG crystal having a structure of aggregation of polycrystals (hereinafter, referred to as ceramic Nd:YAG) is used for the laser crystallization, and a pulse laser beam having a repetition rate of greater than or equal to 10 MHz is emitted. Note that, since a wavelength of a fundamental wave of this laser beam is 1064 nm, a nonlinear optical element is used to convert to a second harmonic (a wavelength of 532 nm).

In the case of this embodiment, ceramic YAG is used for the laser crystallization. Without limitation to YAG, laser crystallization by ceramic has almost the same optical characteristics (thermal conductivity, breaking strength, and an absorption cross section) as a single crystal. In addition, because of ceramic, it is possible to form a free shape in a short time and with a low cost, and to extremely enlarge a crystal. Further, it is possible to add a dopant such as Nd or Yb with a concentration higher than that of a single crystal. By using such a laser crystal as a medium, it is possible to emit a laser beam having extremely high output. Therefore, by forming this beam using an optical element, it is possible to obtain a linear beam having a minor axis, the length of which is less than or equal to 1 mm, and a major axis, the length of which is 100 mm to several m.

In addition, without limitation to the ceramic Nd:YAG laser, it is possible to use a laser using, as a medium, a crystal in which a dopant such as Nd, Yb, Cr, Ti, Ho, Er, Tm, or Ta is added to YAG, $Y_2O_3$, or $YVO_4$ of a polycrystal (having a ceramic material).

Moreover, in this embodiment; not only the laser using ceramic, but also a laser using, as a medium, a crystal in which the above dopant is added to YAG, $YVO_4$, forsterite, $YAlO_3$, or $GdVO_4$ of a single crystal; an Ar ion laser; a Kr ion laser; a Ti:sapphire laser; or the like can be used. These lasers can oscillate in continuous oscillations, and pulse oscillation can be performed in a repetition rate of greater than or equal to 10 MHz by performing mode locking. Besides, it is also possible to use a $CO_2$ laser, a helium-cadmium laser, or the like.

Specifically, the quasi crystal of the semiconductor film is obtained in the following manner. A laser beam emitted from a laser oscillator 2101 passes through a wavelength plate 2102 and a polarization beam splitter 2103. The wavelength plate 2102 and the polarization beam splitter 2103 can be adjusted so that light that has passed through the wavelength plate 2102 and the polarization beam splitter 2103 has appropriate energy.

Thereafter, when the energy of the laser beam is homogenized by a beam homogenizer 2104 such as a cylindrical lens array, fly eye lens, an optical waveguide, or a diffractive optical element, a quasi-single crystal is formed also in the end of the irradiation region of the laser beam, which is much preferable. In this embodiment, a diffractive optical element is used as the beam homogenizer 2104. By using the diffractive optical element, the shape of the cross section of the laser beam can be formed into a desired shape such as a linear, square, or elliptical shape, as well as the energy of the laser beam can be homogenized.

Then, this laser beam passes through a slit 2105. In the slit 2105, the both end portions of the major axis of the laser beam are blocked, and a portion with weak energy is made not to use for the crystallization of the semiconductor film. At the same time, the length of the major axis of the laser beam is adjusted. A material or an adjustment method of the slit 2105 is not particularly limited as long as the material or the adjustment method has a structure or a shape that can be used in such a manner.

Next, after changing the direction of the laser beam with a mirror 2107, convergence is performed with a collective lens 2106 to irradiate a subject to be irradiated 2108. Note that, when the collective lens 2106 is provided so that the slit and the subject to be irradiated 2108 are in a conjugated position, it can be prevented that the diffracted light of the slit 2105 reaches the subject to be irradiated 2108 to generate interference stripes. By providing an optical system in such a manner, the surface to be irradiated can be irradiated with a laser beam having much uniform intensity distribution.

The substrate over which the subject to be irradiated 2108 is formed is fixed to a suction stage 2109 so as not to fall at the time of the laser irradiation. The suction stage 2109 scans in an X-axis direction and a Y-axis direction on a plane parallel to the surface of the subject to be irradiated 2108 by using an X stage 2110 and a Y stage 2111, whereby the entire surface of the subject to be irradiated 2108 is irradiated with a laser beam.

In this embodiment, the subject to be irradiated 2108 is moved by using the X stage 2110 and the Y stage 2111; however, the laser beam may be scanned by any of the following methods: an irradiation system moving method in which an irradiation position of a laser beam is moved while the subject to be irradiated 2108 is fixed; a subject moving method in which the subject to be irradiated 2108 is moved while the irradiation position of the laser beam is fixed; and a method in which the both methods are combined.

In such a manner, the intensity distribution of the laser beam, with which the subject to be irradiated 2108 is irradiated, can be homogenized and a portion of the laser beam having insufficient intensity at the end portion thereof can be removed. By having such a structure, laser irradiation treatment can be performed to the entire surface of the subject to be irradiated 2108.

Figure 19B:
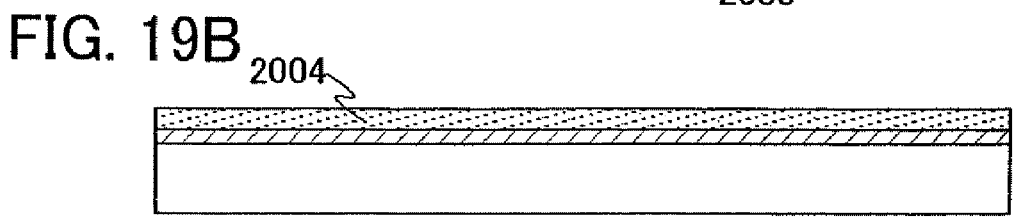
Figure 19C:
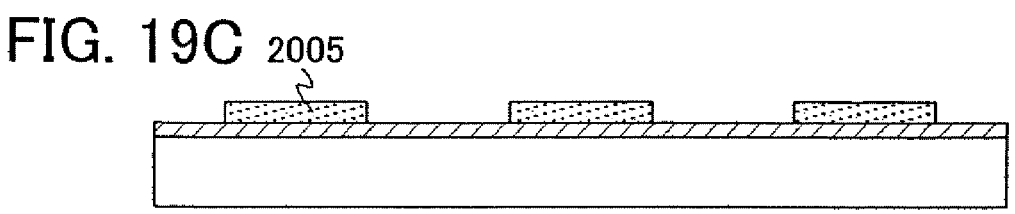

After the laser irradiation treatment, the silicon oxide film which is the cap film 2003 is removed by etching (FIG. 19B). Next, the quasi-single crystalline semiconductor film 2004 made of silicon is patterned into a desired shape by using a photolithography technique, thereby forming a semiconductor film 2005 (FIG. 19C). Before forming a resist mask here, in order to protect the quasi-single crystalline semiconductor film 2004 that is formed, a silicon oxide film may be formed by using ozone that is generated by being coated with a solution containing ozone, or UV irradiation in an oxygen atmosphere. The oxide film that is formed here has an effect of improving wettability of the resist.

Note that, if necessary, a minute amount of an impurity element (boron or phosphorus) is doped through the silicon oxide film to control a threshold voltage of a TFT before forming a pattern of the quasi-single crystal. When the doping is performed through the silicon oxide film, first, the cap film 2003 may be removed to form a silicon oxide film using again a CVD method or the like.

Figure 19D:
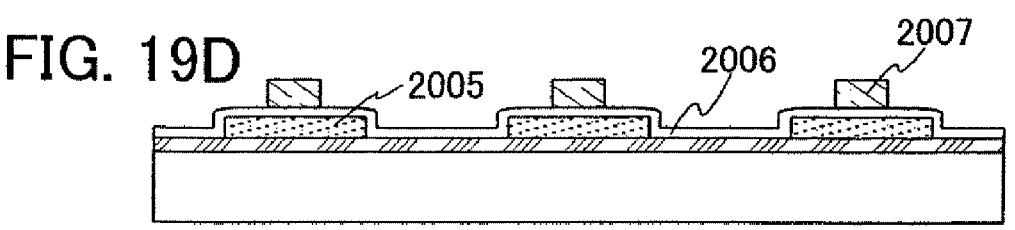

Then, as shown in FIG. 19D, after performing cleaning for removing an unnecessary matter that is generated in forming a pattern (remaining resist, a resist peeling solution, or the like), the surface of the quasi-single crystalline silicon film is covered to form a gate insulating film 2006. In this embodiment, a silicon oxide film is formed as the gate insulating film 2006.

Without limitation to the above silicon oxide film, the gate insulating film 2006 may be any as long as an insulating film at least containing oxygen or nitrogen is used. In addition, the gate insulating film 2006 may have a structure of a single layer or a plurality of layers. As a deposition method in this case, a plasma CVD method or a sputtering method can be used. For example, a silicon nitride film containing oxygen and a silicon oxide film containing nitrogen may be continuously formed by a plasma CVD method to have a total thickness of 115 nm. Note that, in a case of forming a TFT, a channel length of which is less than or equal to 1 μm (also referred to as a submicron the gate insulating film 2006 is desirably formed to have a thickness of 10 to 50 nm. Another gate insulating film 2006 may be formed again after removing the cap film 2003, if necessary.

Next, after cleaning the surface of the gate insulating film 2006, a conductive film is foliated over the gate insulating film 2006, and the conductive film is removed with a desired portion left to form a gate electrode 2007. As the gate electrode 2007, a material containing refractory metal with less hillock generation and also having conductivity is preferably used. As the refractory metal having less hillock generation, one of W, Mo, Ti, Ta, Co, and the like, or an alloy thereof is used. In addition, the gate electrode 2007 may be formed of the stacked material of two or more layers by using the nitride of these refractory metals (WN, MoN, TiN, TaN, or the like).

Moreover, as another method, the gate electrode 2007 may be formed directly on the gate insulating film 2006 by using a droplet discharging method typified by a printing method or an ink-jet method capable of discharging a conductive substance onto a predetermined place.

Then, by using the resist which is used in forming the gate electrode 2007 as a mask, an impurity element imparting n-type conductivity (P, As, or the like), here phosphorus, is appropriately added to the semiconductor film 2005 to form a source region and a drain region. In the same manner, an impurity element imparting p-type conductivity may also be introduced. According to this step, a source region 2008, a drain region 2009, an LDD (Lightly Doped Drain) region 2010, or the like is formed. In addition, an impurity element imparting n-type conductivity and an impurity element imparting p-type conductivity may be selectively added to a plurality of semiconductor films over the same substrate.

After adding the impurity element, heat treatment, irradiation of intense light, laser beam irradiation is performed to activate the impurity element. According to this treatment, the plasma damage to the gate insulating film 2006 or the plasma damage that is generated in an interface between the gate insulating film 2006 and the semiconductor film 2005 can be recovered simultaneously with the activation of the impurity element.

Figure 19E:
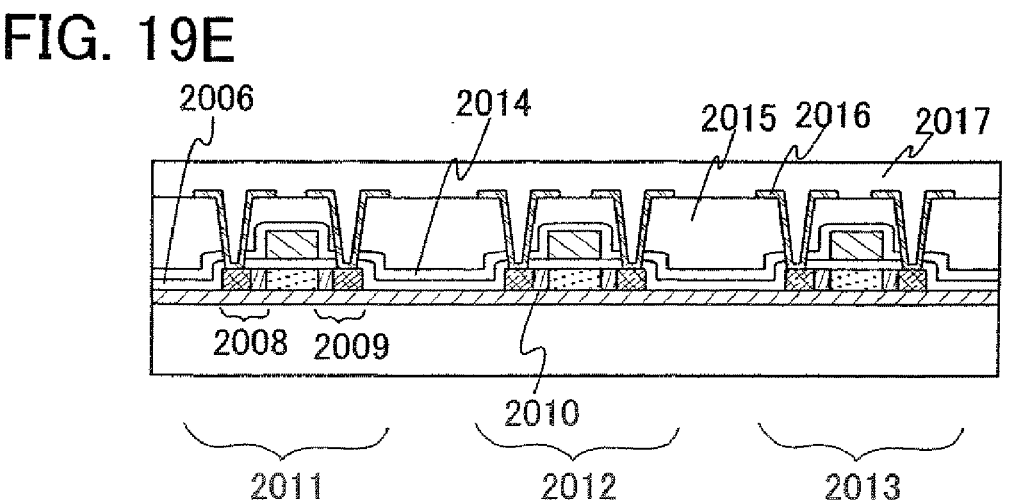

Next, as shown in FIG. 19E, a first insulating film 2014 is formed as a protective film. As this first insulating film 2014, a silicon nitride film or a silicon nitride film containing oxygen is formed to have a thickness of 100 to 200 nm in a single-layer or stacked-layer structure by using a plasma CVD method or a sputtering method. In a case of combining a silicon nitride film containing oxygen and a silicon oxide film containing nitrogen, it is possible to continuously form these films by changing gas. In this embodiment, a silicon oxide film containing nitrogen having a thickness of 100 nm was formed by a plasma CVD method. By providing the insulating film, it is possible to obtain a blocking effect to prevent the intrusion of ionic impurities in addition to oxygen and moisture in the air.

Then, a second insulating film 2015 is formed over the first insulating film 2014. Here, the second insulating film 2015 can be formed by using an organic resin film including polyimide, polyimide, BCB (benzocyclobutene), acrylic, siloxane (a substance having a framework structure formed by the bond between silicon and oxygen, in which one of fluorine, aliphatic hydrocarbon, and aromatic hydrocarbon is combined with silicon), or the like, which is applied by an SOG (Spin On Glass) method or a spin coating method. Moreover, an inorganic interlayer insulating film (an insulating film containing silicon, such as a silicon nitride film or a silicon oxide film), a low-k (low dielectric) material, or the like can also be used. Since the second insulating film 2015 is formed with a main purpose for relaxing unevenness due to TFTs formed over the glass substrate to make the second insulating film 2015 flat, a film superior in flatness is preferable.

Further, the gate insulating film 2006, the first insulating film 2014, and the second insulating film 2015 are processed by a photolithography method; therefore, contact holes that reach the source region 2008 and the drain region 2009 are formed.

Next, a conductive film is formed with a conductive material and patterned, thereby forming a wiring (a source electrode and a drain electrode) 2016. The wiring 2016 is formed of an element of W, Mo, Ti, Al, and Cu, or an alloy material or a compound material containing the element as its main component in a single layer or a stacked layer. For example, the wiring can be formed in a three-layer structure of a Ti film, a pure-Al film, and a Ti film, or a three-layer structure of a Ti film, an Al allay film containing Ni and C, and a Ti film. In addition, in consideration of forming an interlayer insulating film in the subsequent process, the wiring 2016 is preferably formed to have a tapered shape in a cross-sectional shape (a shape that gets thinner towards a conical shape).

Thereafter, when a third insulating film 2017 is formed as a protective film, TFTs (n-channel TFTs) 2011, 2012, and 2013 are completed as shown in FIG. 19E. Note that, when a p-type impurity element is added to the semiconductor film, a p-channel is formed. In addition, by selectively introducing an n-type impurity element and a p-type impurity element over the same substrate, an n-channel TFT and a p-channel TFT can also be formed over the same substrate.

This embodiment is explained by exemplifying a top-gate TFT; however, regardless of a TFT structure, the present invention can be applied, for example, to a bottom-gate (reverse stagger) TFT or a forward stagger TFT.

In addition, as explained in other embodiment, a quasi-single crystal of the present invention realizes crystal growth in a direction parallel to a scanning direction of a laser beam, and crystal grain boundaries thereof are also parallel to the scanning direction of the laser beam. Therefore, when a TFT is formed so that the scanning direction of the laser beam corresponds to a direction towards the drain region from the source region, a crystal gain boundary is not included in a carrier moving path, which is preferable.

Figure 21A:
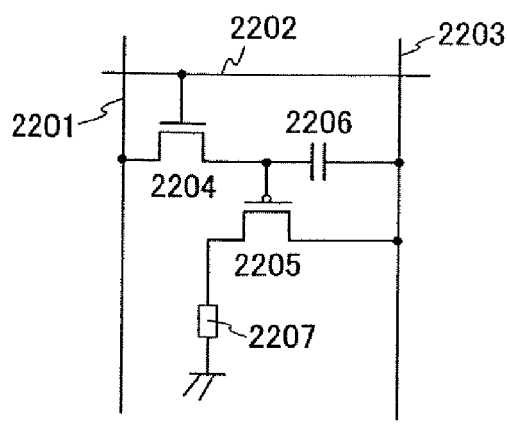
FIGS. 21A to 21C are diagrams each explaining an example of a manufacturing method of a semiconductor device using the present invention.
Figure 21B:
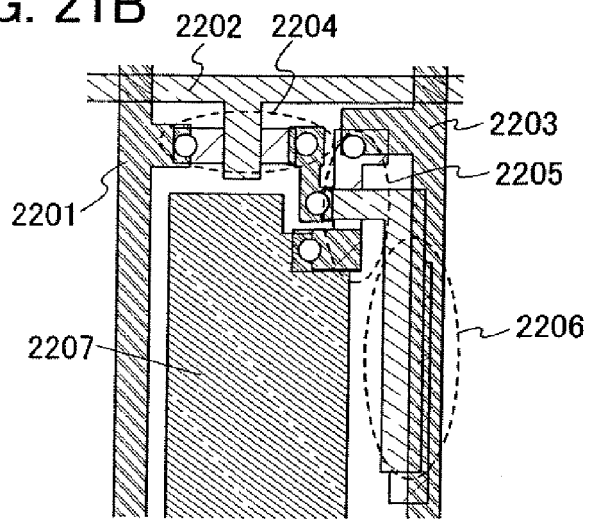

As one example thereof, a pixel circuit as shown in FIG. 21A is formed. In FIGS. 21A and 21B, reference numeral 2201 denotes a source signal line; 2202, a gate signal line; 2203, a current supply line; 2204, a switching TFT; 2205, a driving TFT; 2206, a capacitor; and 2207, a light-emitting element. Note that the switching TFT 2204 is formed of an n-channel TFT, and the driving TFT 2205 is formed of a p-channel TFT.

Figure 21C:
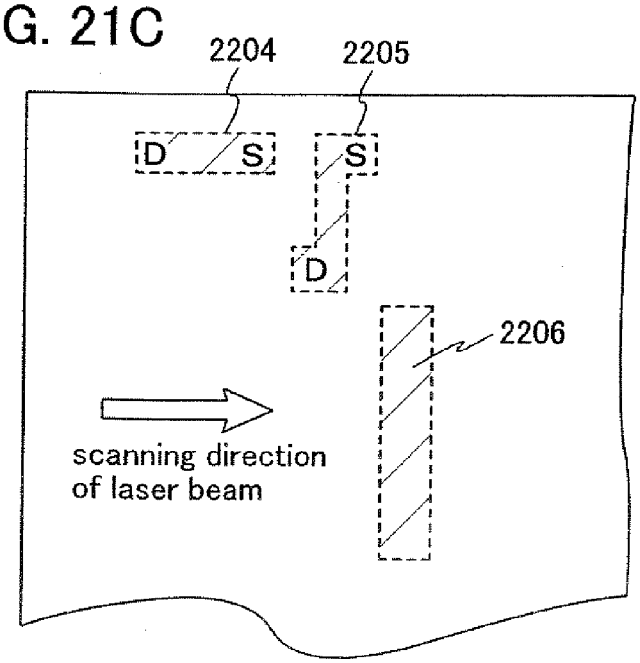

In this embodiment, as shown in FIG. 21C, a drain region of the switching TFT 2204 is formed in the upstream of the scanning direction of the laser beam, and a source region is formed in the downstream of the scanning direction of the laser beam. In addition, the carrier movement direction of the driving TFT 2205 is made to intersect with the scanning direction of the laser beam. In this embodiment, the carrier movement direction of the driving TFT 2205 is made to be vertical to the scanning direction of the laser beam. Note that FIG. 21C shows channel formation regions of the switching TFT 2204, and the driving TFT 2205 and the position for forming the capacitor 2206 from the top face, and a source region and a drain region of these TFTs are each denoted by S and D, respectively.

Note that the present invention is not particularly limited to the circuit constituting a pixel as long as an electric circuit constituting an n-channel TFT and a p-channel TFT in combination is used. For example, it is possible to use the present invention for a various circuits such as a driver circuit for driving a pixel; a power supply circuit; and a circuit constituting an IC, a memory, or a CPU.

The switching TFT 2204 is a TFT for changing on and off of the driving TFT 2205. Therefore, the switching TFT 2204 is required to be capable of high speed driving. When a source region and a drain region are formed so that a carrier moves in accordance with a growth direction of a crystal, like the switching TFT 2204, a carrier moves without crossing a crystal grain boundary. In other words, a carrier moves along a crystal grain boundary. Therefore, a TFT, in which a carrier has high mobility and high driving is possible, can be obtained.

The driving TFT 2205 is a TFT for emitting light by applying a current to the light-emitting element 2207. When the driving TFT 2205 has a high off current, a current flows to the light-emitting element 2207 even when the driving TFT 2205 is turned off, which results in increase of the power consumption. Therefore, the driving TFT 2205 is required to have a low off current. In the disposition of FIG. 21C, a carrier is to be moved so as to cross a crystal grain boundary in the driving TFT 2205. In this case, both an on current (a current that flows when a TFT is turned on) and an off current (a current that flows when a TFT is turned off) of the driving TFT 2205 are lowered.

In such a manner, a semiconductor device having a high response speed and favorable performance can be fowled by disposing a place where a TFT is formed in accordance with the condition to be required.

Generally, a semiconductor device is not formed of only one TFT. For example, a panel of a display device is formed with one pixel circuit by using a plurality of TFTs, where this pixel circuit is integrated. Here, it is required that characteristics of TFTs that constitutes individual circuit have uniformity. This is because, when there is variation in characteristics of a TFT, inconvenience such as display unevenness occurs. In the crystallized semiconductor film using the present invention, a crystal grain of a column shape that is extended in one direction is formed uniformly and a plane orientation of the crystal grain can be regarded as one direction. Therefore, by using this semiconductor film, a panel, where characteristics are identical and display unevenness is far unlikely to occur, can be formed. Moreover, this respect can be said not only for a panel but also for all semiconductor devices.

As described through the above process, a TFT using a quasi-single crystalline semiconductor film of the present invention for an active layer can be manufactured. This TFT has high speed operation, high current driving capacity, and small variation in a plurality of TFTs. It is possible to provide a semiconductor element or a semiconductor device, which is constituted by integrating a plurality of the semiconductor elements, by using this TFT.

Embodiment 8

Although Embodiment 2 shows an example in which a cap film is etched after laser crystallization, this embodiment will show an example of manufacturing a semiconductor device in which a cap film is directly used as a gate insulating film.

Figure 22A:
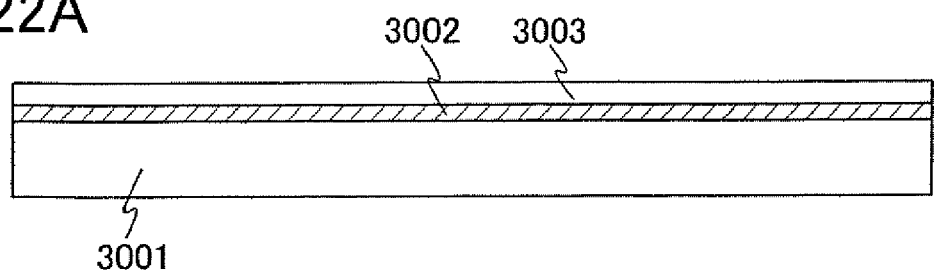
FIGS. 22A to 22D are views each explaining an example of a manufacturing method of a semiconductor device using the present invention.

First, an example of a manufacturing method of a semiconductor film, which is an object to be crystallized, will be shown. As shown in FIG. 22A, a base insulating film 3002 and a semiconductor film 3003 are formed over a substrate 3001 formed of an insulator such as glass which is transparent to visible light. The same kind of substrate used for Embodiment Mode and other embodiments can be used for the substrate 3001. In this embodiment, a silicon oxide film containing nitrogen having a thickness of 150 nm is formed as the base insulating film 3002 over a glass substrate having a thickness of 0.7 mm. Next, as the semiconductor film 3003, an amorphous silicon film having a thickness of 66 nm is formed over the base insulating film 3002 by a plasma CVD method. Furthermore, thermal annealing is performed at 500° C. for an hour in order to increase resistance of the semiconductor film 3003 to a laser beam.

Figure 22B:
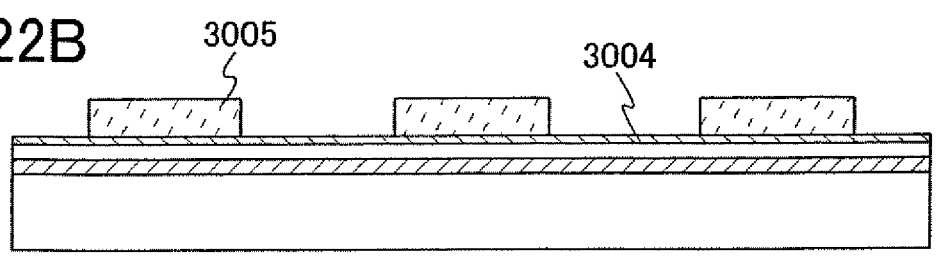
Figure 22C:
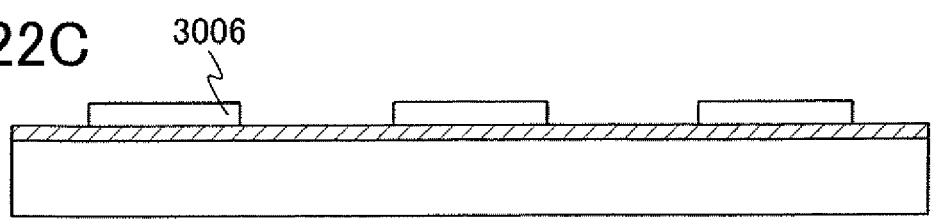

Then, as shown in FIGS. 22B and 22C, treatment of patterning the semiconductor film 3003 into a desired shape by using a photolithography technique and an etching technique (patterning) is performed, and a semiconductor film 3006 formed of amorphous silicon is formed. The method is as described below.

First, an ultra thin oxide film 3004 is formed over the surface of the amorphous silicon film by (1) a method of coating a solution containing ozone over the semiconductor film 3003 formed of amorphous silicon, (2) a method of emitting a UV ray to the semiconductor film 3003 formed of amorphous silicon in an oxygen atmosphere to generate ozone, or the like. The oxide film 3004 has an effect of protecting the amorphous silicon film and an effect of improving wettability of a resist.

Next, a resist mask 3005 is formed. First, a photoresist is coated over the oxide film 3004 by a spin coating method or the like, and the photoresist is exposed. Then, heat treatment (prebake) is performed to the photoresist at a temperature of 50 to 120° C., which is lower than a temperature of postbake to be performed later. In this embodiment, the prebake is performed at 90° C. for 90 seconds.

Then, a developing solution is dropped on the photoresist, or a developing solution is sprayed to the photoresist from a spray nozzle, and then the exposed photoresist is developed (formed into a predetermined shape).

Thereafter, heat treatment, which is a so-called postbake, is performed to the developed photoresist at 125° C. for 180 seconds to remove moisture or the like remaining in the resist mask and enhance stability to heat at the same time. Through the above process, the resist mask 3005 is formed. The semiconductor film 3003 formed of amorphous silicon is etched using the resist mask 3005, and an island-shaped semiconductor film 3006 formed of amorphous silicon is formed (FIG. 22C).

Note that, as another method, the resist mask 3005 may be directly formed on the oxide film 3004 by a printing method or a droplet discharging method typified by an ink-jet method which is capable of discharging a material at a predetermined location.

If necessary, a minute amount of an impurity element (boron or phosphorus) is doped through the oxide film 3004 to control a threshold voltage of a TFT before forming a pattern of the semiconductor film 3003. If doping is performed here, by laser irradiation treatment which is performed later, an added impurity element can be activated at the same time as a crystallization process, and an effect of reducing process is obtained. Further, it is preferable to remove the oxide film 3004 after the doping through the oxide film 3004.

Figure 22D:
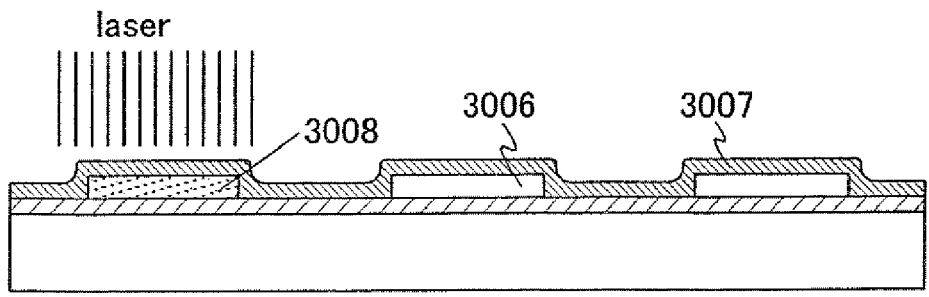

Subsequently, as shown in FIG. 22D, after washing is performed to remove an unnecessary matter (such as remaining resist or a resist peeling solution) generated in forming the semiconductor film 3003 into a desired pattern, the surface of the island-shaped semiconductor film 3006 is covered, and a gate insulating film 3007 including silicon oxide containing nitrogen as its main component, which becomes a cap film and also a gate insulating film, is formed to have a thickness of 200 nm. Note that since the silicon oxide film containing nitrogen is used as the gate insulating film 3007; therefore, it is preferable to form a solid and dense film.

The gate insulating film 3007 is not limited to the above silicon oxide film, and it is acceptable as long as the gate insulating film 3007 is an insulating film containing at least oxygen or nitrogen. In addition, the gate insulating film 3007 may be a single layer or a plurality of layers. A plasma CVD method or a sputtering method can be used for forming the gate insulating film 3007. For example, a silicon oxide film containing nitrogen and a silicon nitride film containing oxygen may be continuously formed by a plasma CVD method.

Next, a laser beam is emitted in the same manner as the method described in Embodiment Mode. Accordingly, crystals in an amorphous silicon film in a region irradiated with a laser beam and completely melted are grown in one plane orientation, and a quasi-single crystalline semiconductor film 3008 can be formed. Thereafter, a gate electrode is formed over the gate insulating film 3007, and a source region and a drain region are formed by introducing an impurity to the quasi-single crystalline semiconductor film 3008. Furthermore, an insulating film is formed, and an electrode to which each of the source region and the drain region is connected is formed; accordingly, a thin film transistor can be formed. Note that the method shown in other embodiments can be used for the steps after the gate electrode formation.

As described through the above steps, a TFT in which the quasi-single crystalline semiconductor film is used for an active layer can be manufactured. Therefore, it is possible to manufacture a semiconductor element capable of high speed operation with high current driving capacity and small variation of characteristics between elements. Moreover, it is possible to provide a semiconductor device which is constituted by integrating a plurality of the semiconductor elements.

Embodiment 9

This embodiment will describe an example of a laser crystallization method, which is different from the above example. In this embodiment, a Yb-doped fiber CW laser having a wavelength in a near-infrared region is used for a laser oscillator. This laser is capable of outputting an energy of 10 kW. This embodiment is not limited thereto, and a diode laser, an LD-pumped solid-state laser, or the like may be used. Although a CW laser beam is used in this embodiment, a pulse laser beam having a repetition rate of greater than or equal to 10 MHz may also be used.

The reason why a laser oscillator having a wavelength in a near-infrared region is used is as follows. A fundamental wave oscillated from a laser medium enters a nonlinear optical element; thus a harmonic is obtained. However, there is a problem that when an output of the laser gets higher, the nonlinear optical element is damaged due to a nonlinear optical effect such as multiphoton absorption, which leads to breakdown. Accordingly, a CW laser beam in a visible range and a pulse laser beam having a repetition rate of greater than or equal to 10 MHz which are now produced have an energy of approximately 15 W at a maximum due to the problem of the nonlinear optical element. Therefore, if a laser which has a fundamental wave having a higher output can be used for crystallization, a beam spot on a surface to be irradiated can be made longer; thus laser irradiation treatment can be performed efficiently.

Figure 23A:
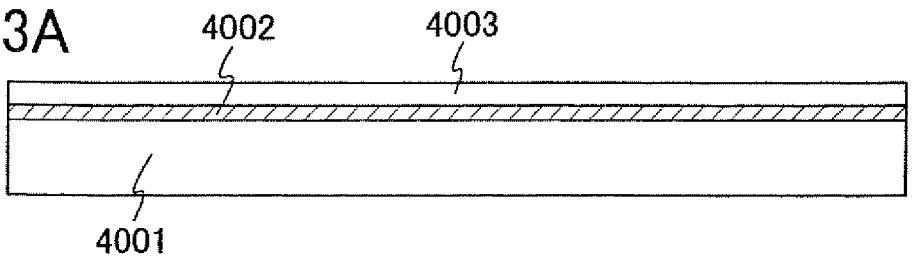
FIGS. 23A to 23E are views each explaining an example of a manufacturing method of a semiconductor device using the present invention.

An example of a manufacturing method of a semiconductor film which is an object to which laser crystallization is performed will be described. As shown in FIG. 23A, as a substrate 4001, an insulating substrate such as a glass substrate, which is transparent to visible light with a laser wavelength used for laser crystallization, is used. In this embodiment, a glass substrate having a thickness of 0.7 mm is used as the substrate 4001. Note that a material of the substrate 4001 is not limited to glass, and the material described in other embodiments can be used.

A silicon oxide film containing nitrogen having a thickness of 150 nm is formed as a base insulating film 4002 over one surface of the substrate 4001, and an amorphous silicon film 4003 having a thickness of 66 nm is formed thereover as a semiconductor film by a plasma CVD method. Although the base insulating film 4002 and the amorphous silicon film 4003 may be formed over either an upper surface or a back surface of the substrate, the base insulating film 4002 and the amorphous silicon film 4003 are formed over the upper surface for convenience in this embodiment. Furthermore, thermal annealing is performed to the semiconductor film at 500° C. for an hour in order to increase resistance of the semiconductor film to a laser beam.

Figure 23B:
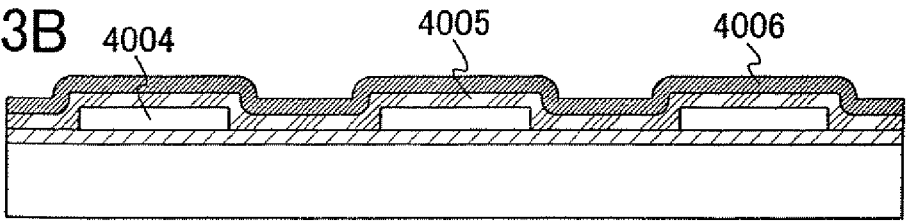

Next, as shown in FIG. 23B, treatment of patterning the amorphous silicon film 4003 into a desired shape by a photolithography technique and an etching technique (patterning) is performed; thus, an amorphous silicon film 4004 is formed. In this treatment, before forming a resist mask, an oxide film can be formed by a method of coating a solution containing ozone or a method generating ozone by UV irradiation in an oxygen atmosphere in order to protect the amorphous silicon film 4003. The oxide film formed here has an effect of improving wettability of the resist.

If necessary, a minute amount of an impurity element (boron or phosphorus) is doped through the oxide film to control a threshold voltage of a TFT before forming a pattern. Here, by performing doping, activation treatment of the impurity element added by a crystallization process by a laser to be performed later can be performed at the same time; thus an effect of reducing steps can be obtained. Note that, when the doping is performed through the oxide film, the oxide film may be removed.

Then, after washing for removing an unnecessary matter such as remaining resist or a resist peeling solution generated by the pattern formation process is performed, the surface of the island-shaped amorphous silicon film 4004 is covered, and an insulating film 4005 containing $SiO_2$ as its main component, which becomes a cap film and also a gate insulating film, is formed. Moreover, a tungsten film is formed to have a thickness of 30 nm as a light absorption layer 4006 of a laser beam.

The reason why the light absorption layer 4006 is formed is as follows. As described above, a laser of a fundamental wave having a wavelength in a near-infrared region is used in this embodiment. However, in a wavelength in the near-infrared region, a light absorption coefficient of silicon is low. Therefore, when the laser of the fundamental wave having the wavelength in the near-infrared region is used, silicon cannot be melted directly. The light absorption layer having a high absorption coefficient in the near-infrared region is provided, and the semiconductor film is indirectly crystallized by heat generated when a laser beam is absorbed in the light absorption layer.

Accordingly, as a material for the light absorption layer 4006, a material having a higher absorption rate in a near-infrared wavelength region to an infrared wavelength region compared with the material for the amorphous silicon film 4004 is used. For example, the light absorption layer 4006 can be formed of a single layer or a stacked layer of two or more layers using one of W, Mo, Ti, Ta, and Co, an alloy of the elements, or nitride of the refractory metals (WN, MoN, TiN, TaN, or the like).

Figure 23C:
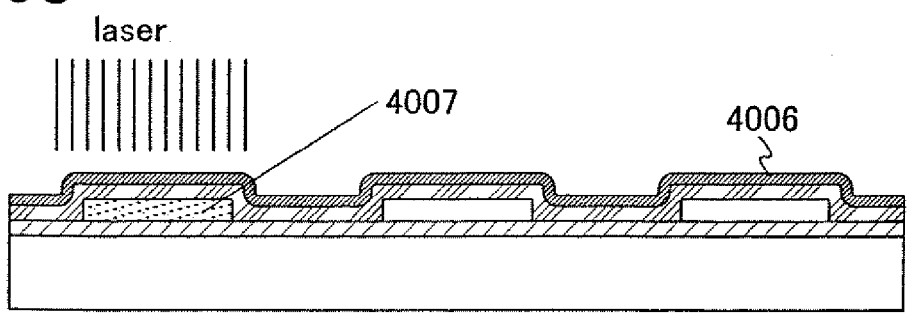

The object to be irradiated formed through the above process is irradiated with a laser beam (FIG. 23C). The amorphous silicon film 4004 is heated by heat generated when light of the laser beam is absorbed in the light absorption layer 4006. As a result, crystals in the amorphous silicon film in a region which is irradiated with the laser beam and is completely melted is grown in one plane orientation; thus, a quasi-single crystalline amorphous silicon film 4007 can be obtained from the amorphous silicon film 4004.

Figure 23D:
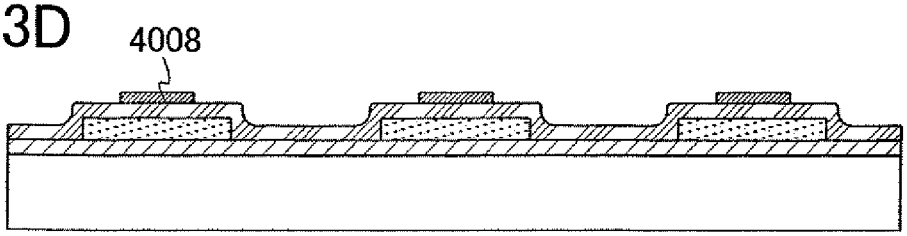

Note that, after the laser beam irradiation, the light absorption layer 4006 may be removed by etching, or alternatively the light absorption layer 4006 may be formed into a desired shape without etching to be used as a gate electrode 4008. In FIG. 23D, the light absorption layer 4006 is removed by etching except for part thereof.

Figure 23E:
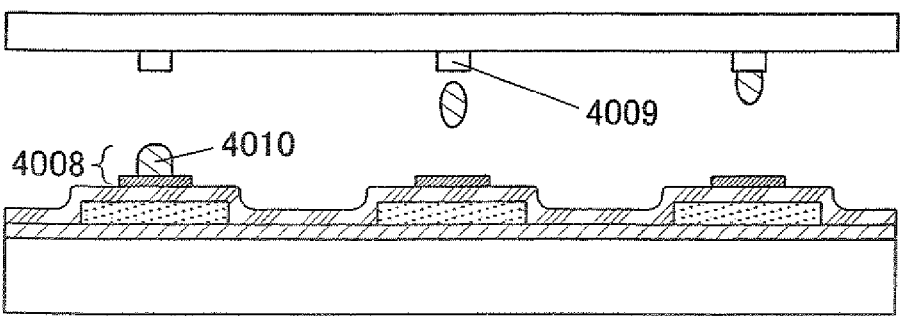

The gate electrode 4008 is not limited to one layer, and may be a plurality of layers. As shown in FIG. 23E, the light absorption layer 4006 is shaped by etching, a conductive film is formed over the light absorption layer 4006, and further the conductive film is shaped by etching; thus, the gate electrode 4008 having two or more layers can also be formed. In addition, although not shown, before etching the light absorption layer 4006, a conductive film 4010 containing a conductive material is formed, and is etched at the same time as the light absorption layer 4006; thus, the gate electrode 4008 is formed. In FIG. 23E, an example is shown, in which a paste containing a conductive material is discharged from a spray nozzle 4009 and the conductive film 4010 is formed directly.

The material used in Embodiment Mode and other embodiments can be used for a material of the conductive film 4010. A CVD method or a sputtering method may also be used for forming the conductive film 4010. Alternatively, a method may be used, by which a substance in which fine particles of a conductive material are dissolved or dispersed by a solvent is directly formed into the shape of the gate electrode.

By using a known method for the following steps, a TFT in which a quasi-single crystalline semiconductor film is used for an active layer can be manufactured. The ITT manufactured by this manufacturing method is capable of high speed operation with high current driving capacity and has small variation of characteristics between elements. It is possible to manufacture a semiconductor element by using the TFT and manufacture a semiconductor device by integrating a plurality of the semiconductor elements.

Note that, although the example is shown in this embodiment, in which the light absorption layer 4006 is formed over the cap film, the light absorption layer 4006 is directly irradiated with a laser beam, and heat generated by the light absorption layer 4006 is used for melting the amorphous silicon film 4004, the light absorption layer 4006 is not necessarily provided as a top layer. For example, when an IC tag is manufactured by a semiconductor element such as a TFT; the IC tag is peeled from a substrate after the process is completed; therefore, a layer to be peeled is formed below a semiconductor film. A structure in which the layer to be peeled is used also as the light absorption layer may also be employed.

Although, in this embodiment, the cap film and the light absorption layer are formed and a laser beam is emitted after processing the semiconductor film into a predetermined shape by etching, the cap film and the light absorption layer may be formed and a laser beam may be emitted before processing the shape of the semiconductor film.

Embodiment 10

This embodiment will describe an example of a laser irradiation method which is different from the method in Embodiment Mode or other embodiments. Note that, although, in the same manner as the laser used in Embodiment Mode, a second harmonic (wavelength of 532 nm) of a $YVO_4$ pulse laser having a repetition rate of 80 MHz is used for a laser oscillator which is used in this embodiment, a CW laser may also be used.

Figure 24A:
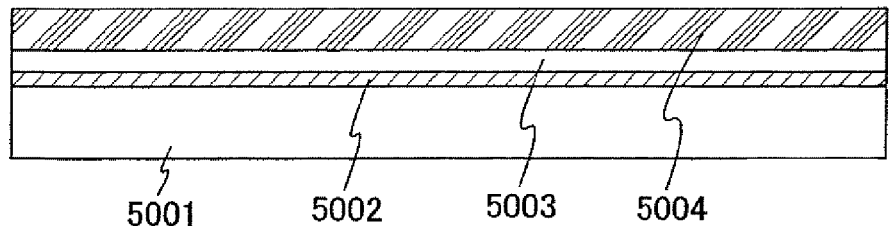
FIGS. 24A to 24C are views each explaining an example of a manufacturing method of a semiconductor device using the present invention.

First, as shown in FIG. 24A, in the same manner as the method shown in Embodiment Mode of the present invention, a base insulating film 5002 is formed over a substrate 5001 such as a glass substrate which has sufficiently high transmissivity to visible light. Moreover, an amorphous silicon film 5003 is formed as a semiconductor film, and a silicon oxide film is formed over the amorphous silicon film 5003 as a cap film 5004. As in other embodiments, the substrate 5001 is not limited to glass as long as the substrate 5001 has an insulating property and does not absorb visible light.

Figure 24B:
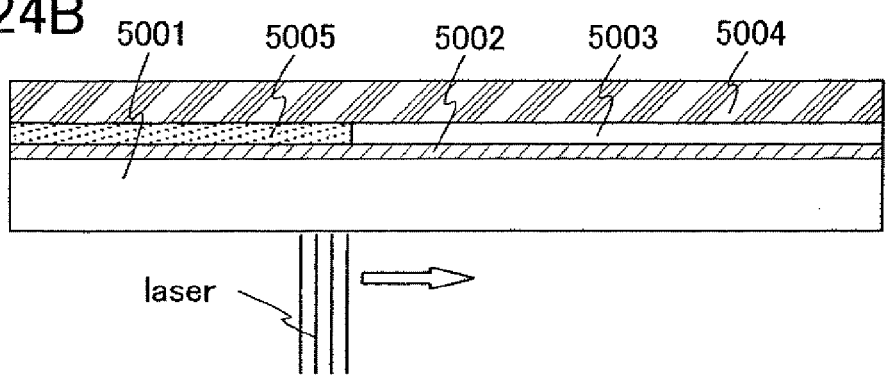

Next, a laser irradiation method will be explained. A laser beam is emitted through a cap film in Embodiment Mode, whereas as shown in FIG. 24B, a laser beam is irradiated from a back surface side of the substrate 5001 in this embodiment, that is a surface where nothing is formed over the substrate 5001 to form a quasi-single crystal 5005. Note that, in a case of this embodiment, the laser beam spot is formed in the base insulating film 5002. An optical system for making the laser beam spot into linear and a robot mounted with an object to be irradiated can be the same as those shown in Embodiment Mode and other embodiments.

The laser beam is emitted as in Embodiment Mode or other embodiments, except for irradiating the laser beam from the back surface of the substrate 5001. Accordingly, crystals in the amorphous silicon film in a region which is completely melted by laser beam irradiation are grown in one plane orientation; thus a quasi-single crystalline amorphous silicon film can be obtained. The above laser crystallization method can be used for a case, for example, where a metal film or the like which becomes a gate electrode or a wiring later is already formed over the cap film 5004 and the amorphous silicon film 5003 cannot be directly irradiated with the laser beam.

Figure 24C:
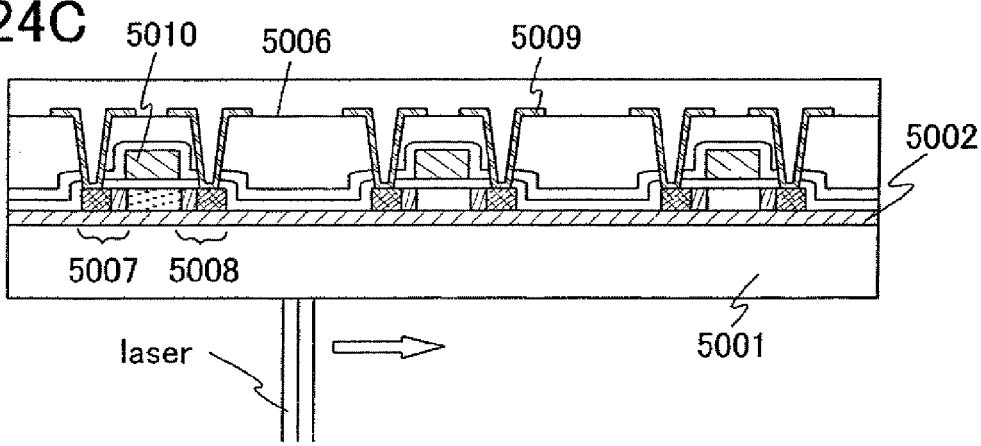

This example is shown in FIG. 24C. A gate insulating film 5006, a wiring 5009 connected to a source region 5007 or a drain region 5008, and a gate electrode 5010 are already formed. When a laser beam is irradiated through the substrate 5001, the laser beam is absorbed in the wiring 5009 or the gate electrode 5010; therefore, an entire semiconductor film forming the source region 5007 and the drain region 5008 cannot be irradiated with the laser beam. In addition, the wiring 5009 and the gate electrode 5010 themselves may be affected.

Consequently, by irradiating the laser beam from the back surface of the substrate 5001, the entire semiconductor film can be irradiated with the laser beam; thus, a quasi-single crystal can be obtained. In other words, in this embodiment, the base insulating film 5002 corresponds to the cap film in Embodiment Mode or other embodiments.

The known method such as the method shown in other embodiments can be used for the following process of the manufacturing method of the semiconductor device. When the above process is used, a TFT in which quasi-single crystalline silicon is used for an active layer can be manufactured. The TFT is capable of high speed operation with high current driving capacity and small variation of characteristics between elements. By using this TFT, it is possible to provide a semiconductor element or a semiconductor device which is constituted by integrating a plurality of the semiconductor elements.

Embodiment 11

This embodiment will explain an example in which, by making a state longer, in which a semiconductor film is irradiated with a laser beam and is melted, crystal growth is further promoted, and a quasi-single crystal having a larger domain.

In order to temporally extend the state in which a semiconductor film is melted, it is preferable that heat from a heat source except for an irradiated laser beam be given to a region irradiated with a laser beam. A specific method is as follows.

Figure 25A:
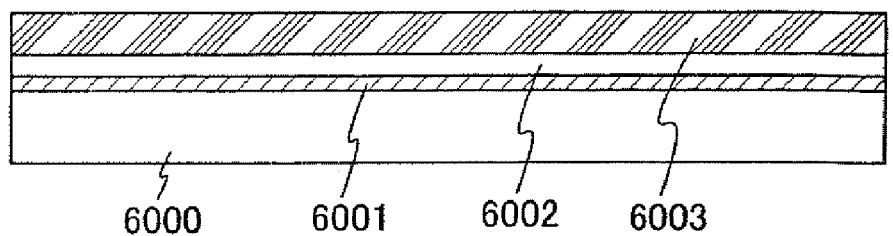
FIGS. 25A to 25C are views each explaining an example of a manufacturing method of a semiconductor device using the present invention.

First, as shown in FIG. 25A, a base insulating film 6001 is formed over a substrate 6000. Glass such as alumina borosilicate glass or barium borosilicate glass is used as a material of the substrate 6000. The material of the substrate 6000 is not limited to glass. The material can be freely selected as long as the material has low absorption to visible light and has heat resistance to a processing temperature of this embodiment. For example, as the material of the substrate 6000, quartz, ceramic, diamond, or the like can be used. A silicon oxide film containing nitrogen having a thickness of 150 nm is formed as the base insulating film 6001 over the substrate 6000, and an amorphous silicon film having a thickness of 66 nm is formed as an amorphous semiconductor film 6002 over the base insulating film 6001 by a plasma CVD method.

Next, thermal annealing is performed to the amorphous semiconductor film 6002 at 500° C. for an hour in order to increase resistance of the amorphous semiconductor film 6002 to a laser beam. Furthermore, a silicon oxide film having a thickness of 300 nm is formed as a cap film 6003 over the amorphous semiconductor film 6002.

Subsequently, the cap film 6003 is irradiated with a laser beam in the same manner as Embodiment Mode or other embodiments, and at the same time, a high-temperature gas or thermal plasma is locally sprayed so as to be overlapped with the laser beam spot.

Although a YVO$_4$ laser is used as a pulse laser having a repetition rate of greater than or equal to 10 MHz in this embodiment, either the pulse laser having a repetition rate of greater than or equal to 10 MHz or a CW laser may be used. For example, as a gas laser, there is an Ar laser, a Kr laser, a CO$_2$ laser, or the like; as a solid laser, there is a YAG laser, a YLF laser, a YAlO$_3$ laser, a GdVO$_4$ laser, a Y$_2$O$_3$ laser, an alexandrite laser, a Ti:sapphire laser, a ceramic laser, or the like; and, as a metal vapor laser, there is a helium cadmium laser or the like.

Figure 25B:
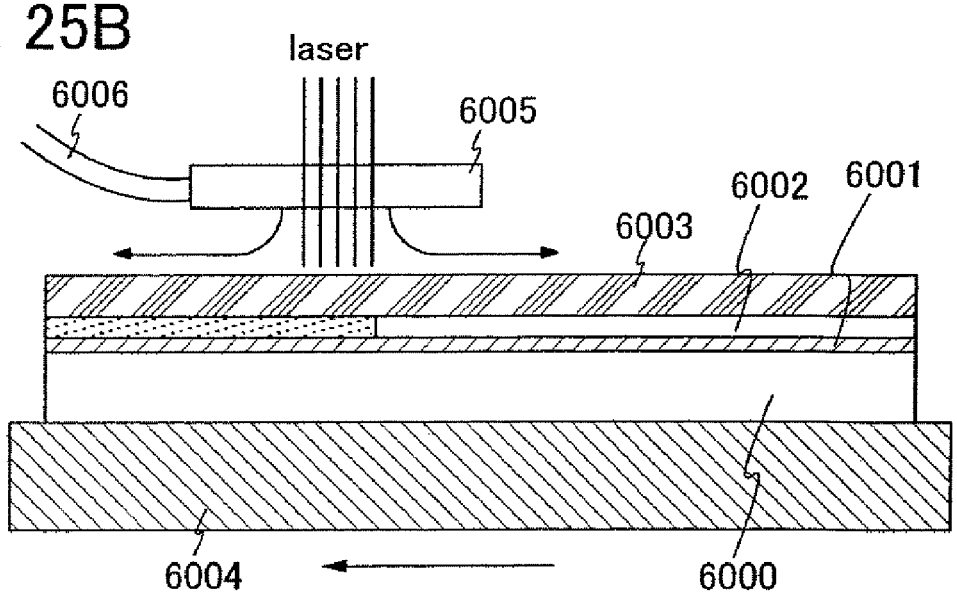

An example of a method of spraying a high-temperature gas will be given. As shown in FIG. 25B, the substrate 6000 provided with up to the cap film 6003 is fixed to a stage 6004. Then, the gas is supplied to a nozzle 6005 for spraying a gas such as an inert gas or air from a gas supply tube 6006 to spray the gas. When the nozzle 6005 is made of a material which transmits a laser beam, it is not necessary to particularly process the nozzle 6005, whereas when the nozzle 6005 is made of a material which absorbs the laser beam, it is preferable to cut out a portion through which the laser beam passes. The nozzle 6005 may be floated depending on the sprayed gas, and the nozzle 6005 may be fixed to the surface of the cap film, having a predetermined distance with the surface of the cap film. When the stage 6004 is moved in such a state, the entire surface of the cap film 6003 is irradiated with a laser beam; thus, the amorphous semiconductor film 6002 is melted.

Figure 25C:
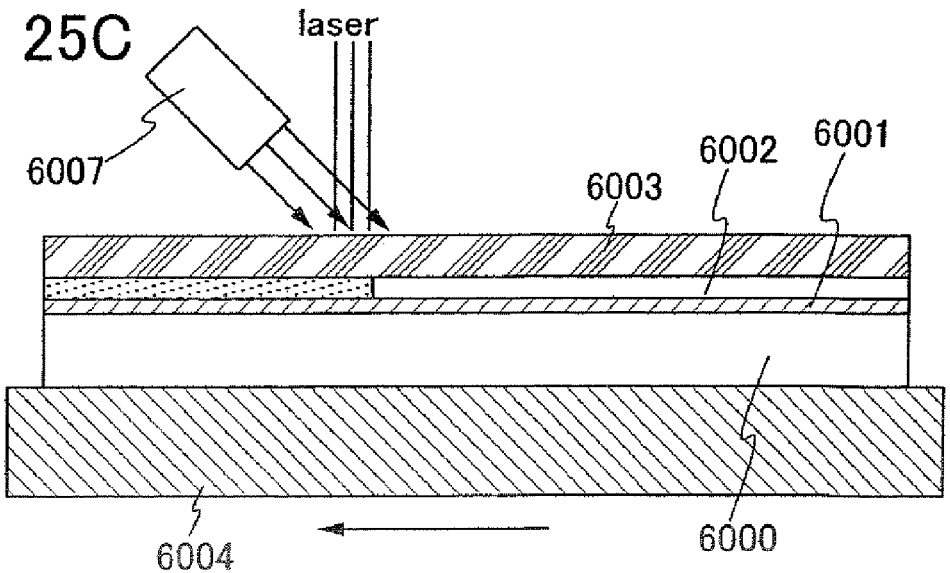

As shown in FIG. 25C, a method by which a gas is obliquely sprayed to the beam spot formed over the cap film 6003 by using a gas exhaust means 6007 such as a spray gun may be employed. This method can be carried out only by setting the gas exhaust means 6007; therefore, the existing device can be used. When the stage 6004 is moved in this state, the entire surface of the cap film 6003 is irradiated with the laser beam; thus the amorphous semiconductor film 6002 is melted.

In a case of spraying a high-temperature gas, an inert gas such as nitrogen or argon; air; or a compressed gas thereof can be used as the gas. The gas used in this embodiment has a temperature of greater than or equal to 300° C. and less than or equal to 1500° C. It is preferable to spray a gas in this temperature range with a size which is sufficiently overlapped with the laser spot.

Note that, when the gas is heated at a temperature of less than 300° C., an effect of heating the amorphous semiconductor film 6002 is small; therefore, it is preferable that the gas be heated at a temperature of greater than or equal to 300° C. In addition, the melting point of silicon which is a typical semiconductor is 1414° C. Therefore, when a gas for heating up to 1500° C. is sprayed, there is enough heat quantity.

Figure 26:
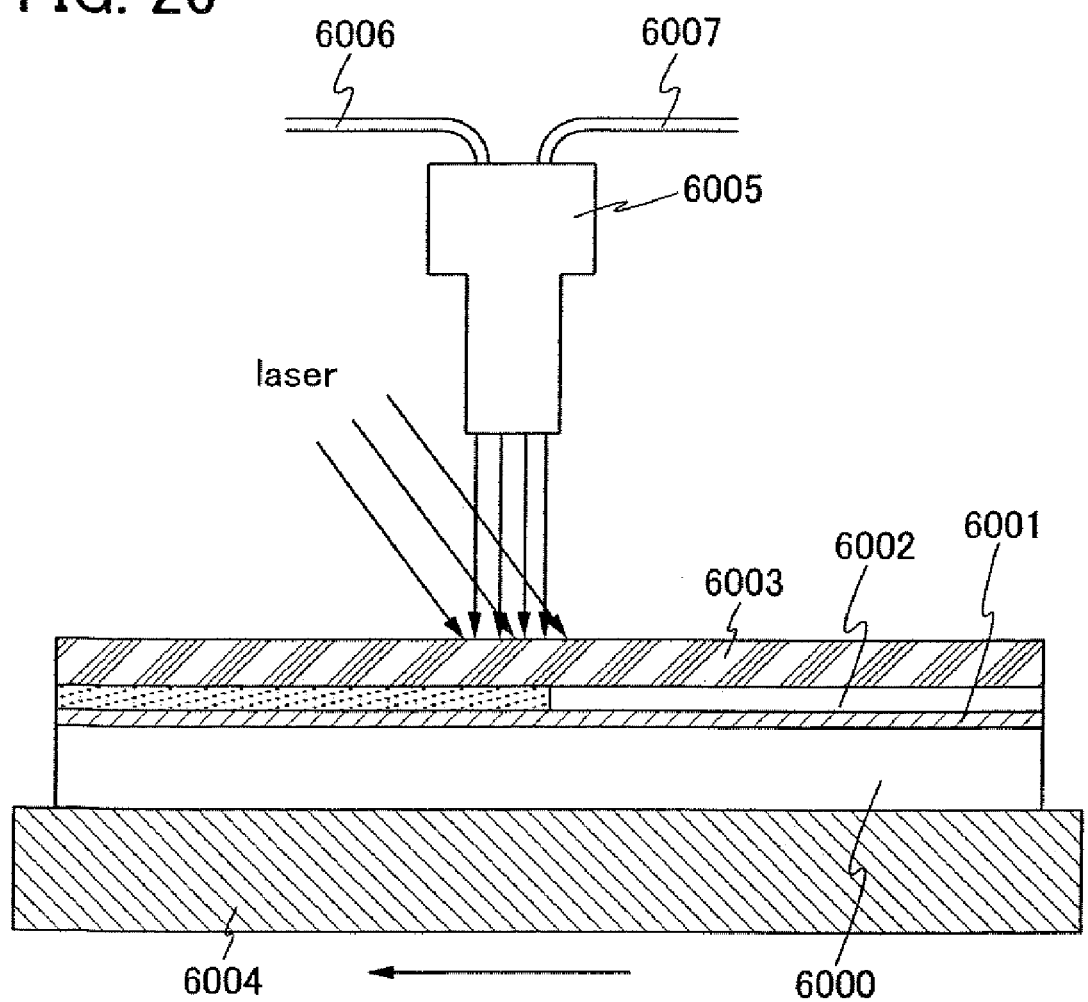
FIG. 26 is a view explaining an example of a manufacturing method of a semiconductor device using the present invention.

An example of emitting plasma will be given. First, as shown in FIG. 26, a substrate 6000 provided with up to a cap film 6003 is fixed to a stage 6004. The cap film 6003 is irradiated with a laser beam, and at the same time, pressure is made to be atmospheric pressure or pressure close to atmospheric pressure (typically, $1.3 \times 10^1$ to $1.31 \times 10^5$ Pa) by using an inert gas such as nitrogen or argon, or air as a treatment gas, and then a pulse voltage is applied. When the stage 6004 is moved in such a state, the entire surface of the cap film 6003 is irradiated with the laser beam; thus an amorphous semiconductor film 6002 is melted.

In a case of emitting plasma in the atmospheric pressure or the pressure close to the atmospheric pressure, a nozzle 6005 for emitting plasma may be used. A gas supply tube 6006 for supplying a gas used for treatment and gas exhaust means 6007 are connected to the nozzle 6005. The gas supplied from the gas supply tube 6006 becomes plasma in the nozzle 6005 to be sprayed to the cap film 6003 from a spray nozzle. Thereafter, the gas is discharged from the gas exhaust means 6007. In order to stably maintain discharge in the atmospheric pressure or the pressure close to the atmospheric pressure, it is preferable that a distance between the nozzle 6005 and the surface of the cap film 6003 which is a surface to be irradiated be less than or equal to 50 mm.

The nozzle 6005 can be formed to have a free shape such as a column shape or a triangular pyramid shape as long as the nozzle has a structure capable of locally emitting a gas which has become plasma.

When the above method is used in order to temporally extend a state in which the amorphous semiconductor film is melted to further promote crystal growth, the entire surface of the glass substrate is not exposed to high temperature and heat can be locally applied temporarily; therefore, distortion of the substrate due to heat can be suppressed. In addition, the amorphous silicon film in the region which is melted due to the laser beam irradiation can promote slower crystal growth by an effect of the cap film and high-temperature gas irradiation; accordingly, a quasi-single crystalline amorphous silicon film having large domain can be obtained.

A known method can be used for the following process of the manufacturing method of the semiconductor device. By using the above process, a TFT in which quasi-single crystalline silicon is used for an active layer can be manufactured, and it is possible to provide a semiconductor element capable of high speed operation with high current driving capacity and small variation between elements, or a semiconductor device which is constituted by integrating a plurality of the semiconductor elements.

Embodiment 12

This embodiment will explain, as an example of a semiconductor device in which a quasi-single crystalline semiconductor film of the present invention is used as a material, an active matrix light-emitting device in which a terminal portion 7031, a pixel portion 7033, and a driver circuit portion 7032 are formed over the same substrate, and a manufacturing example thereof. The present invention can obviously be applied to a passive light-emitting device.

In the pixel portion 7033, a first TFT serving as switching (hereinafter, referred to as a switching TFT) and a second TFT for controlling a current to a light-emitting element (hereinafter, referred to as a driving TFT) are formed. In addition, in the driver circuit portion 7032, a TFT for driving the pixel portion 7033 is formed. By using a semiconductor film of the present invention, a TFT in the pixel portion 7033 and a TFT in the driver circuit portion 7032 can be formed.

The semiconductor film of the present invention has few crystal defects, and the plane orientation of crystal grains in the semiconductor film is aligned in a degree that can be substantially regarded as one direction. Therefore, by using this semiconductor film, it is possible to manufacture a semiconductor element capable of high speed operation with high current driving capacity and small variation of characteristics between elements. By using this element, a high-quality semiconductor device can be manufactured.

First, base insulating films 7001*a* and 7001*b* are formed over a substrate 7000 (FIG. 27A). In this embodiment, a glass substrate is used as the substrate 7000. Further, a refractive index of the glass substrate is approximately 1.55.

In a case of extracting light emission by using the substrate 7000 side as a display surface, a glass substrate or a quartz substrate which has a light-transmitting property may be used as the substrate 7000. In addition, plastic such as polyimide, acrylic, polyethylene terephthalate, polycarbonate, or polyether sulfone; or a synthetic resin having a light-transmitting property typified by acrylic or the like can be used as a material of the substrate as long as the material has resistance which can withstand a processing temperature during a process. Moreover, in a case of extracting light emission by using an opposite surface of the substrate 7000 as a display surface, a silicon substrate, a metal substrate, or a stainless steel substrate over which an insulating film is formed can be used as the substrate 7000, in addition to the above described materials.

If necessary, the substrate 7000 may be used after being polished by CMP (chemical mechanical polishing) or the like.

The base insulating films 7001*a* and 7001*b* are each formed of an insulating substance such as a silicon oxide film, a silicon nitride film, or a silicon oxide film containing nitrogen, and are each formed of a single layer or a plurality of layers of two or more layers. The base insulating films 7001*a* and 7001*b* are formed by using a known method such as a sputtering method, an LPCVD method, or a plasma CVD method. In this embodiment, the base insulating films 7001*a* and 7001*b* each have a silicon oxide film containing nitrogen with a different composition ratio, which forms a two-layer structure. The base insulating film 7001*a* which is a first layer is formed using a silicon oxide film containing nitrogen (composition ratio: Si=32%, O=27%, N=24%, and H=17%) to have a thickness of 140 nm by using $SiH_4$, $NH_3$, and $N_2O$ as reactive gases by a plasma CVD method. Subsequently, the base insulating film 7001*b* which is a second layer is formed using a silicon oxide film containing nitrogen (composition ratio: Si=32%, O=59%, N=7%, and H=2%) to have a thickness of 100 nm by using $SiH_4$ and $N_2O$ as reactive gases by a plasma CVD method. Note that, although the base insulating films 7001*a* and 7001*b* have a two-layer stacked-layer structure in this embodiment, the base insulating films 7001*a* and 7001*b* may obviously be a single layer or a plurality of layers of three or more layers. In addition, when unevenness of the substrate 7000 or diffusion of impurity from the substrate 7000 is not a problem, it is not necessary to form the base insulating film.

Next, by using the method shown in other embodiments, semiconductor films 7002 to 7005, where quasi-single crystals are obtained, are formed over the base insulating film 7001*b*. There are broadly two methods for fowling the semiconductor films 7002 to 7005 where quasi-single crystals are obtained.

A first method is a method, as explained in Embodiment Mode, by which an entire surface of an amorphous semiconductor film is irradiated with a laser beam to obtain a quasi-single crystal and then is formed into a desired shape. This process will be briefly explained with reference to FIGS. 5A to 5D.

As shown in FIG. 5A, a base insulating film 101 is formed over a substrate 100, and a semiconductor film 102 is formed to have a thickness of 25 to 200 nm (preferably, 30 to 80 nm) by using a known method (a sputtering method, an LPCVD method, a plasma CVD method, or the like). Furthermore, a silicon oxide film containing nitrogen is formed as a cap film 103 to have a thickness of greater than or equal to 200 nm and less than or equal to 500 nm over the semiconductor film 102. Next, as shown in FIG. 5B, a CW laser beam or a pulse laser beam having a repetition rate of greater than or equal to 10 MHz is irradiated to obtain a quasi-single crystalline semiconductor film 104.

More specific example will be given below. An amorphous silicon film is formed to have a thickness of 66 nm as the semiconductor film 102, the cap film is formed to have a thickness of 500 nm, and a CW laser beam having an energy of greater than or equal to 14 W and less than or equal to 20 W or a pulse laser beam having a repetition rate of greater than or equal to 10 MHz is irradiated at a scanning speed of 35 cm/sec; accordingly, a favorable silicon film in which an orientation of each crystal grain is aligned can be formed. When the energy of the laser beam is sufficient, one laser oscillator may be used, or alternatively laser beams emitted from a plurality of laser oscillators may be synthesized by using an optical system to be irradiated to the semiconductor film.

Thereafter, as shown in FIG. 5C, the cap film 103 is removed by etching. Then, a resist is coated over the quasi-single crystalline semiconductor film 104. By exposing and developing the resist, the resist is formed into a desired shape. The quasi-single crystalline semiconductor film which is exposed by developing is removed by performing etching by using the resist formed here as a mask. By this process, a quasi-single crystalline semiconductor film 105 which is formed in an island-shape is formed (FIG. 5D).

A second method is, as explained in Embodiment 8, a method by which, after an amorphous semiconductor film is formed into a desired shape, a quasi-single crystal is obtained by laser beam irradiation. The method will be briefly explained with reference to FIGS. 22A to 22D.

As with the first method, a base insulating film 3002, a semiconductor film 3003 formed of amorphous silicon, and an oxide film 3004 are formed over a substrate 3001 (FIG. 22A). Each materials and thickness of the substrate and the formed films is the same as those in the above first method. Next, a resist is coated, and the resist is formed into a desired shape by exposing and developing (FIG. 22B). The semiconductor film 3003 formed of amorphous silicon which is exposed by developing is removed by performing etching by using the formed resist as a mask, and an island-shaped semiconductor film 3006 formed of amorphous silicon is formed (FIG. 22C). Thereafter, a silicon oxide film is formed as a gate insulating film 3007 which becomes a cap film and also a gate insulating film so as to cover the surfaces of the island-shaped semiconductor film 3006 and the base insulating film 3002 (FIG. 22D). Thereafter, when the gate insulating film 3007 is irradiated with a CW laser or a pulse laser having a repetition rate of greater than or equal to 10 MHz, the semiconductor film is melted, crystals are grown in one plane orientation with cooling, and a quasi-single crystalline semiconductor film 3008 is formed.

By using the above second method, the cap film when forming the quasi-single crystalline semiconductor film 3008 can be used as the gate insulating film 3007. Note that, in this embodiment, the quasi-single crystalline semiconductor film is formed by this method and the cap film is directly used as the gate insulating film. Therefore, a gate insulating film 7006 formed over the quasi-single crystallized semiconductor films 7002 to 7005, which is shown in FIG. 27A, also serves as a cap film.

Note that the cap film 103 shown in FIGS. 5A to 5D or a cap film serving as the gate insulating film 3007 shown in FIGS. 22A to 22D are necessary to have transmissivity which is sufficient for a wavelength of a laser used in the above first or second method. In addition, since the cap film is in direct contact with the amorphous semiconductor film, it is preferable to use a material having a value of a thermal expansion coefficient or ductility which is close to the value thereof that the amorphous semiconductor film has. Although an example in which a silicon oxide film containing nitrogen is formed of only one layer as the cap film is described in this embodiment, the layer is not limited to one layer, and a plurality of layers each having a different kind of material may be formed as the cap film.

After forming the amorphous silicon film, as shown in Embodiment 7, heat treatment is performed after adding a catalyst element such as nickel, palladium, germanium, iron, tin, lead, cobalt, platinum, silver, copper, or gold to form a polycrystalline silicon film, a cap film is formed, and a laser beam is irradiated; accordingly, a quasi-single crystalline silicon film may be formed. In addition, laser beam irradiation may be performed in a step where crystallization is promoted by heat treatment after introducing the catalyst element, or a heat treatment step may be omitted. Alternatively, after the heat treatment, laser treatment may be performed keeping the temperature. By using the catalyst element, the quasi-single crystalline silicon film can be formed efficiently.

After the laser irradiation, if necessary, a minute amount of an impurity is added to the semiconductor film to control a threshold voltage, which is a so-called channel doping. In order to obtain the required threshold voltage, an impurity imparting n-type or p-type conductivity (such as phosphorus or boron) is added by an ion doping method or the like.

As shown in FIG. 27B, gate electrodes 7007 to 7010 are formed over the gate insulating film 7006. The gate electrodes 7007 to 7010 are formed by forming a metal film by a plasma CVD method or a sputtering method and etching the metal film into a desired shape. Alternatively, the gate electrodes may be directly formed on the gate insulating film by a printing method or a droplet discharging method typified by an ink-jet method which is capable of discharging a material in a predetermined direction.

The gate electrodes 7007 to 7010 may be a single layer or a plurality of layers of two or more layers. A conductive material, a structure, and a manufacturing method of the gate electrode can be appropriately selected.

In a case of forming the gate electrodes 7007 to 7010 by a plasma CVD method or a sputtering method, the gate electrodes 7007 to 7010 may be formed of an element of gold, silver, platinum, copper, tantalum, aluminum, molybdenum, tungsten, titanium, chromium, and niobium; a synthetic material containing the elements as its main component; or a compound material thereof. For example, the gate electrodes 7007 to 7010 can be formed of a stacked layer of Si and NiSi (nickel silicide) doped with an impurity imparting n-type conductivity such as phosphorus or a stacked layer of TaN (tantalum nitride) and W (tungsten). Alternatively, the gate electrodes 7007 to 7010 can be formed using an AgPdCu alloy.

When the gate electrodes 7007 to 7010 are formed by a droplet discharging method, a material in which a conductive material is dissolved or dispersed in a solvent is used as a material to be discharged. A material which is used for a conductive material can also contain at least one kind of metal such as gold, silver, copper, platinum, aluminum, chromium, palladium, indium, molybdenum, nickel, lead, iridium, rhodium, tungsten, cadmium, zinc, iron, titanium, zirconium, and barium, or an alloy of the above metals. As the solvent, esters such as butyl acetate and ethyl acetate, alcohols such as isopropyl alcohol and ethyl alcohol, and organic solvents such as methyl ethyl ketone or acetone, or the like can be used.

The viscosity of the composition discharged by a droplet discharging method is set to be less than or equal to 0.3 Pa·s. This is because the composition is prevented from drying or the composition is smoothly discharged from the discharge nozzle when being discharged. Note that the viscosity or the surface tension of the composition is appropriately adjusted in accordance with a solvent to be used or an intended purpose.

Subsequently, a high concentration impurity is added to the semiconductor film using the gate electrodes 7007 to 7010 as masks (FIG. 27C). Accordingly, a thin film transistor including the semiconductor films 7002 to 7005 where quasi-single crystals are obtained, the gate insulating film 7006, and the gate electrodes 7007 to 7010 are formed.

Next, an impurity element is added to each of the semiconductor films 7002 to 7005 where quasi-single crystals are obtained by using the gate electrodes 7007 to 7010 as masks (FIG. 28A). The impurity element can impart one conductivity type to the semiconductor film. As the impurity element imparting n-type conductivity, phosphorus or the like is typically given, and as the impurity element imparting p-type conductivity, boron or the like is typically given. When a first electrode of the light-emitting element serves as an anode, the impurity element imparting p-type conductivity is selected, whereas, when the first electrode of the light-emitting element serves as a cathode, the impurity element imparting n-type conductivity is selected.

Thereafter, an insulating film (hydrogenation film) 7011 is formed of silicon nitride ($SiN_x$) by covering the gate insulating film 7006 (FIG. 28B). After forming the insulating film (hydrogenation film) 7011, heat treatment is performed at 480° C. for approximately an hour to activate the impurity element and hydrogenate the semiconductor film. The insulating film can be formed of an insulating film containing at least oxygen or nitrogen, such as a silicon oxide ($SiO_x$) film, a silicon oxide film containing nitrogen, or a silicon nitride film containing oxygen, without being limited to a silicon nitride film.

As shown in FIG. 29A, an interlayer insulating film 7012 which covers the insulating film (hydrogenation film) 7011 is formed to increase flatness. The interlayer insulating film 7012 can be formed using an organic material or an inorganic material. As the organic material, polyimide, acrylic, polyamide, polyimide amide, benzocyclobutene, siloxane, or the like can be used. Siloxane has a structure, as its basic unit, which is formed of a bond of silicon and oxygen represented by —Si—O—Si—, where fluorine, aliphatic hydrocarbon, aromatic hydrocarbon, and the like are combined with silicon. As the inorganic material, an insulating film having at least oxygen or nitrogen such as a silicon oxide ($SiO_x$) film, a silicon nitride ($SiN_x$) film, a silicon oxide film containing nitrogen, or a silicon nitride film containing oxygen can be used. In addition, as a material for the interlayer insulating film 7012, polysilazane (an inorganic polymer which has a structure of —($SiH_2NH$)— as a basic unit and forms a ceramic insulator by heating) can be used. Moreover, a complex of polysilazane and an organic material may be used as the interlayer insulating film 7012.

The interlayer insulating film 7012 may be a stacked layer of the above insulating film. In particular, when the insulating film is formed of the organic material, the flatness is increased; however, moisture or oxygen is absorbed by the organic material in some cases. In order to prevent moisture or oxygen from being absorbed by the insulating film, an insulating film 7012 may be obtained by forming an insulating film formed using an inorganic material (hereinafter, referred to as an inorganic insulating film) over an insulating film formed using an organic material (hereinafter, referred to as an organic insulating film). Furthermore, the interlayer insulating film 7012 may be obtained by alternately stacking the organic insulating film and the inorganic insulating film to form three or more layers.

Note that heat treatment after forming the insulating film (hydrogenation film) 7011 may be performed after forming the interlayer insulating film 7012.

Thereafter, a contact hole is formed in the interlayer insulating film 7012, the insulating film (hydrogenation film) 7011, and the gate insulating film 7006, and a wiring 7013 which is connected to a source region and a drain region, a connection portion 7014, and an electrode which becomes a terminal electrode 7018 later are formed (FIG. 29A). Each of the wiring 7013, the connection portion 7014, and the electrode which becomes the terminal electrode 7018 later may be a single layer formed using a material such as aluminum, copper, an alloy of aluminum, carbon, and nickel, or an alloy of aluminum, carbon, and molybdenum. Alternatively, each of the wiring 7013, the connection portion 7014, and the electrode which becomes the terminal electrode 7018 later may be a stacked layer of molybdenum, aluminum, and molybdenum from the substrate side, a stacked layer of titanium, aluminum, and titanium from the substrate side, or a stacked layer of titanium, titanium nitride, aluminum, and titanium from the substrate side.

Next, a conductive layer having a light-transmitting property is formed. The conductive layer is processed to form a first electrode 7017 of a thin film light-emitting element (an anode or a cathode of the light-emitting element). Here, the first electrode 7017 and the connection portion 7014 are electrically connected to each other.

A material of the first electrode 7017 can be exemplified below: a metal having conductivity such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), or titanium (Ti); an alloy such as an alloy formed of aluminum and silicon (Al—Si), an alloy formed of aluminum and titanium (Al—Ti), an alloy formed of aluminum, silicon, and copper (Al—Si—Cu); nitride of a metal material such as titanium nitride (TiN); or a metal compound such as indium tin oxide (ITO), indium tin silicon oxide (ITSO), or indium zinc oxide (IZO); or the like.

Note that an electrode through which light emission is extracted is preferably formed using a conductive film having a light-transmitting property. Specifically, an ultra thin film of metal such as aluminum or silver is used as well as a metal compound such as indium tin oxide (ITO), indium tin silicon oxide (ITSO), or indium zinc oxide (IZO). In this embodiment, light emission is extracted through the first electrode 7017; therefore, the first electrode 7017 is formed using indium tin silicon oxide (ITSO), whereas, when light emission is not extracted through the first electrode 7017, the first electrode 7017 can be formed using a material having high reflectivity (aluminum, silver, or the like).

Note that, after forming the wiring 7013, the connection portion 7014, and the electrode which becomes the terminal electrode 7018 later, an insulating film 7016 containing an insulating inorganic material may be formed of a single layer or plural layers before forming the first electrode 7017 (FIG. 30A). The insulating film 7016 can be formed using an inorganic insulating film such as a silicon oxide film, a silicon nitride film, or a silicon oxide film containing nitrogen by a sputtering method, an LPCVD method, a plasma CVD method, or the like. By forming the insulating film 7016 as described above, the TFT or the wiring 7013 of the driver circuit portion 7032 can be prevented from being exposed and protected.

Thereafter, an insulating film is formed covering the first electrode 7017, the wiring 7013, and the interlayer insulating film 7012, and the obtained insulating film is formed into a pattern to form an insulating film 7015 which covers an end of the first electrode 7017 (FIG. 29A and FIG. 30A). As a material of the insulating film 7015, acrylic, polyimide, siloxane, or the like having self-flatness can be used. In this embodiment, siloxane is used as the material of the insulating film 7015.

Thereafter, a layer containing a light-emitting substance (hereinafter, referred to as a light-emitting layer 7019) is formed, and a second electrode 7020 (a cathode or an anode) which covers the light-emitting layer 7019 is formed (FIG.

29B and FIG. 30B). Accordingly, a light-emitting element having a structure including the light-emitting layer 7019 between the first electrode 7017 and the second electrode 7020 can be manufactured. A material for forming the second electrode 7020 is to the same as the material for forming the first electrode 7017. In this embodiment, aluminum is used for forming the second electrode 7020.

Note that, although the first electrode 7017 and the second electrode 7020 may each be an anode or a cathode, the material is necessary to be selected in consideration of a work function. It is preferable to use a material having a high work function (specifically, greater than or equal to 4.0 eV) for the anode, whereas it is preferable to use a material having a low work function (specifically, less than or equal to 3.8 eV) for the cathode. However, by using an electron injecting layer having a high electron injecting property, the cathode can be formed of a material having a high work function, that is, a raw material which is normally used for the anode.

In addition, the light-emitting layer 7019 is formed by an evaporation method, a spin coating method, a dip coating method, a droplet discharging method typified by an ink-jet method, or the like. A low molecular material, a high molecular material, and a middle molecular material having a property between the low molecular and the high molecular are used for the light-emitting layer 7019. Since the light-emitting layer 7019 is formed by an evaporation method, the low molecular material is used in this embodiment. By being dissolved in a solvent, both the low molecular material and the high molecular material can be coated by a spin coating method or a droplet discharging method. Moreover, not only an organic material but also a composite material with an inorganic material can be used.

Next, a silicon oxide film containing nitrogen is formed by a plasma CVD method as a first passivation film 7029. When the silicon oxide film containing nitrogen is used, a silicon oxide film containing nitrogen formed using $SiH_4$, $N_2O$, and $NH_3$, a silicon oxide film containing nitrogen formed using $SiH_4$ and $N_2O$, or a silicon oxide film containing nitrogen formed using a gas in which $SiH_4$ and $N_2O$ are diluted with Ar may be used.

In addition, as the material for the first passivation film 7029, a silicon oxynitride hydride film formed using $SiH_4$, $N_2O$, and $H_2$ can be used. It is needless to say that the passivation film 7029 is not limited to a single layer, and the passivation film 7029 may be a single layer of other insulating film containing silicon, or a stacked layer thereof. A multilayer film of carbon nitride film and a silicon nitride film, a multilayer film of styrene polymer, a silicon nitride film, or a diamond like carbon film may be used instead of the silicon oxide film containing nitrogen.

Next, a display portion is sealed in order to protect the light-emitting element from a substance such as water promoting deterioration of the light-emitting element. When a counter substrate 7021 is used for sealing, the counter substrate 7021 is attached by using an insulating sealant 7022 so as to expose a terminal 7023 which is connected to outside. A space between the counter substrate 7021 and the substrate 7000 may be filled with an inert gas such as dried nitrogen. Alternatively, the counter substrate 7021 may be attached after the sealant 7022 is coated over the entire surface. It is preferable to use an ultraviolet curable resin or the like for the sealant 7022. In addition, a drying agent or a particle for keeping a gap between the substrates constant may be mixed into the sealant 7022. Subsequently, by attaching a flexible printed circuit 7024 (FPC) to the terminal 7023, the light-emitting device is completed.

Figure 31:
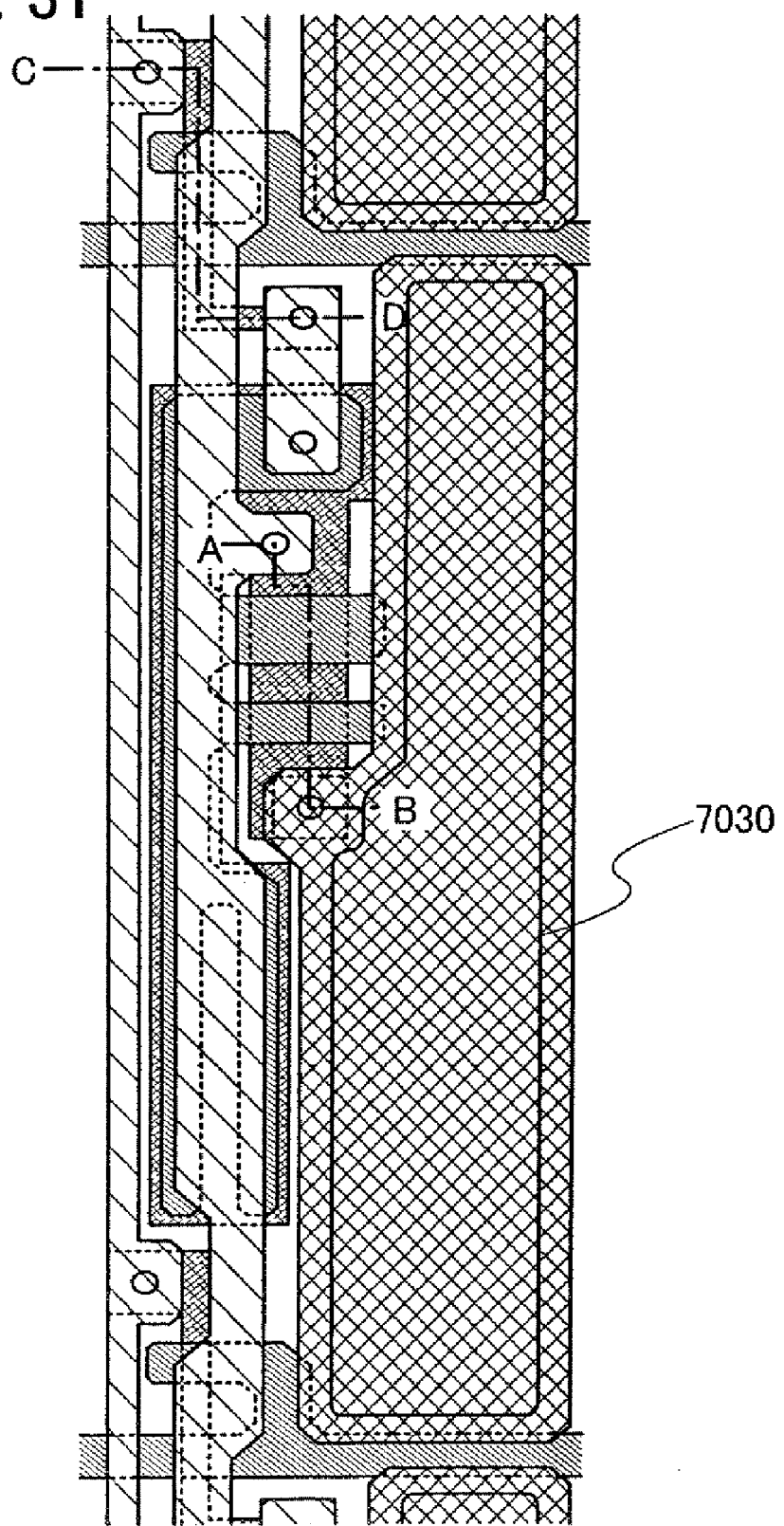
FIG. 31 is a view explaining an example of a manufacturing method of a semiconductor device using the present invention.

Note that FIG. 31 shows a top view of the pixel portion 7033, and a cross section taken along a dashed line A-B in FIG. 31 corresponds to a cross section of a driving TFT 7025 of the pixel portion 7033 in FIG. 29B and FIG. 30B. A cross section taken along a chained line C-D in FIG. 31 corresponds to a cross section of a switching TFT 7026 of the pixel portion 7033 in FIGS. 29B and 30B. A solid line shown by 7030 in FIG. 31 indicates the periphery of the insulating film 7015. In FIG. 29B, FIG. 30B, and FIG. 31, an example of the light-emitting device formed using the present invention is shown, and a structure such as a wiring can be appropriately changed by layout.

In addition, in the light-emitting device, a light emission display surface of the light-emitting device may be one surface or both surfaces. When the first electrode 7017 and the second electrode 7020 are each formed of a transparent conductive film, light emitted from the light-emitting element is extracted from the both sides through the substrate and the counter substrate. In this case, it is preferable to use a transparent material for the substrate 7000 and the counter substrate 7021.

When the first electrode 7017 is formed of a metal film and the second electrode 7020 is formed of a transparent conductive layer, light emitted from the light-emitting element is extracted from one side through the counter substrate 7021, which is a top emission type. In this case, it is not necessary to form the substrate 7000 by using a transparent material.

Whereas, when the second electrode 7020 is formed of a metal film and the first electrode 7017 is formed of a transparent conductive layer, light emitted from the light-emitting element is extracted from one side through only the substrate 7000, which is a bottom emission type. In this case, it is not necessary to form the counter substrate 7021 or a filling material 7028 by using a transparent material.

This embodiment can be used by being appropriately combined with Embodiment Mode and other embodiments.

Embodiment 13

In this embodiment, a TFT can also be used as a thin film integrated circuit device or a non-contact thin film integrated circuit device (also referred to as a wireless IC tag or RFID (radio frequency identification)). By combining with the manufacturing method shown in other embodiments, the thin film integrated circuit device or the non-contact thin film integrated circuit device can be used as a tag or a memory.

Plane orientations of crystal grains in a quasi-single crystalline semiconductor film of the present invention are aligned in one direction. Therefore, it is possible to manufacture, with high yield, a semiconductor device capable of high speed operation with high current driving capacity and small variation of characteristics between elements. Since the thin film integrated circuit is expected to be in great demand in the future, it is necessary to manufacture a product having high performance with high yield. Therefore, it is extremely effective to use the quasi-single crystalline semiconductor film of the present invention. An example thereof will be explained.

This embodiment will describe an example of using a TFT which is insulated as a semiconductor element used for an integrated circuit of a wireless IC tag. The semiconductor element which can be used for the integrated circuit of the wireless IC tag is not limited to the and other element can also be used. For example, a memory element, a diode, a photoelectric conversion element, a resistor element, a coil, a capacitor element, or an inductor can be typically given.

Moreover, these elements can be formed using the quasi-single crystalline semiconductor film of the present invention.

A manufacturing method of the wireless IC tag is explained with reference to the following drawings. In practice, after multiple semiconductor elements are simultaneously formed over a substrate having one side of over 1 m, the elements over the substrate are separated into individual semiconductor elements each of which is sealed; accordingly, the wireless IC tag is manufactured.

Figure 32A:
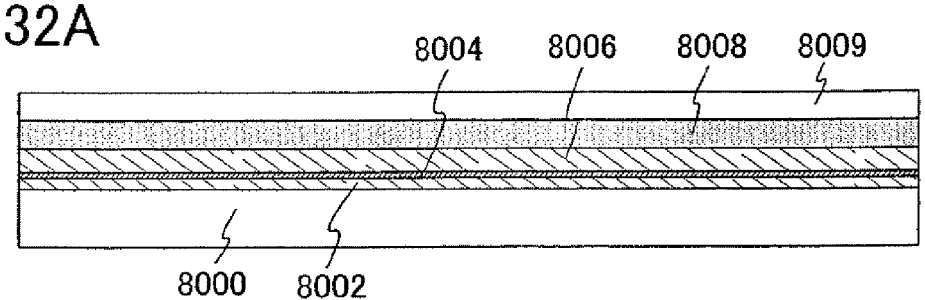
FIGS. 32A to 32 D are views each explaining an example of a manufacturing method of a semiconductor device using the present invention.

First, as shown in FIG. 32A, a first substrate 8000 is prepared. As the first substrate 8000, a glass substrate such as a barium borosilicate glass substrate or an alumina borosilicate glass substrate, a quartz substrate, or the like can be used. Besides, plastic typified by polyethylene terephthalate (PET), polyethylene naphthalate (PEN), and polyethersulfone (PES), or a flexible synthetic resin such as acrylic may be used. The synthetic resin can be used as the substrate as long as the synthetic resin can withstand a processing temperature in a manufacturing process of the wireless IC tag.

If the first substrate 8000 is formed of the material as described above, there is no large limitation to its dimension and shape. Accordingly, when the first substrate 8000 has one side of greater than or equal to 1 m and is rectangular, for example, productivity can be dramatically improved. Such an advantage is an excellent advantage as compared with a case of using a circular silicon substrate.

The surface of the substrate formed of the above material may be flattened by polishing by a CMP method or the like. For example, a glass substrate, a quartz substrate, or a semiconductor substrate which is polished to be thin may be used.

After the first substrate 8000 is prepared, an insulating film 8002 is formed over the first substrate 8000 (FIG. 32A). The insulating film 8002 can be formed of a single layer of an insulating film such as a silicon oxide ($SiO_x$) film, a silicon nitride ($SiN_x$) film, a silicon oxide film containing nitrogen, or a silicon nitride film containing oxygen, or a stacked layer thereof. In this embodiment, a silicon oxide film containing nitrogen is formed to have a thickness of 100 nm as the insulating film 8002. Moreover, the insulating film 8002 may also be oxidized or nitrided by performing high density plasma treatment.

The high density plasma is generated by using a microwave of, for example, 2.45 GHz. Specifically, high density plasma of which electron density is $10^{11}$ to $10^{13}/cm^3$, an electron temperature is less than or equal to 2 eV, and an ion energy is less than or equal to 5 eV is used. Since such high density plasma having the low electron temperature as its characteristic has a low kinetic energy of active species, a film having few defects can be formed with few plasma damages as compared with conventional plasma treatment. A plasma treatment apparatus for microwave excitation using a radial slot antenna can be used to generate the plasma. A distance between an antenna for generating a microwave and the first substrate 8000 is set to be 20 to 80 mm (preferably 20 to 60 mm).

Next, a peeling layer 8004 is formed (FIG. 32A). The peeling layer 8004 can be formed of a metal film, a stacked layer of a metal film and a metal oxide film, or the like. The metal film is formed of a film formed of an element of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), and iridium (Ir); an alloy material containing the element as its main component; or a compound material thereof to have a single-layer or stacked-layer structure. In addition, these materials can be formed using a known method (a sputtering method or various CVD methods such as a plasma CVD method). Note that a tungsten film is formed to have a thickness of 30 nm by a plasma CVD method in this embodiment.

When the peeling layer 8004 is formed, oxide, nitride, or oxynitride is formed over its surface. The compound has high reaction rate with an etching gas, especially chlorine trifluoride ($ClF_3$); thus, the compound can be peeled easily in a short time. In other words, the peeling is possible if any one of metal, metal oxide, metal nitride, and metal nitride oxide is removed.

In addition, when the oxide, the nitride, or the nitride oxide is formed over the surface of the peeling layer 8004, the chemical state may change. For example, when an oxide film having tungsten (W) is formed, the valence of tungsten oxide ($WO_x$ (x=2 to 3)) changes. As a result, the oxide film is in such a state that the oxide film is easily peeled by physical means. In the combination of chemical means and physical means, the oxide film can be removed more easily in a short time.

After forming the peeling layer 8004, an insulating film 8006 serving as a base insulating film is formed. In this embodiment, a silicon oxide film is formed to have a thickness of 200 nm by a sputtering method.

Next, a semiconductor film 8008 is formed. Although an amorphous semiconductor film may be formed as the semiconductor film 8008, a microcrystalline semiconductor film or a crystalline semiconductor film may also be used. Although a material of the semiconductor film is not limited, it is preferable to use silicon or silicon germanium (SiGe). In this embodiment, an amorphous silicon film is formed to have a thickness of 66 nm. After forming the semiconductor film 8008, a step of removing hydrogen contained in the semiconductor film 8008 may be performed. Specifically, the semiconductor film 8008 may be heated at 500° C. for an hour.

Moreover, a silicon oxide film containing nitrogen is formed to have a thickness of 300 nm as a cap film 8009. A silicon oxide film may be used to form the cap film 8009. As in other embodiments, the cap film can be formed by a plasma CVD method or a sputtering method.

Figure 32B:
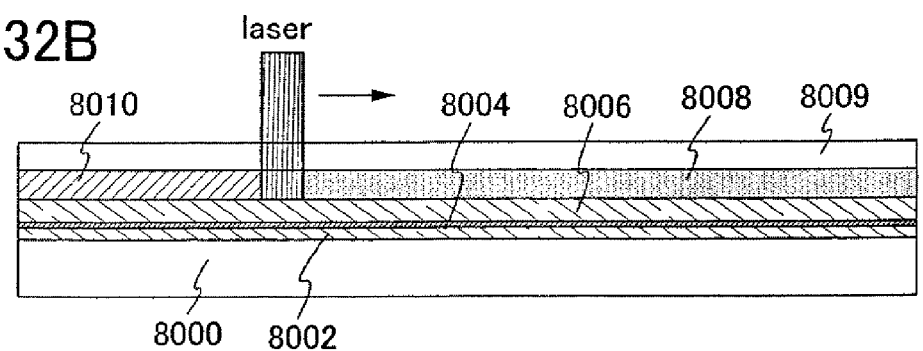

Here, a quasi-single crystal is obtained in the semiconductor film 8008 by being irradiated with a laser beam by using a laser irradiation apparatus (FIG. 32B). In this embodiment, a second harmonic of an Nd:$YVO_4$ laser with a $TEM_{00}$ mode (single transverse mode) oscillation having an energy of 10 W is used. The laser is converged and formed into linear by using an optical system, and is irradiated at a scanning speed of approximately 10 to several 100 cm/sec.

By using the method, the semiconductor film 8008 of a region irradiated with the laser beam is completely melted. Then, crystals are grown in one plane orientation in a stage of cooling; thus, a quasi-single crystal is formed.

Although the laser beam is irradiated from the cap film 8009 side in FIG. 32B, the laser beam may be irradiated from the first substrate 8000 side as described in Embodiment 10. In this case, the peeling layer 8004 becomes a light absorption layer and absorbs the laser beam, which generates heat, and the semiconductor film 8008 is crystallized indirectly by the generated heat.

As a type of laser which can be used here, one or more of a gas laser such as an Ar laser, a Kr laser, or an excimer laser; a laser using, as a medium, a single crystal of YAG, $YVO_4$, forsterite ($Mg_2SiO_4$), $YAlO_3$, or $GdVO_4$, or a polycrystal (ceramic) of YAG, $Y_2O_3$, $YVO_4$, $YAlO_3$, or $GdVO_4$ doped with one or more kinds of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser can be used.

Note that, as for a laser using, as a medium, a single crystal of YAG, YVO$_4$, forsterite (Mg$_2$SiO$_4$), YAlO$_3$, or GdVO$_4$ or a polycrystal (ceramic) of YAG, Y$_2$O$_3$, YVO$_4$, YAlO$_3$, or GdVO$_4$ doped with one or more kinds of Nd, Yb, Cr, Ti, Ho, Er, Tm, and Ta as a dopant; an Ar ion laser; or the Ti:sapphire laser, continuous wave oscillation is possible, and besides, pulse oscillation at a repetition rate of greater than or equal to 10 MHz is also possible by performing Q-switch operation, mode locking, or the like. When laser beam oscillation at a repetition rate of greater than or equal to 10 MHz is performed, the semiconductor film is irradiated with a next pulse until the semiconductor film is solidified after being melted by laser. Accordingly, different from a case of using a pulse laser having a lower repetition rate, the solid-liquid interface in the semiconductor film can be continuously moved; thus, crystal grains grown continuously in the scanning direction can be obtained.

When a ceramic (polycrystal) is used as the medium of the laser, the medium can be formed in any shapes at low cost in a short time. While a columnar medium of several mm in diameter and several tens mm in length is generally used when a single crystal is used, a larger medium in size can be formed when ceramic is used.

Since the concentration of the dopant such as Nd or Yb which directly contributes to light emission in the medium is not able to be significantly changed even in a single crystal or a polycrystal, improvement in laser output by increasing the concentration is limited to some extent. However, when ceramic is used, drastic improvement in output can be realized because the concentration of the medium can be significantly increased as compared with a single crystal.

Furthermore, when the ceramic is used, a medium in a parallel hexahedron shape or a cuboid shape can be easily formed. When a medium in such a shape is used to make emitted light travel in zigzags within the medium, the emitted light path can be made longer. Therefore, the amplification is increased, and oscillation with large output is possible. In addition, a laser beam that is emitted from a medium in such a shape has a cross section of a quadrangular shape when the beam is emitted, and is, therefore, advantageous in shaping into a linear beam as compared with a circular shape. Shaping thus emitted laser beam with the use of an optical system makes it possible to easily obtain a linear laser beam that has a shorter side of less than or equal to 1 mm in length and a longer side of several mm to several m in length. In addition, irradiating the medium uniformly with excitation light makes the linear beam have a uniform energy distribution in the longer side direction.

Note that crystallization is performed more preferably when a laser crystallization method of this embodiment is combined with a crystallization method using a metal element that promotes crystallization (such as nickel (Ni), germanium (Ge), iron (Fe), palladium (Pd), tin (Sn), lead (Pb), cobalt (Co), platinum (Pt), copper (Cu), or gold (Au)).

Figure 32C:
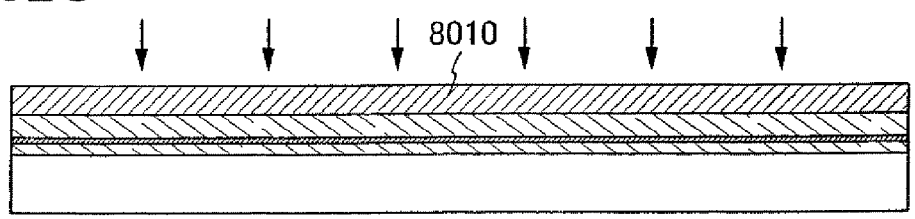

Next, the cap film 8009 is removed by etching, and a quasi-single crystalline film 8010 is doped with an impurity element imparting p-type conductivity. Here, boron (B) is doped as the impurity element (FIG. 32C).

Figure 32D:
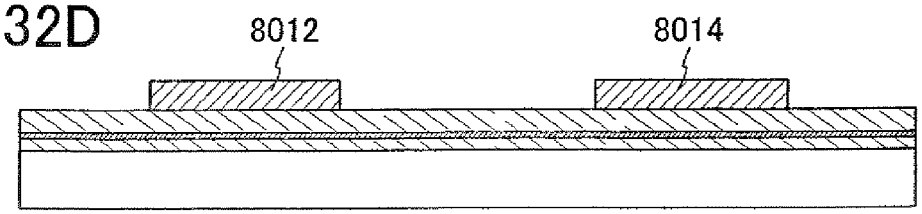

Then, the quasi-single crystalline film 8010 is selectively etched, and a first semiconductor film 8012 and a second semiconductor film 8014 are formed (FIG. 32D).

Figure 33A:
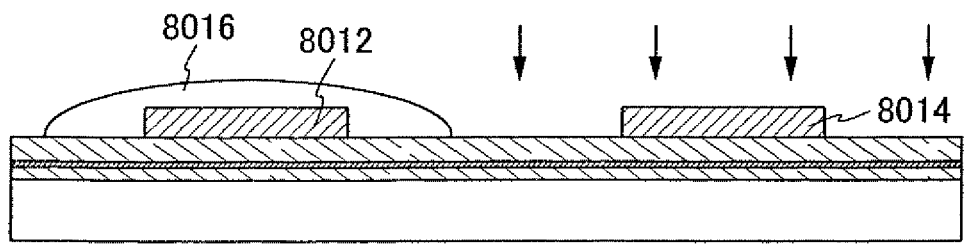
FIGS. 33A to 33D are views each explaining an example of a manufacturing method of a semiconductor device using the present invention.

Subsequently, a resist mask 8016 is formed so as to cover the first semiconductor film 8012, and thereafter the second semiconductor film 8014 is doped with an impurity element imparting p-type conductivity (FIG. 33A). In this embodiment, the second semiconductor film 8014 is doped with boron (B) as the impurity element.

Figure 33B:
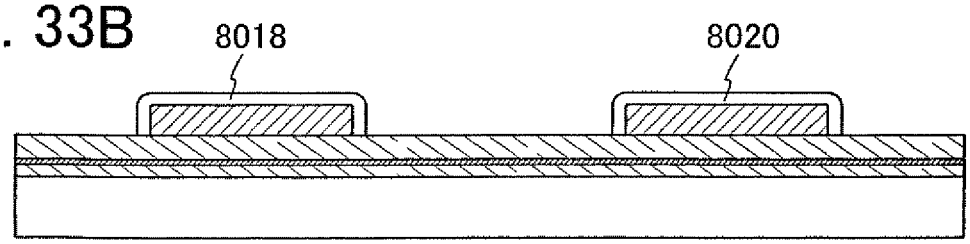

Then, the resist mask 8016 is removed, and plasma treatment is performed to the first semiconductor film 8012 and the second semiconductor film 8014 to oxidize and nitride the first semiconductor film 8012 and the second semiconductor film 8014; accordingly, first insulating films 8018 and 8020 (an oxide film or a nitride film) are formed over the surfaces of the first semiconductor film 8012 and the second semiconductor film 8014 (FIG. 33B). In this embodiment, the plasma treatment is performed in an atmosphere containing oxygen to oxidize the first semiconductor film 8012 and the second semiconductor film 8014, and silicon oxide (SiO$_x$) films are formed as the first insulating films 8018 and 8020. When silicon nitride films are formed as the first insulating films 8018 and 8020, the plasma treatment may be performed in a nitrogen atmosphere.

In general, since a silicon oxide film or a silicon oxide film containing nitrogen which is formed by a CVD method or a sputtering method has a defect inside the film, the film quality is not sufficient. Therefore, by performing the plasma treatment to the first semiconductor film 8012 and the second semiconductor film 8014 in an oxygen atmosphere to oxidize the surface, an insulating film denser than an insulating film formed by a CVD method, a sputtering method, or the like can be formed over the first semiconductor film 8012 and the second semiconductor film 8014.

In addition, when a conductive film is provided above the first semiconductor film 8012 and the second semiconductor film 8014 through the insulating film formed by a CVD method or a sputtering method, a coating defect due to disconnection or the like of the insulating film at ends of the first semiconductor film 8012 and the second semiconductor film 8014 may be generated, and a short-circuit or the like may occur between the semiconductor film and the conductive film. However, by oxidizing or nitriding the surfaces of the first semiconductor film 8012 and the second semiconductor film 8014 by plasma treatment in advance, generation of a coating defect of the insulating film at the ends of the first semiconductor film 8012 and the second semiconductor film 8014 can be suppressed.

Next, a second insulating film 8022 is formed so as to cover the first insulating films 8018 and 8020. A material of the second insulating film 8022 is a silicon nitride (SiN$_x$) film or a silicon nitride film containing oxygen. Here, a silicon nitride film is formed to have a thickness of 4 to 20 nm as the second insulating film 8022 (FIG. 33C).

Figure 33C:
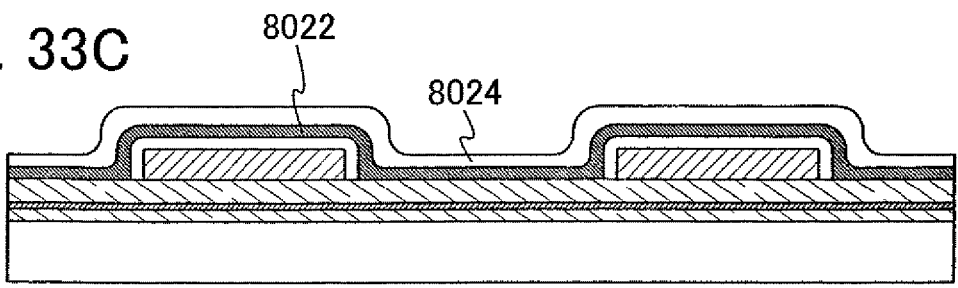

Then, plasma treatment is performed to the second insulating film 8022 in an oxygen atmosphere to oxidize the surface of the second insulating film 8022, and then a third insulating film 8024 is formed (FIG. 33C). Note that the plasma treatment can be performed under the above condition. Here, as the third insulating film 8024, a silicon oxide film or a silicon oxide film containing nitrogen is formed to have a thickness of 2 to 10 nm over the surface of the second insulating film 8022 by the plasma treatment.

Figure 33D:
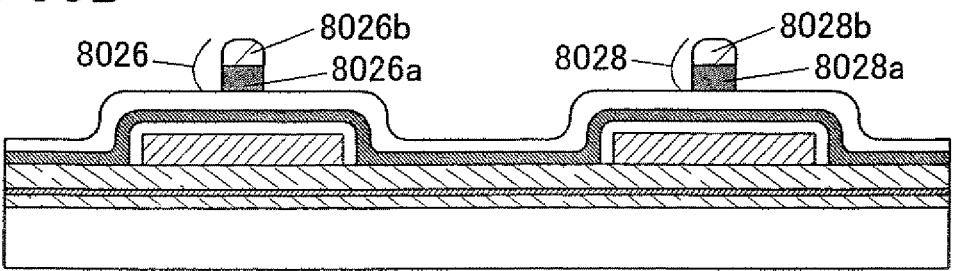

Next, conductive films 8026 and 8028 each serving as a gate electrode are formed above the first semiconductor film 8012 and the second semiconductor film 8014 (FIG. 33D). Note that the conductive film 8026 here has a stacked-layer structure of first conductive films 8026a and a second conductive film 8026b, and the conductive film 8028 has a stacked-layer structure of a first conductive film 8028a and a second conductive film 8028b. Here, tantalum nitride is used for the first conductive films 8026a and 8028a, and tungsten is used for the second conductive films 8026b and 8028b to have a stacked-layer structure. Further, the conductive film which can be used as a gate electrode may be formed in a single layer. In addition, the material for the conductive film is not limited to the above material, and an alloy containing one or more of elements of tantalum (Ta), tungsten (W), titanium (Ti), molybdenum (Mo), aluminum (Al), copper (Cu), chromium (Cr), niobium (Nb), and the like, or a compound containing the elements can be used. In addition, a semiconductor material typified by polycrystalline silicon doped with an impurity element such as phosphorus can also be used. Moreover, the gate electrode can be formed of a crystalline semiconductor film. In that case, the quasi-single crystalline semiconductor film of the present invention can also be used.

Figure 34A:
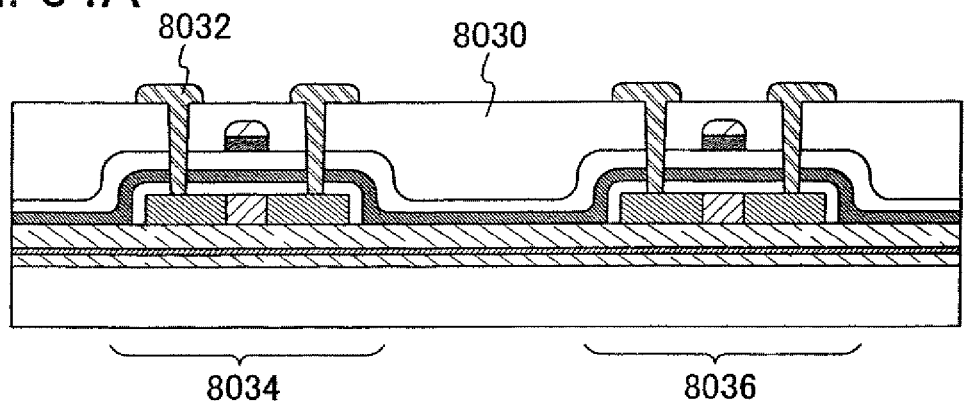
FIGS. 34A and 34B are views each explaining an example of a manufacturing method of a semiconductor device using the present invention.

Next, an impurity element imparting p-type conductivity is introduced to the first semiconductor film 8012 by using the conductive film 8026 as a mask, and an impurity element imparting n-type conductivity is introduced to the second semiconductor film 8014 by using the conductive film 8028 as a mask. By this process, a source region and a drain region are formed. Thereafter, an insulating film 8030 is formed covering the conductive films 8026 and 8028 (FIG. 34A).

A conductive film 8032 is formed over the insulating film 8030 so as to be electrically connected to a source region or a drain region of the first semiconductor film 8012. A p-type thin film transistor 8034 using the first semiconductor film 8012 as a channel formation region and an n-type thin film transistor 8036 using the second semiconductor film 8014 as a channel formation region are provided (FIG. 34A). Note that, although an example of manufacturing a top gate (planar) TFT is shown in this embodiment, the present invention can also be used in manufacturing a TFT such as a bottom gate (inversely staggered) TFT.

Here, it is preferable to form the first semiconductor film 8012, the second semiconductor film 8014, and the conductive film 8032 (that is a wiring) which is formed simultaneously with these semiconductor films so that the corners are rounded when seen from an upper surface of the first substrate 8000. A state in which the corner of the wiring is formed to be rounded is schematically shown in FIGS. 37A and 37B.

Figure 37A:
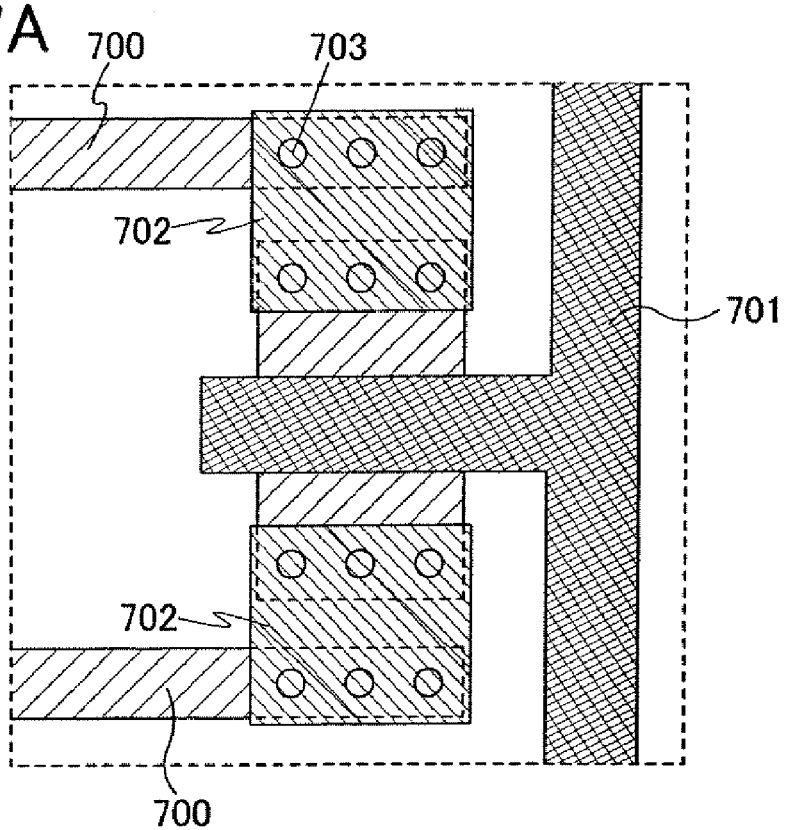
FIGS. 37A and 37B are views each explaining an example of a manufacturing method of a semiconductor device using the present invention.
Figure 37B:
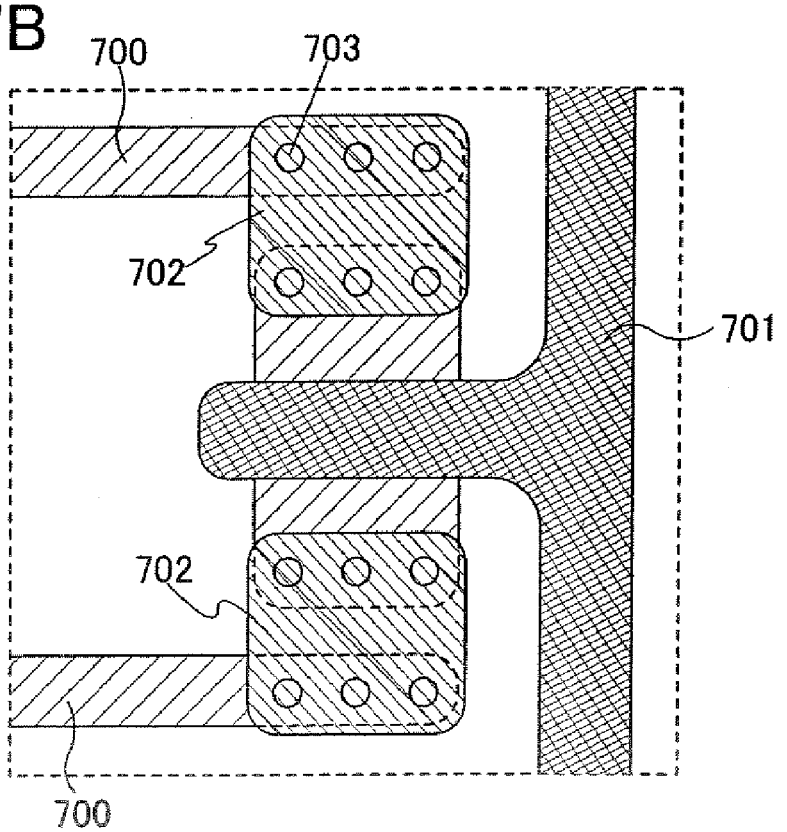

FIG. 37A shows a conventional formation method, and a wiring a 700, a wiring b 701, a wiring c 702, and a semiconductor film each have an angulate corner. FIG. 37B shows a state in which the wiring a 700, the wiring b 701, the wiring c 702, and the semiconductor film each have a rounded corner. When the corners are rounded as shown in FIG. 37B, dust generated in forming the wiring can be prevented from remaining at the corner of the wiring. Therefore, defects of the semiconductor device due to dust are reduced, and yield can be improved. Note that circles in FIGS. 37A and 37B indicate a contact hole 703.

Figure 34B:
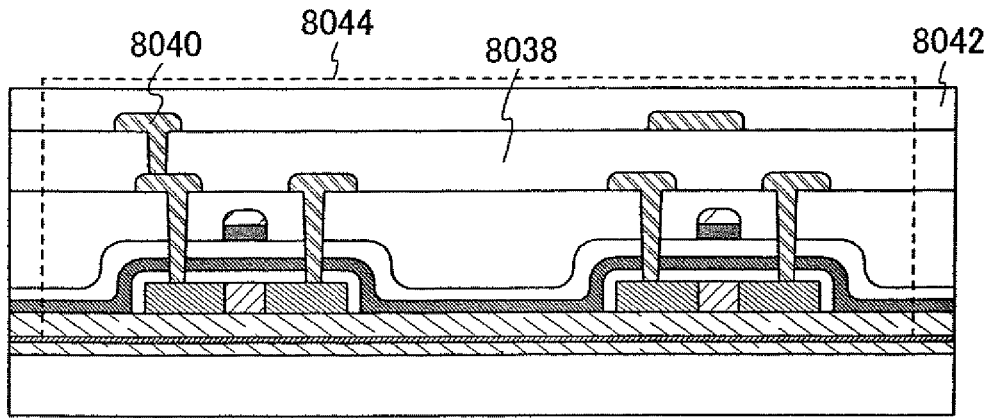

Next, an insulating film 8038 is formed so as to cover the conductive film 8032, a conductive film 8040 serving as an antenna is formed thereover, and an insulating film 8042 is formed so as to cover the conductive film 8040 (FIG. 34B). Note that the conductive films or the like provided above the thin film transistors 8034 and 8036 (a region surrounded by a dashed line) are referred to as an element group 8044 together.

Each of the insulating films 8030, 8038, and 8042 may be a single layer or a plurality of layers, and may be formed of the same material or a different material. As the material, (1) an insulating film such as a silicon oxide ($SiO_x$) film, a silicon nitride ($SiN_x$) film, a silicon oxide film containing nitrogen, or a silicon nitride film containing oxygen, (2) a film containing carbon such as DLC (diamond like carbon), (3) an organic material such as epoxy, polyimide, polyamide, polyvinyl phenol, benzocyclobutene, or acrylic, a siloxane based material, or the like can be given.

In addition, the above material given in (3) can be formed by a spin coating method, a droplet discharging method, a printing method, or the like; therefore, flattening can be performed efficiently and reduction in processing time can be attempted. Furthermore, the insulating films 8030, 8038, and 8042 can also be oxidized or nitrided by performing plasma treatment.

The conductive film 8040 can be formed using a conductive material having one or more of a metal such as copper (Cu), aluminum (Al), silver (Ag), gold (Au), chromium (Cr), molybdenum (Mo), titanium (Ti), tantalum (Ta), tungsten (W), nickel (Ni), and carbon (C), or metal compounds containing the above metals.

Figure 35A:
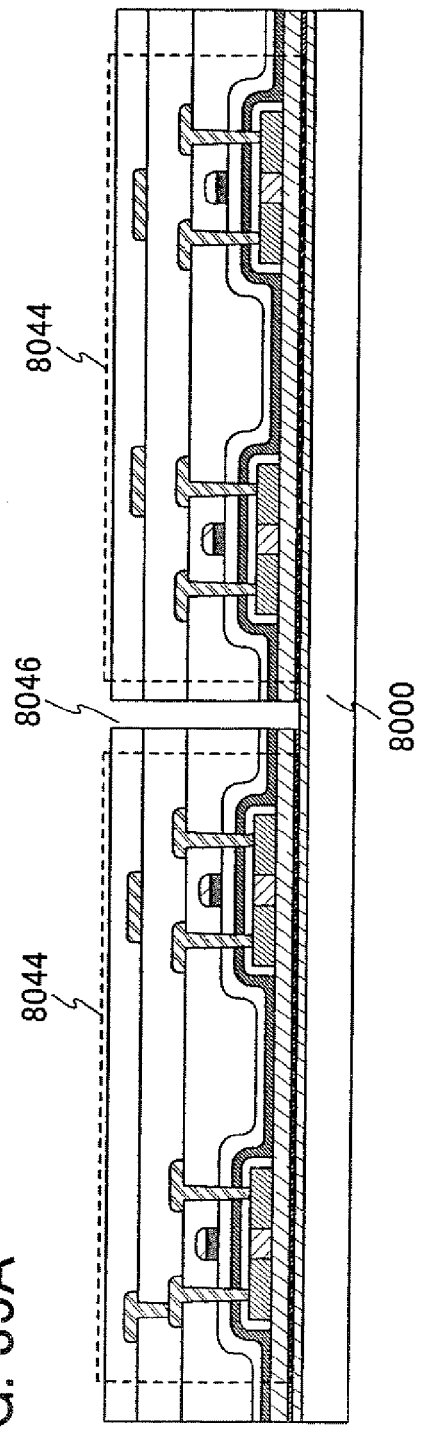
FIGS. 35A and 35B are views each explaining an example of a manufacturing method of a semiconductor device using the present invention.

Next, an opening 8046 is formed in a region avoiding the element group 8044 by a laser irradiation method or the like to expose the peeling layer 8004, and etchant is introduced from the opening 8046 to remove the peeling layer 8004 (FIG. 35A). All of the peeling layer 8004 may be removed, or part thereof may be left without removing the peeling layer 8004 completely. By leaving the peeling layer 8004, the thin film transistors 8034 and 8036 can be maintained over the first substrate 8000 even after the peeling layer 8004 is removed by the etchant; thus, handling in a later process becomes easy. As the etchant, halogen fluoride such a chlorine trifluoride gas, or a gas or a liquid containing halogen can be used. For example, $CF_4$, $SF_6$, $NF_3$, $F_2$, or the like can be used.

Figure 35B:
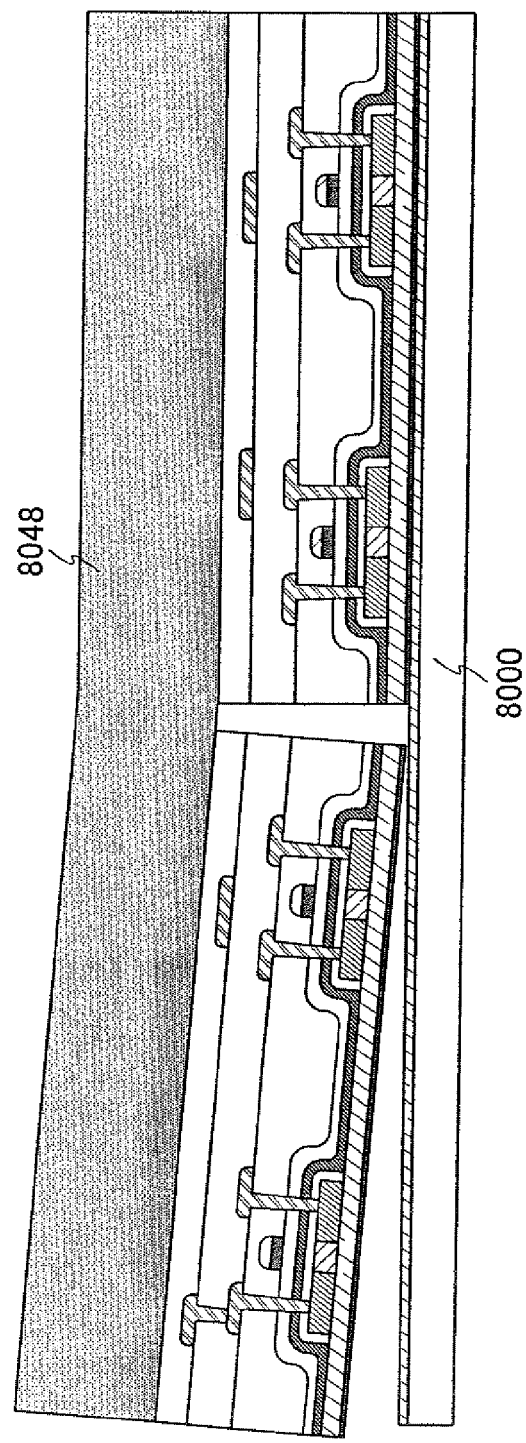

Next, a first sheet material 8048 having an adhesion property is bonded to the insulating film 8042, and the element group 8044 is peeled from the first substrate 8000 (FIG. 35B).

The first sheet material 8048 is bonded in order to maintain mechanical strength of the element group 8044 which is peeled in the following step after this. Therefore, it is preferable that a thickness of the first sheet material 8048 is greater than or equal to 50 μm. A flexible film can be used for the first sheet material 8048, and at least one of surfaces of the first sheet material 8048 has an adhesive agent. As an example of the first sheet material 8048, a base material using polyester, which has an adhesion surface provided with an adhesive agent, can be used. As the adhesive agent, a resin material containing an acrylic resin or the like, or a material containing a synthetic rubber material can be used.

Figure 36A:
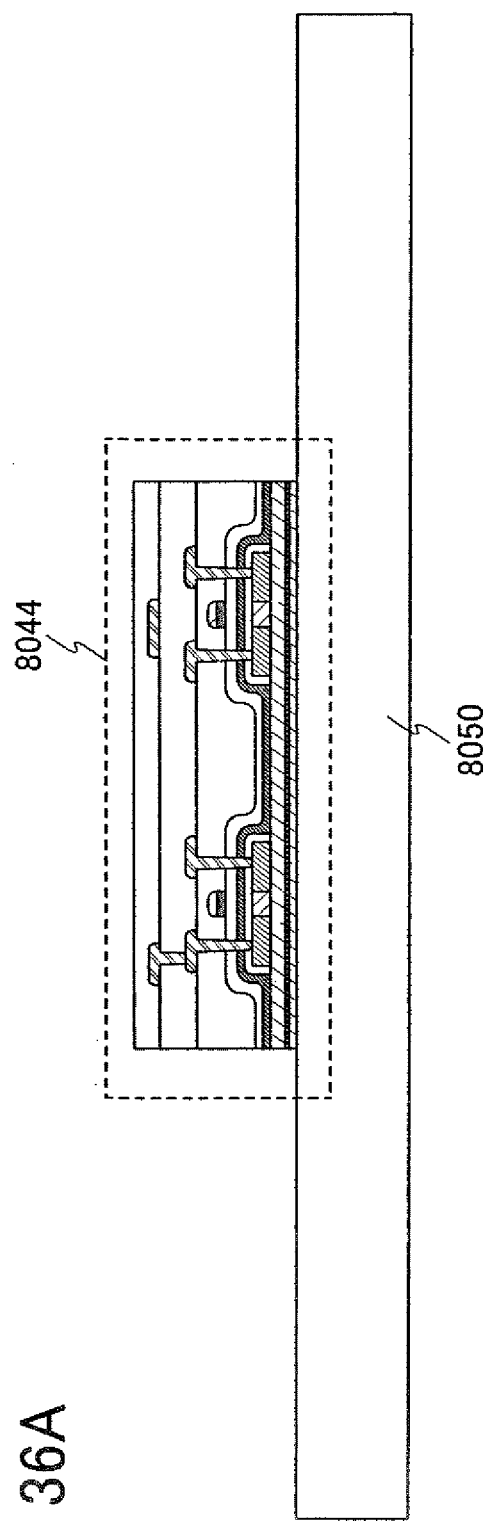
FIGS. 36A and 36B are views each explaining an example of a manufacturing method of a semiconductor device using the present invention.
Figure 36B:
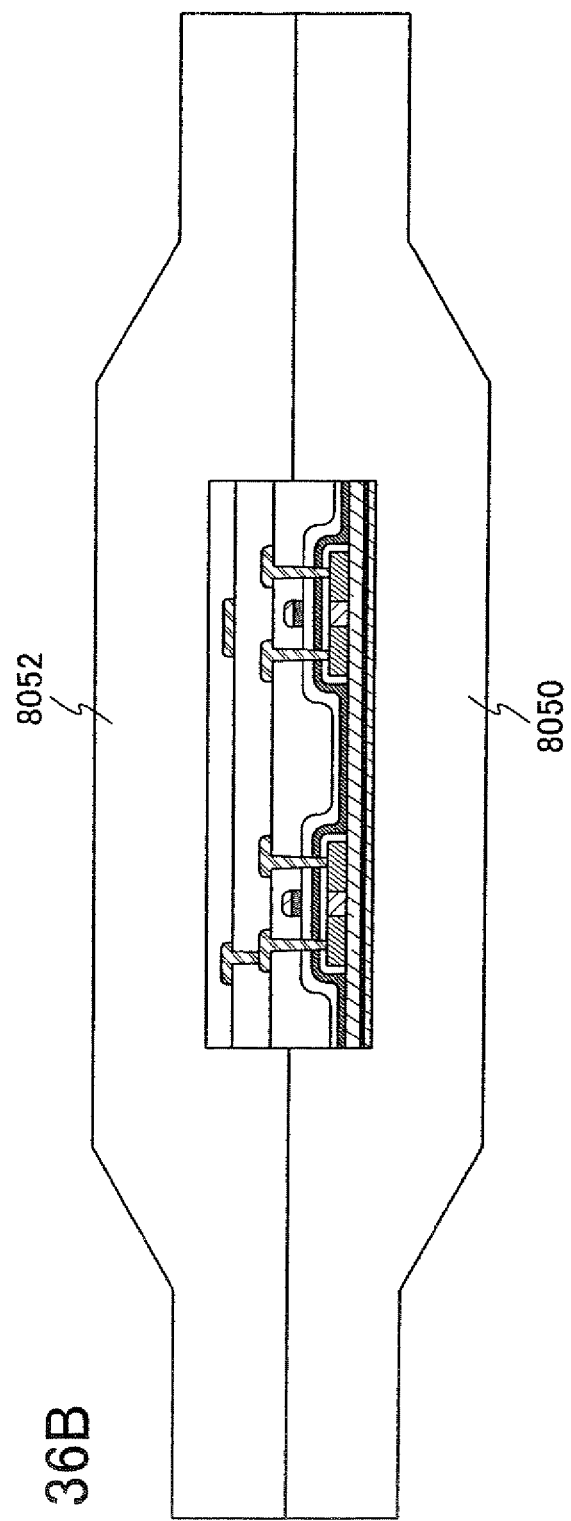

Next, the peeled element group 8044 is sealed with a film having flexibility. Here, the element group 8044 is attached to a second sheet material 8050, and furthermore the element group 8044 is sealed with a third sheet material 8052 (FIGS. 36A and 36B).

A flexible film can be used for each of the second sheet material 8050 and the third sheet material 8052. For example, a film formed of polypropylene, polyester, vinyl, polyvinyl fluoride, vinyl chloride, or the like, paper, a stacked film of a base material film (polyester, polyamide, an inorganic deposition film, paper, or the like) and an adhesive synthetic resin film (an acrylic-based synthetic resin, an epoxy-based synthetic resin, or the like), or the like can be used. In addition, it is preferable that an adhesive layer provided for the uppermost surface of the film or a layer provided for the outermost layer (not the adhesive layer) be melted by heat treatment to adhere by applying pressure. Moreover, when an element formation layer is sealed with the first sheet material 8048 and the second sheet material 8050, the first sheet material 8048 may be formed using the same material.

Through the above process, the semiconductor device which has a memory element and is capable of transmitting and receiving data can be obtained. In addition, the semiconductor device described in this embodiment has flexibility. When the element group 8044 is attached to a flexible substrate, a thin and lightweight semiconductor device which is does not break easily even when dropped can be completed. When an inexpensive flexible substrate is used, a semiconductor device can be provided inexpensively. The element group 8044 also can be attached to an object having a curved surface or an irregular shape. Moreover, by reusing the first substrate 8000, a semiconductor device can be manufactured at low cost.

Note that this embodiment can be freely combined with embodiment mode and other embodiments.

Embodiment 14

This embodiment will explain a case of utilizing a semiconductor film manufactured using the present invention as a wireless IC tag which is capable of transmitting and receiving data without contact.

Note that the plane orientation of crystal grains in a quasi-single crystalline semiconductor film formed using the present invention are aligned in one direction, or a direction that can be substantially regarded as one direction. That is to say, the quasi-single crystalline semiconductor film is a semiconductor film having a property which is infinitely close to that of a single crystal. Therefore, by using the semiconductor device, it is possible to manufacture, a semiconductor device capable of high speed operation with high current driving capacity and small variation of characteristics between elements.

Figure 38A:
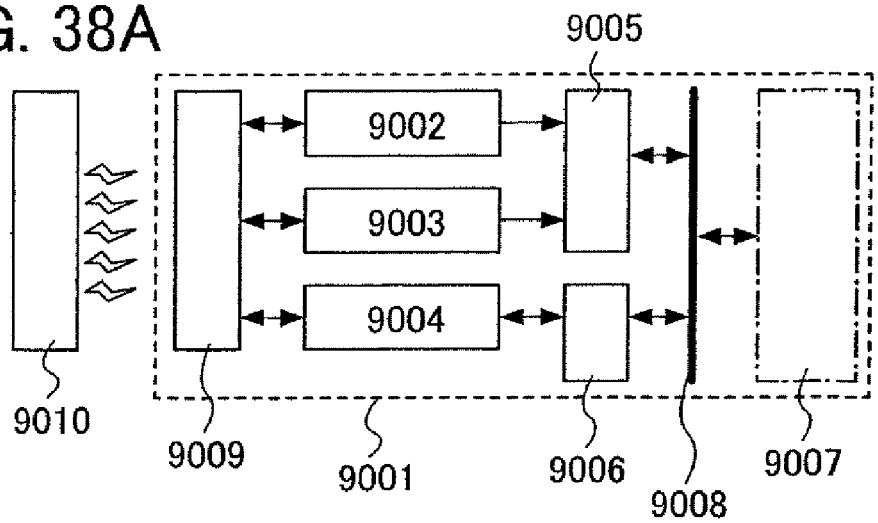
FIGS. 38A to 38C are views each explaining an example of use of a semiconductor device manufactured using the present invention.

A wireless IC tag 9001 has a function of transmitting and receiving data without contact, and includes a power supply circuit 9002, clock generation circuits 9003 and 9004, a control circuit 9005 for controlling other circuits, an interface circuit 9006, a memory 9007, a data bus 9008, and an antenna (antenna coil) 9009 (FIG. 38A).

The power supply circuit 9002 generates various kinds of power supplies to be supplied to each circuit in the semiconductor device based on an AC signal inputted from the antenna 9009. The clock generation circuit 9003 generates various kinds of clock signals to be supplied to each circuit in the semiconductor device based on an AC signal inputted from the antenna 9009. The clock generation circuit 9004 has a function of demodulating/modulating data which is transmitted and received with a reader/writer 9010. The control circuit 9005 has a function of controlling the memory 9007. The antenna 9009 has a function of transmitting and receiving electromagnetic waves. The reader/writer 9010 communicates with and controls the semiconductor device, and controls processing regarding the data thereof. Note that the wireless IC tag is not limited to the above structure. For example, the wireless IC tag may be additionally provided with other elements such as a limiter circuit of a power supply voltage or decoding hardware.

In the wireless IC tag 9001, a power supply voltage can be supplied to each circuit by any of the following methods, which are methods of supplying a power supply voltage by receiving electric waves with the antenna without mounting a power supply (battery), by mounting a power supply (battery) instead of the antenna, and by electric waves and a power supply.

It is advantageous to use the semiconductor device of the present invention for a wireless IC tag or the like because non-contact communication is possible; multiple reading is possible; writing of data is possible; processing into various shapes is possible; directivity is wide and a wide recognition range is provided depending on the selected frequency; and the like. The wireless IC tag can be applied to a tag which can identify individual information of a person or an article with non-contact wireless communication, a label which can be attached to an article by label processing, a wristband for an event or amusement, or the like. In addition, the wireless IC tag may be processed using a resin material. Moreover, the wireless IC tag can be utilized for the operation of a system such as an entering-leaving management system, a settlement system, or a stock control system.

Figure 38B:
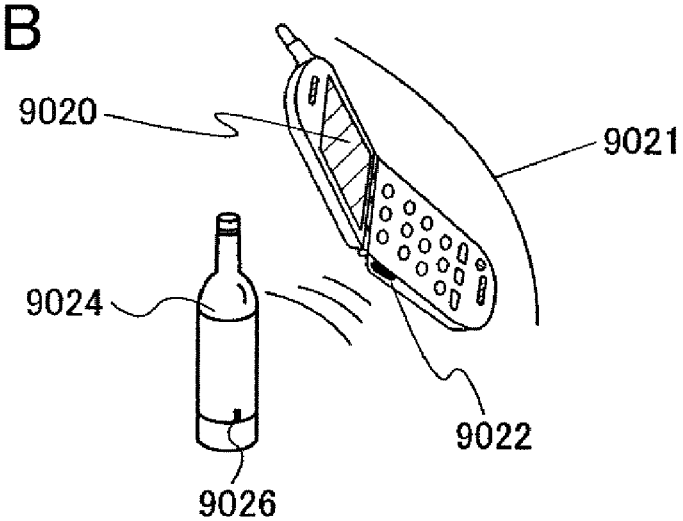

Next, one mode of actually using the semiconductor device manufactured by the present invention as a wireless IC tag will be explained. A reader/writer 9022 is provided on a side of a portable terminal 9021 having a display portion 9020, and a wireless IC tag 9026 is provided on a side of an article 9024 (FIG. 38B). When the reader/writer 9022 is held to the wireless IC tag 9026 provided on the article 9024, information related to the article, such as a raw material and a place of origin of the article 9024, a test result in each production process, a history of distribution process, or further, description of the article is displayed on the display portion 9020.

Figure 38C:
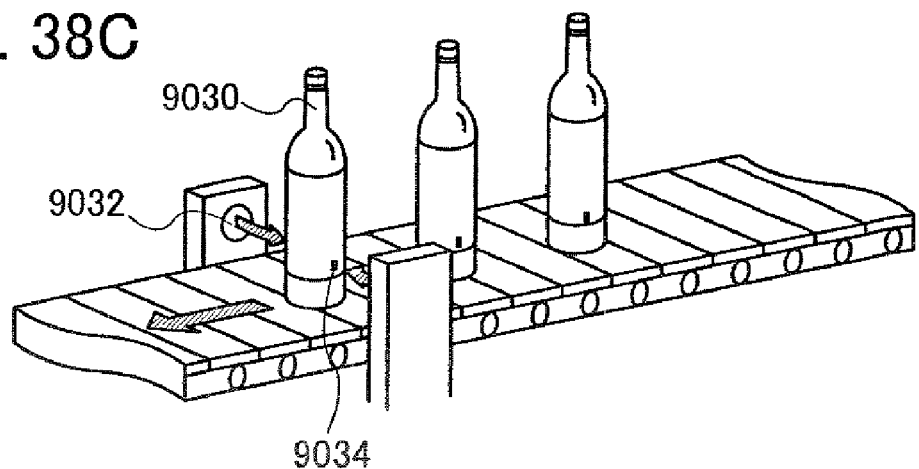

In addition, a product 9030 can be inspected by using a reader/writer 9032 and a wireless IC tag 9034 provided on the product 9030 when the product 9030 is transferred on a conveyor belt (FIG. 38C). In this manner, by utilizing a wireless IC tag for a system, information can be easily obtained, and high function and high added value are realized. Furthermore, there is a benefit such as reduction in excessive stock or simplification of inventory clearance by making the wireless IC tag work with a stock control system or a shipment system.

Note that this embodiment can be freely combined with embodiment mode and other embodiments.

Embodiment 15

This embodiment will explain a structure of a liquid crystal display device with reference to the drawing.

Figure 16:
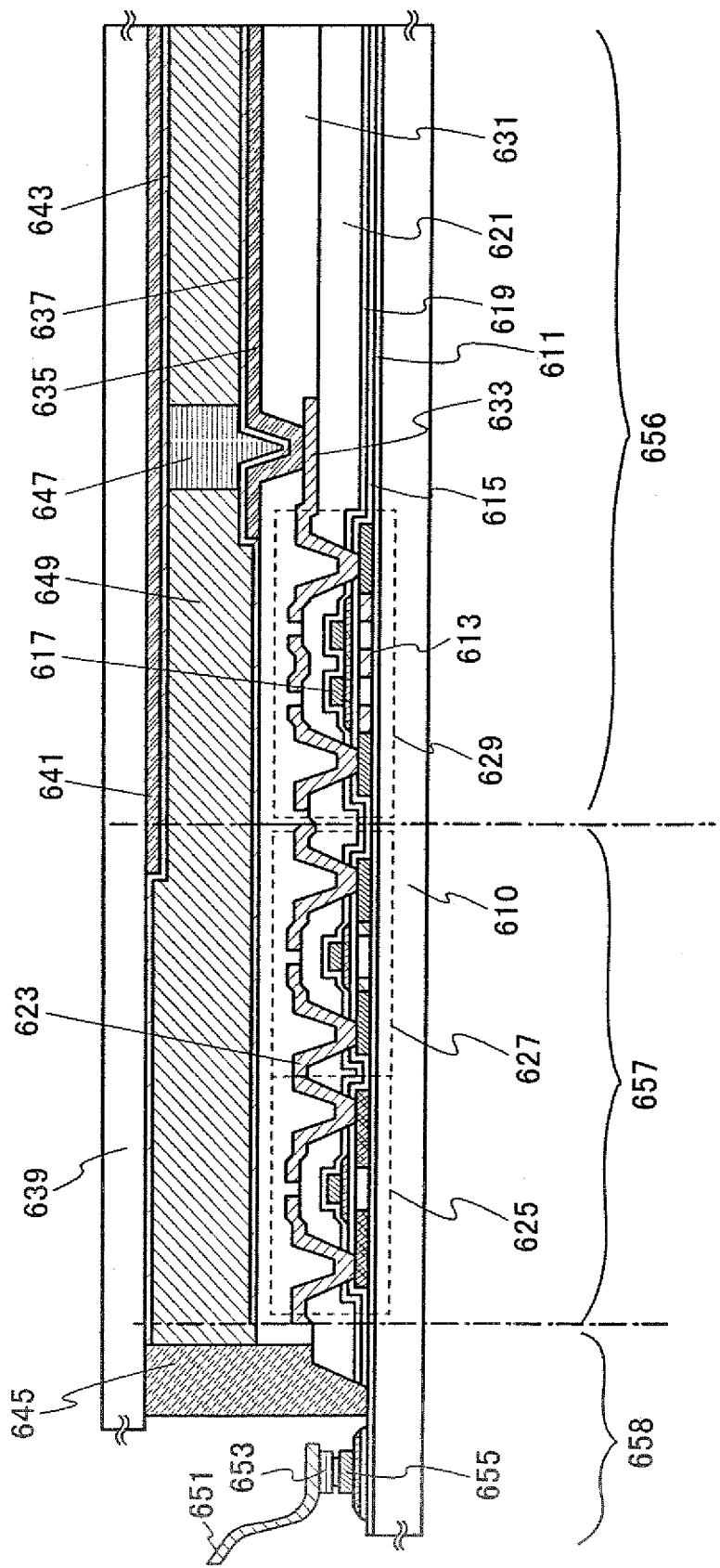
FIG. 16 is a view explaining an example of a liquid crystal display device using the present invention.

In FIG. 16, a base insulating film 611 is formed over a substrate 610. A glass substrate or a quartz substrate having a light-transmitting property may be used as the substrate 610. Alternatively, a light-transmissive plastic substrate having heat resistance which can withstand a processing temperature may also be used. In a case of a reflective liquid crystal display device, a silicon substrate, a metal substrate, or a stainless steel substrate having a surface provided with an insulating film may be used beside the above substrate. Here, a glass substrate is used as the substrate 610.

As the base insulating film 611, an insulating film such as a silicon oxide film, a silicon nitride film, or a silicon oxynitride film is fainted. Although an example in which the base insulating film 611 is a single layer is shown here, the base insulating film 611 may be a stacked layer of two or more of insulating films. Note that the base insulating film 611 is not necessarily formed if unevenness of the substrate or impurity diffusion from the substrate is not a problem.

The surface of the glass substrate may be directly processed by high density plasma with an electron temperature of less than or equal to 2 eV, an ion energy of less than or equal to 5 eV, and an electron density of approximately $10^{11}$ to $10^{13}/sm^3$, which is excited by a microwave. Plasma can be generated by a plasma processing apparatus utilizing microwave excitation, which employs a radial slot antenna. At this time, the surface of the glass substrate can be nitrided by introducing a nitride gas such as nitrogen ($N_2$), ammonia ($NH_3$), or nitrous oxide ($N_2O$). Since a nitride layer formed over the surface of the glass substrate contains silicon nitride as its main component, the nitride layer can be used as a blocking layer of an impurity diffused from the glass substrate side. A silicon oxide film or a silicon oxynitride film is formed over the nitride layer by a plasma CVD method to serve as the base insulating film 611.

Subsequently, a semiconductor layer is formed over the base insulating film 611. As the semiconductor layer, a semiconductor film having an amorphous structure is formed by a sputtering method, an LPCVD method, a plasma CVD method, or the like. Note that, by using a plasma CVD method, the base insulating film and the semiconductor film having an amorphous structure can be continuously stacked without being exposed to the air. The semiconductor film is formed to have a thickness of 25 to 80 nm (preferably 30 to 70 nm). Although a material of the amorphous semiconductor film is not limited, it is preferable to form the amorphous semiconductor film by using silicon or a silicon germanium (SiGe) alloy.

Next, a silicon oxide film or a silicon oxide film containing nitrogen is formed as a cap film. The cap film is formed to have a thickness of greater than or equal to 200 nm and less than or equal to 500 nm. In addition, it is preferable to form the cap film to be solid and dense. For example, such a film can be formed by decreasing the deposition rate.

Thereafter, a quasi-single crystal is obtained in the semiconductor film by being irradiated with a laser beam through the cap film, and a quasi-single crystalline semiconductor film is obtained. For example, when a silicon oxide film having a thickness of 500 nm is formed as the cap film, a laser beam having an energy of 17 W may be scanned at 35 cm/sec. A CW laser beam or a pulse laser beam having a repetition rate of greater than or equal to 10 MHz can be used for a laser beam.

After the laser irradiation treatment, the cap film is removed by an etching method. Next, the quasi-single crystalline semiconductor film is formed into a desired shape by using a photolithography technique to form a semiconductor film 613.

If necessary, a minute amount of an impurity element (boron or phosphorus) is doped to the semiconductor film 613 to control a threshold voltage of a TFT. For example, an ion doping method in which diborane ($B_2H_6$) is not mass-separated but plasma-excited can be used.

Next, an oxide film over the surface of the semiconductor film 613 is removed with etchant containing fluorine simultaneously with washing the surface of the semiconductor film 613. Then, an insulating film 615 covering the semiconductor film 613 is formed. The insulating film 615 is formed to have a thickness of 1 to 200 nm by a plasma CVD method or a sputtering method. The insulating film 615 is formed to be a single layer or a staked layer of an insulating film containing silicon, which is preferably as thin as 10 to 50 nm, and then surface nitriding treatment using plasma by a microwave is performed. In this case, as described above, the surface of the insulating film 615 may be processed by high density plasma treatment with an electron temperature of less than or equal to 2 eV, an ion energy of less than or equal to 5 eV, and an electron density of approximately $10^{11}$ to $10^{13}/cm^3$, which is excited by a microwave; thereby being oxidized or nitrided to be densified. This treatment may be performed before forming the insulating film 615. In other words, plasma treatment is performed to the surface of the semiconductor film 613. At this time, by performing the plasma treatment with a substrate temperature of 300 to 450° C. in an oxygen atmosphere ($O_2$, $N_2O$, or the like) or a nitrogen atmosphere ($N_2$, $NH_3$, or the like), a favorable interface with the insulating film 615 which is stacked over the semiconductor film 613 can be formed. The insulating film 615 serves as a gate insulating film of a TFT which is formed later.

Subsequently, a first conductive film having a thickness of 20 to 100 nm and a second conductive film having a thickness of 100 to 400 nm are formed over the insulating film 615. In this embodiment, a tantalum nitride film having a thickness of 50 nm and a tungsten film having a thickness of 370 nm are sequentially stacked over the insulating film 615 to form a gate electrode 617. In this embodiment, the gate electrode 617 is formed using a photomask or a reticle.

Note that, although the gate electrode 617 is a stacked layer of the tantalum nitride (TaN) film and the tungsten (W) film in this embodiment, the gate electrode 617 may be a stacked layer of an element of Ta, W, Ti, Mo, Al, and Cu, or an alloy material or a compound material thereof containing the elements as its main component, without being particularly limited. In addition, a semiconductor film typified by a polycrystalline silicon film doped with an impurity element such as phosphorus may be used. In addition, the gate electrode 617 is not limited to a two-layer structure, and for example, a three-layer structure may also be used, in which a tungsten film having a thickness of 50 nm, an alloy film of aluminum and silicon (Al—Si) having a thickness of 500 nm, and a titanium nitride film having a thickness of 30 nm are sequentially stacked.

It is preferable to use an ICP (inductively coupled plasma) etching method for etching the first conductive film and the second conductive film (first etching treatment and second etching treatment). The films can be etched into a desired tapered shape by appropriately controlling the etching condition (the amount of power applied to a coil-shaped electrode, the amount of power applied to an electrode on a substrate side, the electrode temperature on the substrate side, or the like).

Next, in order to add an impurity element imparting n-type conductivity to the semiconductor film 613, first doping treatment, in which doping is performed over the entire surface by using the gate electrode 617 as a mask, is performed. The first ion doping treatment may be performed by an ion doping method or an ion implantation method. An ion doping method is performed under the condition where the dose amount is $1.5 \times 10^{13}$ atoms/cm$^2$ and an acceleration voltage is 50 to 100 kV. As an impurity element imparting n-type conductivity, phosphorus (P) or arsenic (As) is typically used.

Next, after forming a resist mask, a second doping step for adding an impurity element imparting n-type conductivity to the semiconductor film 613 in a high concentration is performed. The mask is provided in order to protect a channel formation region of a semiconductor layer forming a p-channel TFT of a pixel portion 656; a peripheral region thereof; part of an n-channel TFT of the pixel portion 656; a channel formation region of a semiconductor layer forming a p-channel of a driver circuit portion 657; and a peripheral region thereof. The second doping step is performed by an ion doping method under the condition where the dose amount is $1 \times 10^{13}$ to $5 \times 10^{15}$ atoms/cm$^2$ and an acceleration voltage is 60 to 100 keV.

Then, a third doping step for adding an impurity element imparting p-type conductivity (typically, boron) to the semiconductor layer 613 in a high concentration is performed. The mask is provided to protect the channel formation region of the semiconductor layer forming the n-channel TFT of the pixel portion 656; a peripheral region thereof; the channel formation region of the semiconductor layer forming an n-channel TFT of the driver circuit portion 657; and a peripheral region thereof.

Through the above process, an impurity region having n-type or p-type conductivity is formed in each semiconductor film 613.

Next, an insulating film 619 containing hydrogen is formed by an LPCVD method, a plasma CVD method, or the like. The insulating film 619 is formed of silicon nitride or silicon oxynitride. The insulating film 619 serves as a protective film which prevents contamination of the semiconductor layer. After stacking the insulating film 619, the insulating film 619 may be hydrogenated by introducing a hydrogen gas and performing high density plasma treatment which is excited by a microwave as described above. The insulating film 619 may be nitrided and hydrogenated by introducing an ammonia gas. In addition, oxynitride treatment or hydrogen treatment may be performed to the insulating film 619 by introducing oxygen, an $NO_2$ gas, and a hydrogen gas. By this method, the surface of the insulating film 619 can be densified by performing nitriding treatment, oxidizing treatment, or oxynitriding treatment. Accordingly, the function as the protective film can be enhanced. Thereafter, the hydrogen introduced in the insulating film 619 can be discharged from the silicon nitride, with which the insulating film 619 is formed, by performing heat treatment at a temperature of 400 to 450° C.; thus, the semiconductor film 613 can be hydrogenated.

Then, a first interlayer insulating film 621 is formed by a sputtering method, an LPCVD method, a plasma CVD method, or the like. The first interlayer insulating film 621 is formed of a single layer or a stacked layer of an insulating film such as a silicon oxide film, a silicon nitride film, or a silicon oxynitride film. The first interlayer insulating film 621 is formed to have a thickness of 600 to 800 nm. Then, a resist mask is formed using a photomask, the first interlayer insulating film 621 is selectively etched, and a contact hole is formed. Thereafter, the resist mask is removed.

After stacking a metal film by a sputtering method, a resist mask is formed using a photomask, the metal stacked film is selectively etched, and an electrode 623 serving as a source electrode or a drain electrode of a TFT is formed. Further, the metal stacked film is continuously formed in the same metal sputtering apparatus. Then the resist mask is removed.

Through the above process, top-gate TFTs 625, 627, and 629, each of which uses a polysilicon film as an active layer, can be manufactured over the same substrate.

Note that the TFT 629 disposed in the pixel portion 656 is an n-channel TFT having a plurality of channel formation regions in one TFT. The TFT 629 is a multi-gate TFT.

In addition, the TFT 627 disposed in the driver circuit portion 657 is an n-channel TFT provided with a low concentration impurity region (also referred to as an LDD region) which is overlapped with the gate electrode, and the TFT 625 is a p-channel TFT. Both the TFTs 627 and 625 are single gate TFTs. In the driver circuit portion 657, a CMOS circuit is formed by complementarily connecting the TFT 627 to the TFT 625, and various kinds of circuits can be realized. Moreover, if necessary, the TFTs 625 and 627 can be multi-gate TFTs.

A second interlayer insulating film 631 is formed using an organic resin insulating material such as polyimide or acrylic resin by a spin coating method. The second interlayer insulating film 631 serves as a flattening film so that its surface is not affected by the unevenness of the surface of the base insulating film 611.

A contact hole, which exposes a wiring 633 connected to the n-channel TFT 629 placed in the lower layer, is formed in the second interlayer insulating film 631, and then a pixel electrode 635 is formed. As the pixel electrode 635, a transparent conductive film formed of a conductive material having a light-transmitting property may be used, and indium oxide containing tungsten oxide; indium zinc oxide containing tungsten oxide; indium oxide containing titanium oxide; indium tin oxide containing titanium oxide; or the like can be used. It is needless to say that indium tin oxide (ITO), indium zinc oxide (IZO), indium tin oxide containing silicon oxide (ITSO), or the like can also be used.

An example of a composition ratio of the conductive material having a light-transmitting property will be described. As for the composition ratio of indium oxide containing tungsten oxide, tungsten oxide may be 1.0 wt % and indium oxide may be 99.0 wt %. As for the composition ratio of indium zinc oxide containing tungsten oxide, tungsten oxide may be 1.0 wt %, zinc oxide may be 0.5 wt %, and indium oxide may be 98.5 wt %. As for the composition ratio of indium oxide containing titanium oxide, titanium oxide may be 1.0 to 5.0 wt %, indium oxide may be 99.0 to 95.0 wt %. As for the composition ratio of indium tin oxide (ITO), tin oxide may be 10.0 wt % and indium oxide may be 90.0 wt %. As for the composition ratio of indium zinc oxide (IZO), zinc oxide may be 10.7 wt % and indium oxide may be 89.3 wt %. As for the composition ratio of indium tin oxide containing titanium oxide, titanium oxide may be 5.0 wt %, tin oxide may be 10.0 wt %, and indium oxide may be 85.0 wt %. The above composition ratios are examples, and the proportion of the composition ratio may be appropriately set.

An orientation film 637 is formed over the pixel electrode 635. In the same manner, a counter electrode 641 and an orientation film 643 which are both formed using a transparent conductive film formed of a conductive material having a light-transmitting property are formed over a counter substrate 639.

Then, the substrate 610 and the counter substrate 639 are fixed to each other having a space therebetween by a sealant 645. The space between the substrates is held by a spacer 647. A liquid crystal layer 649 is formed between the substrate 610 and the counter substrate 639. The liquid crystal layer 649 may be formed by a dropping method before fixing the counter substrate 639.

Finally, an FPC 651 is attached to a terminal electrode 655 with an anisotropic conductive film 653 by a known method (FIG. 16). Further, the terminal electrode 655 can be obtained in the same process where the gate electrode 617 is obtained.

Through the above process, the pixel portion 656, the driver circuit portion 657, and a terminal portion 658 can be formed over the same substrate. This embodiment can be freely combined with embodiment mode and other embodiments.

Embodiment 16

A semiconductor device such as a TFT is manufactured using a semiconductor film of the present invention, and various electronic devices can be completed using the manufactured semiconductor device. A plane orientation of each crystal grain in a quasi-single crystalline semiconductor film of the present invention are aligned in one direction; therefore, it is possible to manufacture, with good yield, a semiconductor element capable of high speed operation with high current driving capacity and small variation of characteristics between elements. Moreover, various semiconductor devices can be manufactured using the semiconductor element. This embodiment will explain specific examples with reference to the drawings.

Figure 39A:
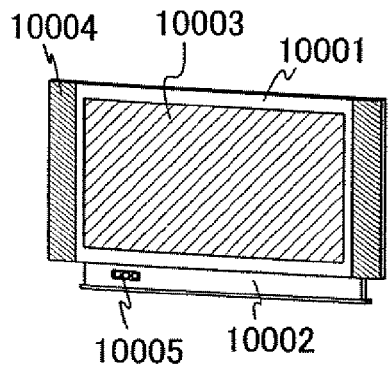
FIGS. 39A to 39F are views each explaining an example of a semiconductor device manufactured using the present invention.

FIG. 39A shows a display device, which includes a housing 10001, a supporting base 10002, a display portion 10003, a speaker portion 10004, a video input terminal 10005, and the like. The display device is manufactured by using a TFT manufactured by the method shown in other embodiments for a driver IC, the display portion 10003, or the like. Note that the display device includes a liquid crystal display device, a light-emitting display device, and all kinds of display devices for displaying information, such as devices for a computer, for receiving TV broadcasting, and for displaying an advertisement. Specifically, a display, a head-mounted display, a reflective projector, or the like can be given.

Figure 39B:
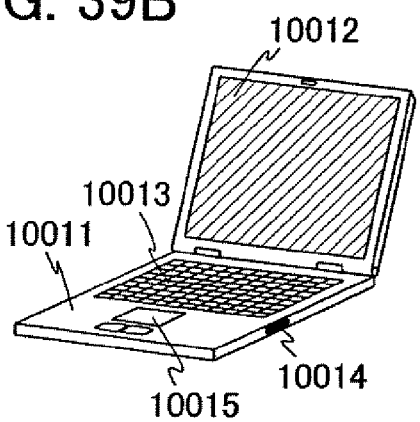

FIG. 39B shows a computer, which includes a housing 10011, a display portion 10012, a keyboard 10013, an external connection port 10014, a pointing mouse 10015, and the like. The TFT manufactured using the present invention can be applied not only to a pixel portion of the display portion 10012 but also to a semiconductor device such as a driver IC for displaying, a CPU inside a main body, or a memory.

Figure 39C:
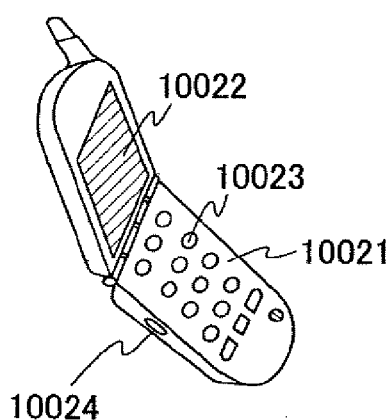

FIG. 39C shows a cellular phone, which is a representative example of a mobile information processing terminal. The cellular phone includes a housing 10021, a display portion 10022, operation keys 10023, and the like. The TFT manufactured using the present invention can be applied not only to a pixel portion of the display portion 10022 or a sensor portion 10024 but also to a driver IC for displaying, a memory, an audio processing circuit, or the like. The sensor portion 10024 has an optical sensor element, and luminance of the display portion 10022 is controlled in accordance with illuminance obtained in the sensor portion 10024, and lighting of the operation keys 10023 is suppressed in accordance with illuminance obtained in the sensor portion 10024; thus, power consumption of the cellular phone can be reduced.

The semiconductor material formed using the present invention can be applied to an electronic device such as PDA (personal digital assistants), a digital camera, a small game machine, or a mobile sound reproducing device, in addition to the above cellular phone. For example, a functional circuit such as a CPU, a memory, or a sensor can be fowled, and the TFT can be applied to a pixel portion or a driver IC for displaying of these electronic devices.

Figure 39D:
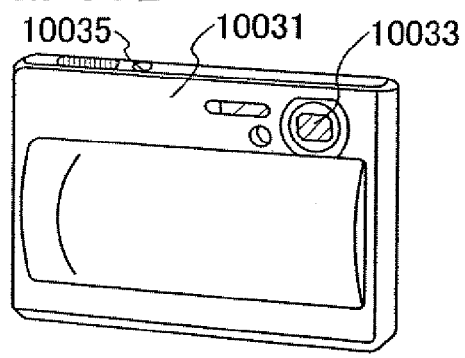
Figure 39E:
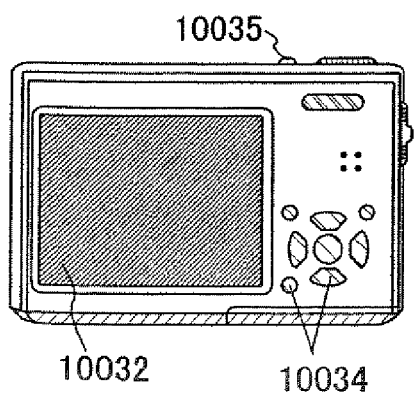

FIGS. 39D and 39E each show a digital camera. Note that FIG. 39E shows a backside of FIG. 39D. The digital camera includes a housing 10031, a display portion 10032, a lens 10033, operation keys 10034, a shutter 10035, and the like. The TFT which can be manufactured using the present invention can be applied to a pixel portion of the display portion 10032, a driver IC for driving the display portion 10032, a memory, or the like.

Figure 39F:
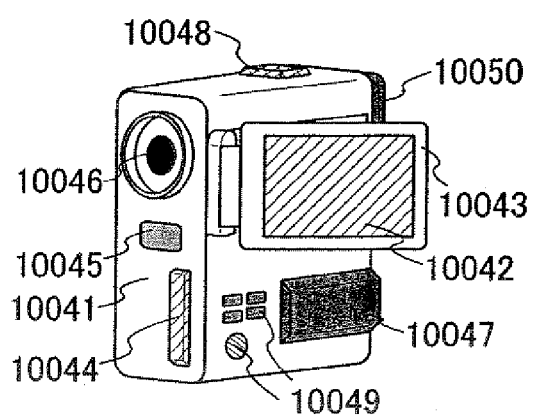

FIG. 39F shows a digital video camera, which includes a main body 10041, a display portion 10042, a housing 10043, an external connection port 10044, a remote control receiving portion 10045, an image receiving portion 10046, a battery 10047, an audio input portion 10048, operation keys 10049, an eyepiece portion 10050, and the like. The TFT manufactured using the present invention can be applied to a pixel portion of the display portion 10042, a driver IC for driving the display portion 10042, a memory, a digital input processing device, or the like.

Besides, the TFT manufactured using the present invention can be applied to a navigation system, a sound reproducing device, an image reproducing device provided with a recording medium, or the like. The TFT manufactured using the present invention can be used for each pixel portion of these display portions, a driver IC for controlling the display portion, a memory, a digital input processing device, a sensor portion, or the like.

As described through the above, an application range of the semiconductor device manufactured by the present invention is extremely wide, and the semiconductor film of the present invention can be used for electronic devices of all fields as a material. Note that not only a glass substrate but also a synthetic resin substrate having heat resistance can be used for a display device used for these electronic devices, in accordance with the size, the strength, or the intended purpose. Accordingly, further weight saving can be attempted.

Embodiment 17

This embodiment will show a result of characteristics of a TFT manufactured using a quasi-single crystalline semiconductor film of the present invention as a material, which was measured using TEG (test element group).

TEG is a test pattern provided over a TFT substrate. In this embodiment, threshold voltage of two TFTs which are each arranged to be adjacent in a laser scanning direction (which are arranged to be vertically adjacent) was measured. Then, the difference between the two values was obtained. Note that each TFT was arranged so that the laser scanning direction and a direction of connecting a source and a drain were parallel to each other.

Figure 47A:
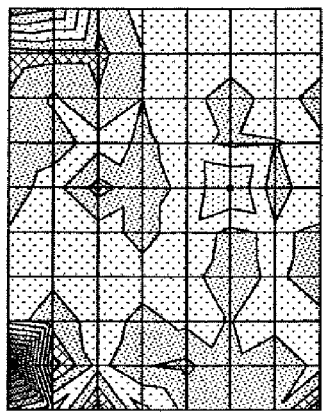
FIGS. 47A to 47D are views each showing in-plane distribution of a threshold voltage difference of TEGs that are vertically adjacent.

FIG. 47A shows the in-plane distribution of the difference in threshold voltage in an n-channel TFT, and FIG. 48B shows the in-plane distribution of the difference in threshold voltage in a p-channel TFT, when an amorphous silicon film was formed to have a thickness of 66 nm as an amorphous semiconductor film, a cap film was formed to have a thickness of 500 nm, and a CW laser beam was irradiated at an energy of 7.2 W at a scanning speed of 35 cm/sec with an irradiation width of 500 μm. Note that the ratio between a channel length (L) and a channel width (W) of the n-channel TFT or the p-channel TFT is L/W=4/40. In this embodiment, a $YVO_4$ laser (wavelength: 532 nm) was used as the CW laser.

Figure 47C:
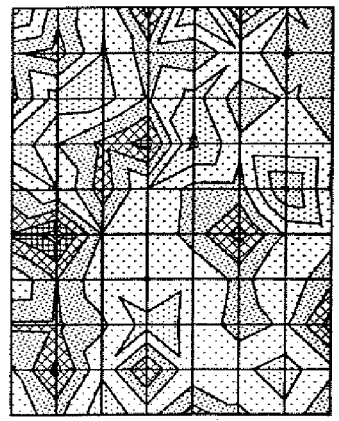
Figure 47B:
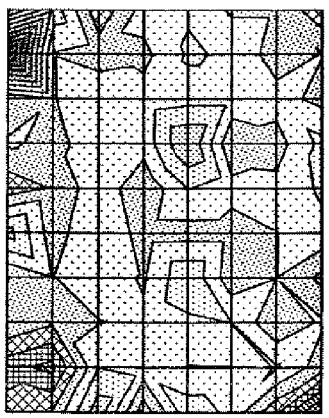
Figure 47D:
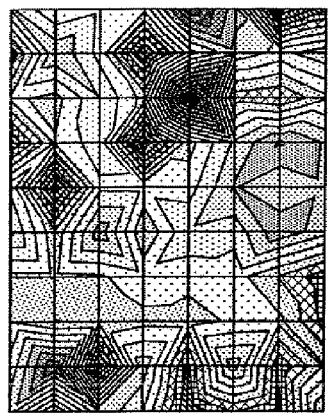

FIG. 47C shows the in-plane distribution of the difference in threshold voltage in an n-channel TFT, and FIG. 47D shows the in-plane distribution of the difference in threshold voltage in a p-channel TFT, when an amorphous silicon film was formed to have a thickness of 66 nm as an amorphous semiconductor film, a cap film was not formed for comparison, a CW laser beam was irradiated at an energy of 8.3 W at a scanning speed of 35 cm/sec with an irradiation width of 500 μm.

The threshold voltage difference between the two TFTs was obtained on 80 lattice points of 10×8 pieces (length× width) of the 5-inch TFT substrate. Note that the lattice pitch size of the measurement was 10.5×10 mm (length×width).

When the in-plane distributions of the difference in threshold voltage in the n-channel TFTs were compared, variation in the difference of the threshold voltage, in the case where the cap film was formed (FIG. 47A), was less than that in the case where the cap film was not formed (FIG. 47C). In addition, when the in-plane distributions of the difference in threshold voltage between the p-channel TFTs were compared, as in the case of the n-channel TFTs, variation in the difference in threshold voltage was smaller in the case where the cap film was formed (FIG. 47B) than in the case where the cap film was not formed (FIG. 47D)).

Figure 48:
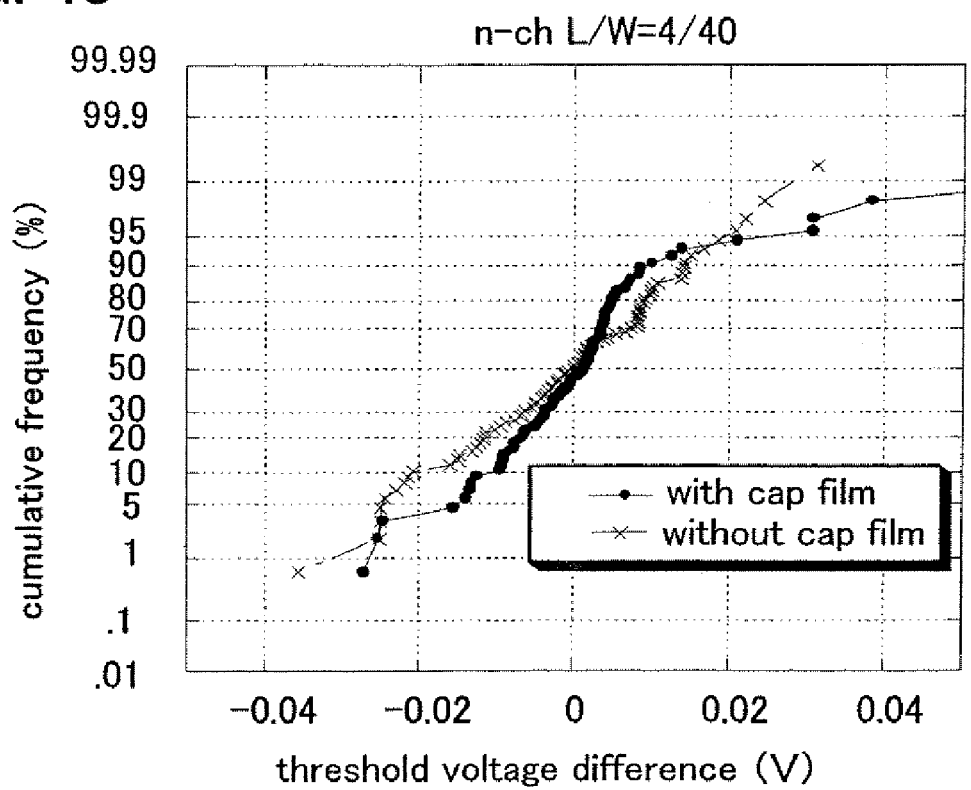
FIG. 48 is a normal probability distribution diagram of a measurement result in an n-channel TFT of FIGS. 47A to 47D.
Figure 49:
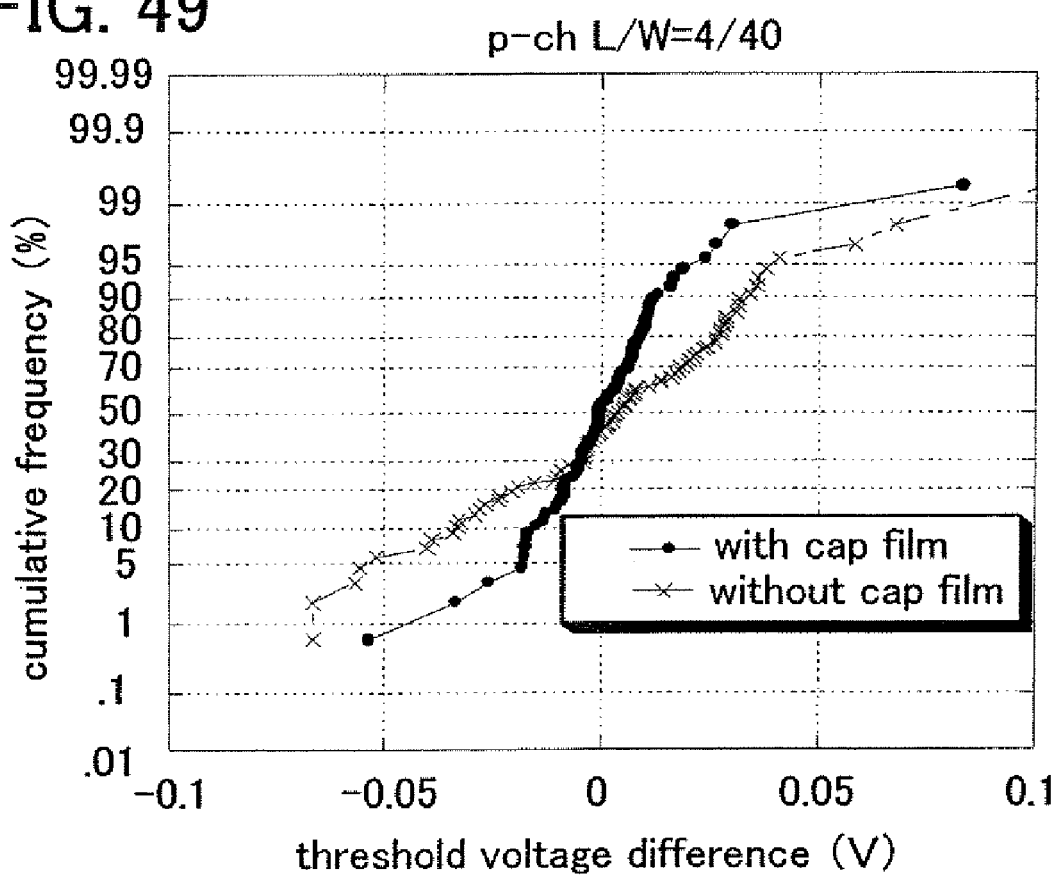
FIG. 49 is a normal probability distribution diagram of a measurement result in a p-channel TFT of FIGS. 47A to 47D.

Furthermore, the measurement result of FIGS. 47A to 47D is shown in normal probability distribution diagrams (FIG. 48 and FIG. 49). In the normal probability distribution diagram, a horizontal axis indicates the difference in threshold voltage, whereas a vertical axis indicates a cumulative frequency. In addition, in the normal probability distribution diagram, as the variation in the difference in threshold voltage decreases, the slope of the graph increases.

FIG. 48 is a normal probability distribution diagram of the measurement result of the n-channel TFT. A circle colored with black denotes the measurement result in the case where the cap film was formed, and a cross mark denotes the measurement result in the case where the cap film was not formed. When the two graphs are compared, the slope of the graph is steeper in the case where the cap film was formed than in the case where the cap film was not formed. Accordingly, it is found that the variation in the difference in threshold voltage is smaller in the case where the cap film was formed. In addition, FIG. 49 is the normal probability distribution diagram of the measurement result of the p-channel TFT A circle colored with black denotes the measurement result in the case where the cap film was formed, and a cross mark denotes the measurement result in the case where the cap film was not formed. When the two graphs are compared, in the same manner with the case of the n-channel TFT, the slope of the graph is steeper in the case where the cap film was formed than in the case where the cap film was not formed. Accordingly, it is found that the variation in the difference in threshold voltage is smaller in the case where the cap film was formed.

According to the above results, by forming a cap film in a state of an amorphous semiconductor film and irradiating a laser beam, a TFT with small variations in characteristics can be manufactured.

This application is based on Japanese Patent Applications serial No. 2005-303761 and 2006-076454 filed each filed in Japan Patent Office on Oct. 18, 2005 and Mar. 20, 2006, the entire contents of which are hereby incorporated by reference.

EXPLANATION OF REFERENCE 01. substrate, 02. base insulating film, 03. semiconductor film, 04. cap film, 100. substrate, 101. base insulating film, 102. semiconductor film, 103. cap film, 104. quasi-single crystalline semiconductor film, 105. semiconductor film, 201a. laser oscillator, 201b. laser oscillator, 202. synthesized laser beam, 202a. laser beam, 202b. laser beam, 203. wavelength plate, 204. polarizer, 205. mirror, 206. cylindrical lens, 207. cylindrical lens, 208. surface to be irradiated, 209. suction stage, 210. X-axis uniaxial robot, 211. Y-axis uniaxial robot, 212. mirror, 300. substrate, 301. base insulating film, 302. semiconductor film, 303. insulating film, 410. substrate, 411. base insulating film, 412. large grain crystal, 413. viewing surface A, 414. viewing surface B, 415. viewing surface C, 416. scanning direction of a laser beam, 417. amorphous semiconductor film, 510. substrate, 511. base insulating film, 512. quasi-single crystalline silicon film, 513. viewing surface A, 514. viewing surface B, 515. viewing surface C, 516. scanning direction of a laser beam, 517. amorphous semiconductor film, 518. cap film, 610. substrate, 611. base insulating film, 613. semiconductor film, 615. insulating film, 617. gate electrode, 619. insulating film, 621. first interlayer insulating film, 623. electrode, 625. TFT, 627. TFT, 629. TFT, 631. second interlayer insulating film, 633. wiring, 635. pixel electrode, 637. orientation film, 639. counter substrate, 641. counter electrode, 643. orientation film, 645. sealant, 647. spacer, 649. liquid crystal layer, 651. FPC, 653. anisotropic conductive film, 655. terminal electrode, 656. pixel portion, 657. driver circuit portion, 658. terminal portion, 700. wiring a, 701. wiring b, 702. wiring c, 703. contact hole, 2000. substrate, 2001. base insulating film, 2002. amorphous semiconductor film, 2003. cap film, 2004. quasi-single crystalline semiconductor film, 2005. semiconductor film, 2006. gate insulating film, 2007. gate electrode, 2008. source region, 2009. drain region, 2010. LDD (Lightly Doped Drain) region, 2011. TFT, 2012. TFT, 2013. TFT, 2014. first insulating film, 2015. second insulating film, 2016. wiring, 2017. third insulating film, 2101. laser oscillator, 2102. wavelength plate, 2103. polarization beam splitter, 2104. beam homogenizer, 2105. slit, 2106. collective lens, 2107. mirror, 2108. subject to be irradiated, 2109. suction stage, 2110. X stage, 2111. Y stage, 2201. source signal line, 2202. gate signal line, 2203. current supply line, 2204. switching TFT, 2205. driving TFT, 2206. capacitor, 2207. light-emitting element, 3001. substrate, 3002. base insulating film, 3003. semiconductor film, 3004, oxide film, 3005. resist mask, 3006. semiconductor film, 3007. gate insulating film, 3008. quasi-single crystalline semiconductor film, 4001. substrate, 4002. base insulating film, 4003. amorphous silicon film, 4004. amorphous silicon film, 4005. insulating film, 4006. light absorption layer, 4007. quasi-single crystal, 4008. gate electrode, 4009. spray nozzle, 4010. conductive film, 5001. substrate, 5002. base insulating film, 5003. amorphous silicon film, 5004. cap film, 5005. quasi-single crystal, 5006. gate insulating film, 5007. source region, 5008. drain region, 5009. wiring, 5010. gate electrode, 6000. substrate, 6001. base insulating film, 6002. amorphous semiconductor film, 6003. cap film, 6004. stage, 6005. nozzle, 6006. gas supply tube, 6007. gas exhaust means, 7000. substrate, 7001a. base insulating film, 7001b. base insulating film, 7002. quasi-single crystallized semiconductor film, 7003. quasi-single crystallized semiconductor film, 7004. quasi-single crystallized semiconductor film, 7005. quasi-single crystallized semiconductor film, 7006. gate insulating film, 7007. gate electrode, 7008. gate electrode, 7009. gate electrode, 7010. gate electrode, 7011. insulating film (hydrogenation film), 7012. interlayer insulating film, 7013. wiring, 7014. connection portion, 7015. insulating film, 7016. insulating film, 7017. first electrode, 7018. terminal electrode, 7019. light-emitting layer, 7020. second electrode, 7021. counter substrate, 7022. sealant, 7023. terminal, 7024. flexible printed circuit, 7025. driving TFT, 7026. switching TFT, 7028. filling material, 7029. first passivation film, 7030. peripheral border of insulating film 7015, 7031. terminal portion, 7032. driver circuit portion, 7033. pixel portion, 8000. first substrate, 8002. insulating film, 8004. peeling layer, 8006. insulating film, 8008. semiconductor film, 8009. cap film, 8010. quasi-single crystalline film, 8012. first semiconductor film, 8014. second semiconductor film, 8016. resist mask, 8018. first insulating film, 8020. first insulating film, 8022. second insulating film, 8024. third insulating film, 8026. conductive film, 8026a. first conductive film, 8026b. second conductive film, 8028. conductive film, 8028a. first conductive film, 8028b. second conductive film, 8030. insulating film, 8032. conductive film, 8034. thin film transistor, 8036. thin film transistor, 8038. insulating film, 8040. conductive film, 8042. insulating film, 8044. element group, 8046. opening portion, 8048. first sheet material, 8050. second sheet material, 8052. third sheet material, 9001. wireless IC tag, 9002. power supply circuit, 9003. clock generation circuit, 9004. clock generation circuit, 9005. control circuit, 9006. interface circuit, 9007. memory, 9008. data bus, 9009. antenna, 9010. reader/writer, 9020. display portion, 9021. portable terminal, 9022. reader/writer, 9024. article, 9026. wireless IC tag, 9030. article, 9032. reader/writer, 9034. wireless IC tag, 10001. housing, 10002. supporting base, 10003. display portion, 10004. speaker portion, 10005. video input terminal, 10011. housing, 10012. display portion, 10013. keyboard, 10014. external connection port, 10015. pointing mouse, 10021. housing, 10022. display portion, 10023. operation key, 10024. sensor portion, 10031. housing, 10032. display portion, 10033. lens, 10034. operation key, 10035. shutter, 10041. main body, 10042. display portion, 10043. housing, 10044. external connection port, 10045. remote control receiving portion, 10046. image receiving portion, 10047. battery, 10048. audio input portion, 10049. operation key, and 10050. eyepiece portion.

What is claimed is:

1. A semiconductor device comprising:
a semiconductor film including a plurality of crystal grains over a substrate;
wherein a grain size of at least one of the plurality of crystal grains has a width of greater than or equal to 0.01 μm and a length of greater than or equal to 1 μm, and
wherein, when a direction vertical to a surface of the substrate is defined as a first direction and a plane in which the first direction is coincident with a normal vector is defined as a first plane, in plane orientation of the semiconductor film in the first plane, a ratio of an orientation {211} is greater than or equal to 0.4 within the range of an angle fluctuation of ±10°.

2. The semiconductor device according to claim 1, wherein the semiconductor film comprises silicon.

3. The semiconductor device according to claim 1, wherein the semiconductor device is at least one of the group consisting of a thin film transistor, a driver circuit, a power supply circuit, an IC, a memory, a CPU, a memory element, a diode, a photoelectric conversion element, a resistive element, a coil, a capacitor element, an inductor, a pixel, a CCD, and a sensor.

4. The semiconductor device according to claim 1, wherein the semiconductor device is used to manufacture at least one of the group consisting of a thin film integrated circuit device, a camera, a reflective projector, an image display device, a head-mounted display, a navigation system, an audio reproducing device, a portable information terminal, a game machine, a computer, and an image reproducing device provided with a recording medium.

5. The semiconductor device according to claim 1, wherein a Raman shift peak of the semiconductor film is observed in 516 to 518 cm$^{-1}$, and a variation of the peak is less than or equal to 20% in a coefficient of variation.

6. A semiconductor device comprising:
a semiconductor film including a plurality of crystal grains over a substrate;
wherein a grain size of at least one of the plurality of crystal grains has a width of greater than or equal to 0.01 μm and a length of greater than or equal to 1 μm,
wherein, when a direction vertical to a surface of the substrate is defined as a first direction and a plane in which the first direction is coincident with a normal vector is defined as a first plane, in plane orientation of the semiconductor film in the first plane, a ratio of an orientation {211} is greater than or equal to 0.4 within the range of an angle fluctuation of ±10°, and
wherein, when a direction parallel to the surface of the substrate and crystal growth of the plurality of crystal grains is defined as a second direction and a plane in which the second direction is coincident with a normal vector is defined as a second plane, in plane orientation of the semiconductor film in the second plane, a ratio of an orientation {110} is greater than or equal to 0.5 within the range of an angle fluctuation of ±10°.

7. The semiconductor device according to claim 6, wherein the semiconductor film comprises silicon.

8. The semiconductor device according to claim 6, wherein the semiconductor device is at least one of the group consisting of a thin film transistor, a driver circuit, a power supply circuit, an IC, a memory, a CPU, a memory element, a diode, a photoelectric conversion element, a resistive element, a coil, a capacitor element, an inductor, a pixel, a CCD, and a sensor.

9. The semiconductor device according to claim 6, wherein the semiconductor device is used to manufacture at least one of the group consisting of a thin film integrated circuit device, a camera, a reflective projector, an image display device, a head-mounted display, a navigation system, an audio reproducing device, a portable information terminal, a game machine, a computer, and an image reproducing device provided with a recording medium.

10. The semiconductor device according to claim 6, wherein a Raman shift peak of the semiconductor film is observed in 516 to 518 cm$^{-1}$, and a variation of the peak is less than or equal to 20% in a coefficient of variation.

11. A semiconductor device comprising:
a semiconductor film including a plurality of crystal grains over a substrate;
wherein a grain size of at least one of the plurality of crystal grains has a width of greater than or equal to 0.01 μm and a length of greater than or equal to 1 μm,
wherein, when a direction vertical to a surface of the substrate is defined as a first direction and a plane in which the first direction is coincident with a normal vector is defined as a first plane, in plane orientation of the semiconductor film in the first plane, a ratio of an orientation {211} is greater than or equal to 0.4 within the range of an angle fluctuation of ±10°, and
wherein, when a direction vertical to the first direction and crystal growth of the plurality of crystal grains is defined as a third direction and a plane in which the third direction is coincident with a normal vector is defined as a third plane, in plane orientation of the semiconductor film in the third plane, a ratio of an orientation {111} is greater than or equal to 0.4 within the range of an angle fluctuation of ±10°.

12. The semiconductor device according to claim 11, wherein the semiconductor film comprises silicon.

13. The semiconductor device according to claim 11, wherein the semiconductor device is at least one of the group consisting of a thin film transistor, a driver circuit, a power supply circuit, an IC, a memory, a CPU, a memory element, a diode, a photoelectric conversion element, a resistive element, a coil, a capacitor element, an inductor, a pixel, a CCD, and a sensor.

14. The semiconductor device according to claim 11, wherein the semiconductor device is used to manufacture at least one of the group consisting of a thin film integrated circuit device, a camera, a reflective projector, an image display device, a head-mounted display, a navigation system, an audio reproducing device, a portable information terminal, a game machine, a computer, and an image reproducing device provided with a recording medium.

15. The semiconductor device according to claim 11, wherein a Raman shift peak of the semiconductor film is observed in 516 to 518 cm$^{-1}$, and a variation of the peak is less than or equal to 20% in a coefficient of variation.

16. A semiconductor device comprising:
a semiconductor film including a plurality of crystal grains over a substrate;
wherein a grain size of at least one of the plurality of crystal grains has a width of greater than or equal to 0.01 μm and a length of greater than or equal to 1 μm,
wherein, when a direction parallel to a surface of the substrate and crystal growth of the plurality of crystal grains is defined as a second direction and a plane in which the second direction is coincident with a normal vector is defined as a second plane, in plane orientation of the semiconductor film in the second plane, a ratio of an orientation {110} is greater than or equal to 0.5 within the range of an angle fluctuation of ±10°, and
wherein, when a direction parallel to the surface of the substrate and vertical to the second direction is defined as a third direction and a plane in which the third direction is coincident with a normal vector is defined as a third plane, in plane orientation of the semiconductor film in the third plane, a ratio of an orientation {111} is greater than or equal to 0.4 within the range of an angle fluctuation of ±10°.

17. The semiconductor device according to claim 16, wherein the semiconductor film comprises silicon.

18. The semiconductor device according to claim 16, wherein the semiconductor device is at least one of the group consisting of a thin film transistor, a driver circuit, a power supply circuit, an IC, a memory, a CPU, a memory element, a diode, a photoelectric conversion element, a resistive element, a coil, a capacitor element, an inductor, a pixel, a CCD, and a sensor.

19. The semiconductor device according to claim 16, wherein the semiconductor device is used to manufacture at least one of the group consisting of a thin film integrated circuit device, a camera, a reflective projector, an image display device, a head-mounted display, a navigation system, an audio reproducing device, a portable information terminal, a game machine, a computer, and an image reproducing device provided with a recording medium.

20. The semiconductor device according to claim 16, wherein a Raman shift peak of the semiconductor film is observed in 516 to 518 $cm^{-1}$, and a variation of the peak is less than or equal to 20% in a coefficient of variation.

* * * * *

UNITED STATES PATENT AND TRADEMARK OFFICE
CERTIFICATE OF CORRECTION

| | | |
|---|---|---|
| PATENT NO. | : 8,058,709 B2 | |
| APPLICATION NO. | : 12/725483 | |
| DATED | : November 15, 2011 | |
| INVENTOR(S) | : Tomoaki Moriwaka | |

It is certified that error appears in the above-identified patent and that said Letters Patent is hereby corrected as shown below:

Column 2, line 51, "increase of an energy density:" should read "increase of an energy density."

Figure 1A:
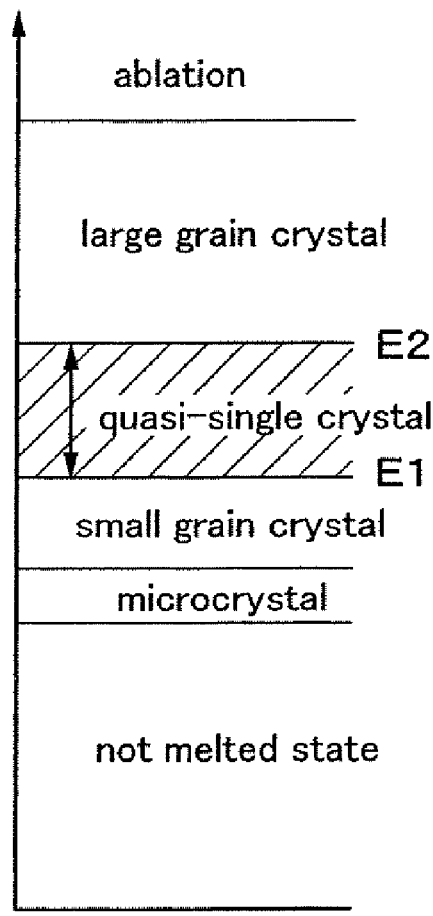
FIGS. 1A and 1B are a diagram and a view each showing a relation between laser beam intensity and a state of a semiconductor film irradiated with the laser beam, in a case where a cap film is formed over the semiconductor film.
Figure 1B:
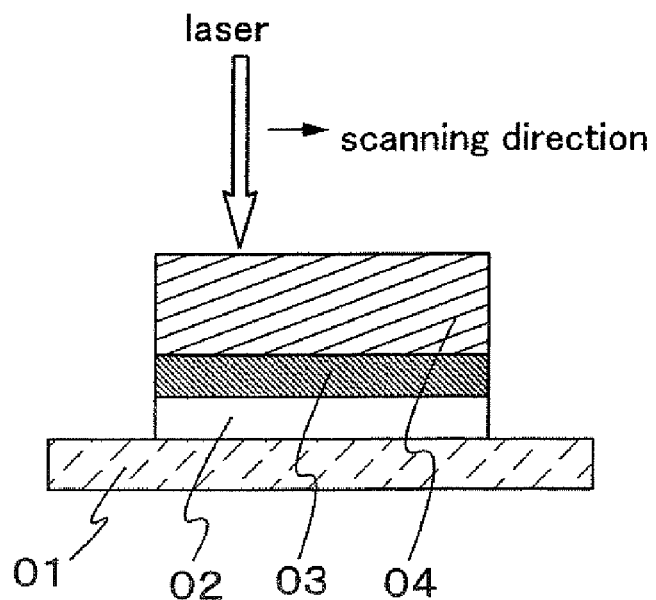
Figure 2A:
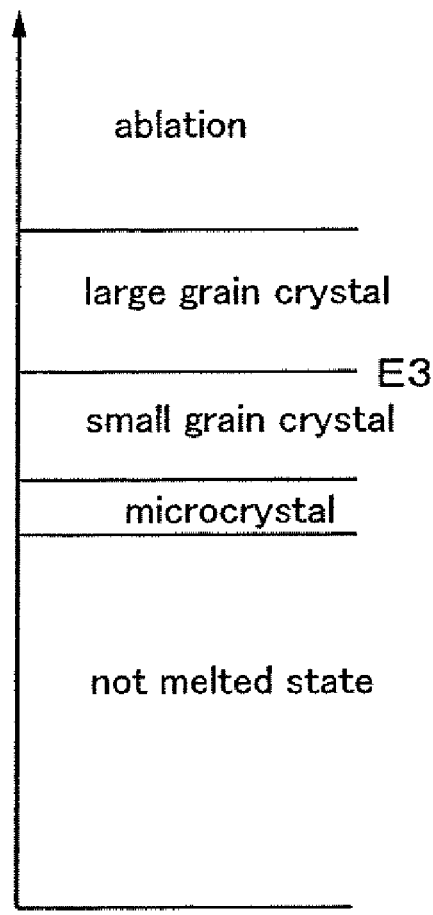
FIGS. 2A and 2B are a diagram and a view each showing a relation between laser beam intensity and a state of a semiconductor film irradiated with the laser beam, in a case where a cap film is not formed over the semiconductor film.
Figure 2B:
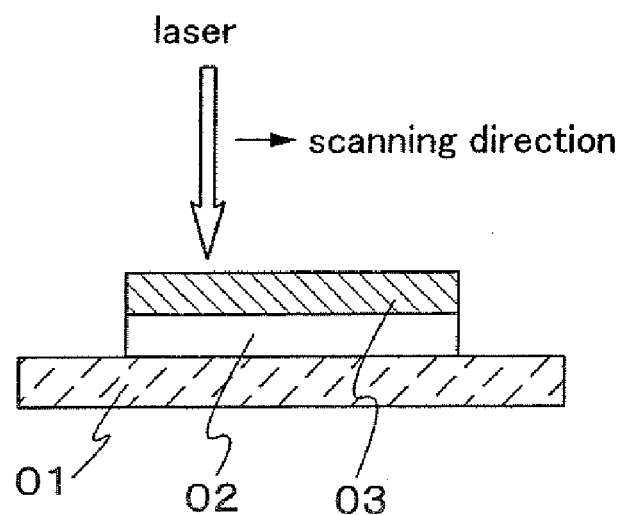
Figure 3A:
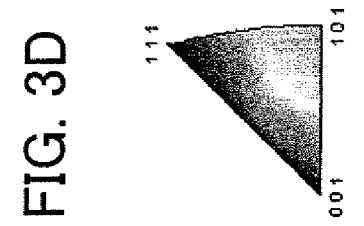
FIGS. 3A to 3H are views each showing an EBSP measurement result of a large grain crystal.
Figure 3B:
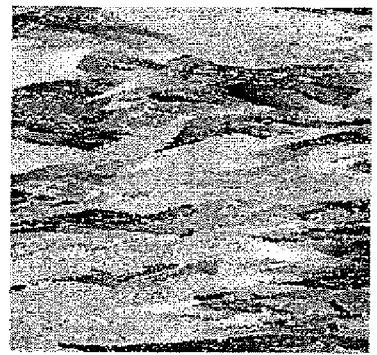
Figure 3C:
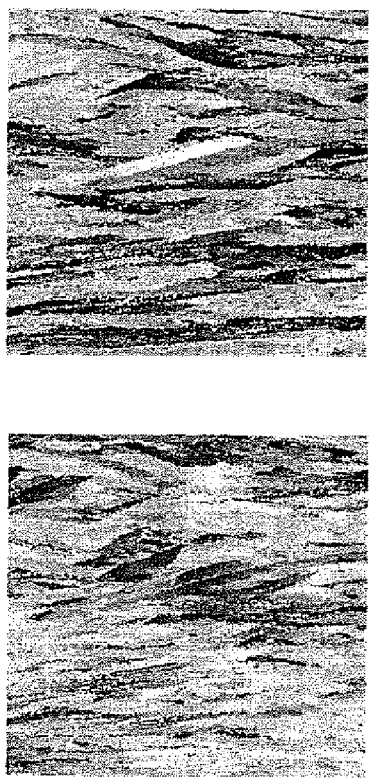
Figure 3D:
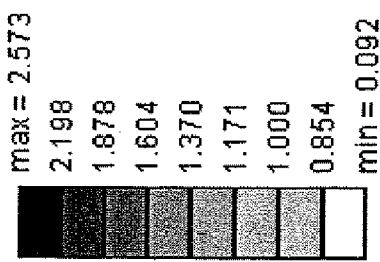
Figure 3E:
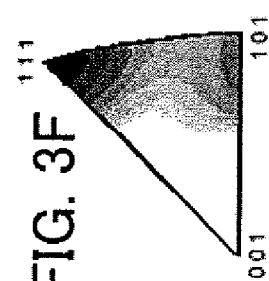
Figure 3F:
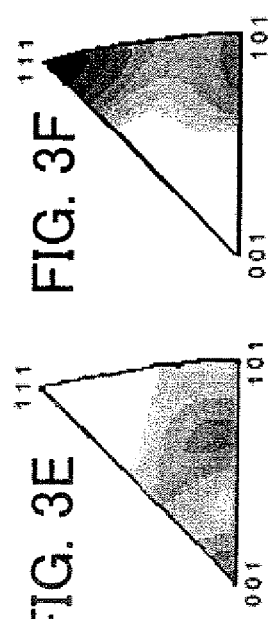
Figure 3G:
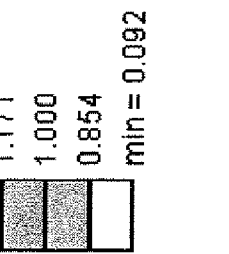
Figure 3H:
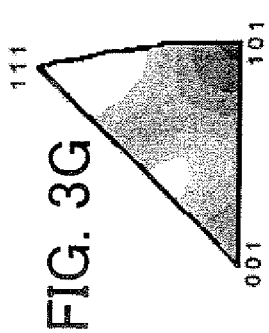
Figure 4:
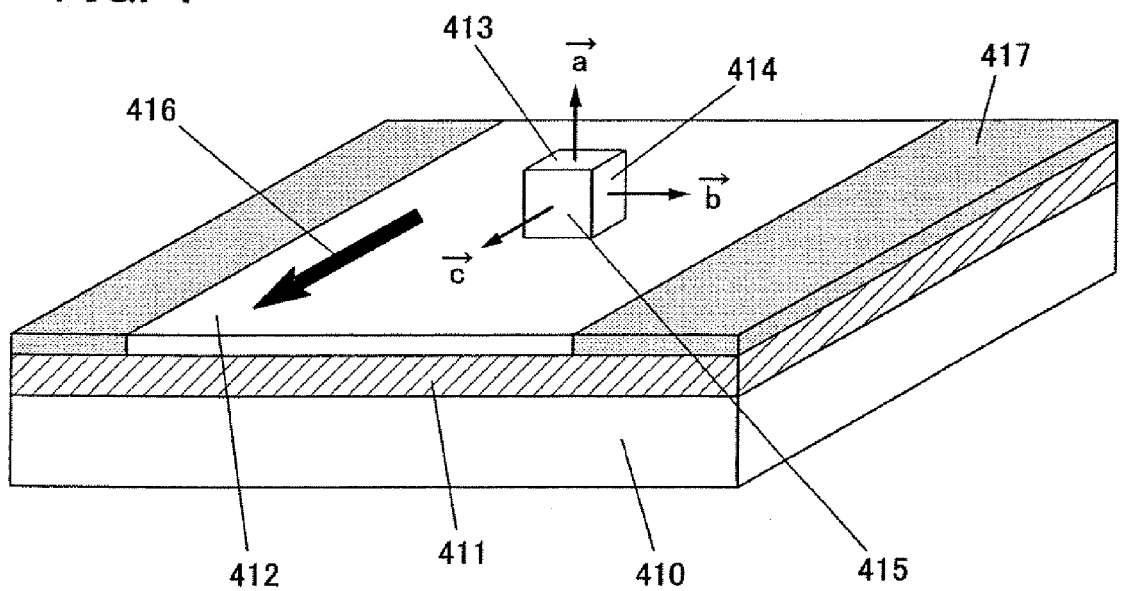
FIG. 4 is a view explaining a measurement direction of FIGS. 3A to 3H.

Column 3, lines 38-39, "FIG. 311 is a frequency" should read "FIG. 3H is a frequency"

Column 7, line 2, "The gain size of crystal grains" should read "The grain size of crystal grains"

Column 13, line 16, "surface to be irradiated 20S" should read "surface to be irradiated 208"

Column 14, line 67, "a pattern may be fox" should read "a pattern may be formed"

Column 17, line 62, "$N_2O$ (800 scan)" should read "$N_2O$ (800 sccm)"

Column 19, line 6, "FIG. 9A. M this case" should read "FIG. 9A. In this case"

Column 20, line 2, "Separation by Implanted OXygen" should read
"Separation by IMplanted OXygen"

Column 29, line 42, "substrate 2000 into the semiconductor," should read
"substrate 2000 into the semiconductor."

Column 31, line 40, "Moreover, in this embodiment;" should read
"Moreover, in this embodiment,"

Column 33, line 15, "referred as a submicron the gate insulating film 2006" should read
"referred as a submicron TFT), the gate insulating film 2006"

Column 33, line 20, "a conductive film is foliated" should read "a conductive film is formed"

Column 34, line 7, "polyimide" should read "polyamide"

Signed and Sealed this
Twenty-first Day of February, 2012

David J. Kappos
*Director of the United States Patent and Trademark Office*

CERTIFICATE OF CORRECTION (continued)

Column 34, line 34, "Al allay film containing Ni" should read "Al alloy film containing Ni"

Column 34, line 43, "p-channel is formed" should read " p-channel TFT is formed"

Column 35, line 45, "performance can by fowled" should read "performance can be formed"

Column 39, lines 56-57, "The ITT manufactured by" should read "The TFT manufactured by"

Column 40, line 3, "such as a TFT;" should read "such as a TFT,"

Column 41, line 31, "Glass such as alumina" should read "Glass such as alumino"

Column 42, line 32, "an effect of beating" should read "an effect of heating"

Column 44, line 22, "ratio: Si=32%, 0=59%" should read "ratio: Si=32%, O=59%"

Column 44, line 35, "two methods for fowling" should read "two methods for forming"

Column 50, line 64, "IC tag is not limited to the and other element" should read
"IC tag is not limited to the TFT, and other element"

Column 51, line 13, "glass substrate or alumina borosilicate" should read
"glass substrate or alumino borosilicate"

Column 58, lines 45-46, "a silicon oxynitride film is fainted." should read
"a silicon oxynitride film is formed."

Column 60, lines 47-48, "forming a p-channel of a driver" should read
"forming a p-channel TFT of a driver"

Column 63, line 32, "a sensor can be fowled" should read "a sensor can be formed"

Column 64, line 53, "cap film was not formed (FIG. 47D))." should read
"cap film was not formed (FIG. 47D)."